(12) United States Patent
Kim et al.

(10) Patent No.: US 9,136,480 B2
(45) Date of Patent: Sep. 15, 2015

(54) ORGANIC LIGHT-EMITTING DIODE

(71) Applicant: SAMSUNG DISPLAY CO., LTD., Yongin, Gyeonggi-Do (KR)

(72) Inventors: Myeong-Suk Kim, Yongin (KR); Soung-Wook Kim, Yongin (KR); Jae-Hong Kim, Yongin (KR)

(73) Assignee: SAMSUNG DISPLAY CO., LTD., Yongin, Gyunggi-Do (KR)

( * ) Notice: Subject to any disclaimer, the term of this patent is extended or adjusted under 35 U.S.C. 154(b) by 0 days.

(21) Appl. No.: 14/164,312

(22) Filed: Jan. 27, 2014

(65) Prior Publication Data

US 2014/0367656 A1    Dec. 18, 2014

(30) Foreign Application Priority Data

Jun. 12, 2013    (KR) .................. 10-2013-0067328

(51) Int. Cl.
*H01L 29/08*    (2006.01)
*H01L 51/00*    (2006.01)

(52) U.S. Cl.
CPC .......... *H01L 51/006* (2013.01); *H01L 51/0058* (2013.01); *H01L 51/0067* (2013.01); *H01L 51/0072* (2013.01)

(58) Field of Classification Search
None
See application file for complete search history.

(56) References Cited

U.S. PATENT DOCUMENTS

| | | |
|---|---|---|
| 2009/0102373 A1 | 4/2009 | Hayoz et al. |
| 2011/0095282 A1 | 4/2011 | Pflumm et al. |
| 2011/0156014 A1* | 6/2011 | Kim et al. ................ 257/40 |
| 2012/0214993 A1* | 8/2012 | Aihara et al. ............ 544/180 |
| 2013/0079517 A1 | 3/2013 | Schafer et al. |

FOREIGN PATENT DOCUMENTS

| | | |
|---|---|---|
| KR | 10-2005-0084912 A | 8/2005 |
| KR | 10-2005-0109513 A | 11/2005 |
| KR | 10-2010-0024340 A | 3/2010 |
| KR | 10-2010-0073954 A | 7/2010 |
| WO | WO 2011/021689 A1 | 2/2011 |

\* cited by examiner

*Primary Examiner* — Kyoung Lee
(74) *Attorney, Agent, or Firm* — Lee & Morse, P.C.

(57) ABSTRACT

An organic light-emitting diode includes a first electrode; a second electrode; and an organic layer between the first electrode and the second electrode. The organic layer includes a heterocyclic compound represented by Formula 1:

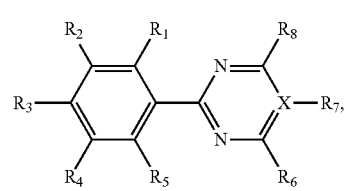

<Formula 1> wherein $R_1$ to $R_8$ and X are further defined.

15 Claims, 1 Drawing Sheet

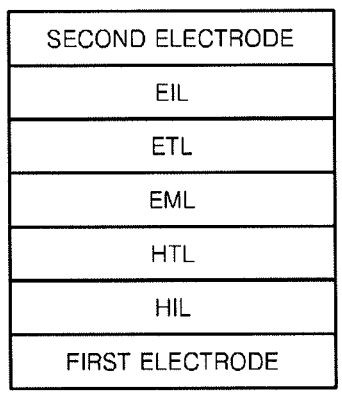

ORGANIC LIGHT-EMITTING DIODE

CROSS-REFERENCE TO RELATED APPLICATION

Korean Patent Application No. 10-2013-0067328, filed on Jun. 12, 2013, in the Korean Intellectual Property Office, and entitled: "Organic Light-Emitting Diode," is incorporated by reference herein in its entirety.

BACKGROUND

1. Field

Embodiments relate to an organic light-emitting diode.

2. Description of the Related Art

Organic light-emitting diodes (OLEDs), which are self-emitting diodes, have advantages such as wide viewing angles, excellent contrast, quick response, high brightness, excellent driving voltage characteristics, and may provide multicolored images.

A typical diode has a structure including a substrate, an anode formed on the substrate, and a hole transport layer (HTL), an emission layer (EML), an electron transport layer (ETL), and a cathode that are sequentially stacked on the substrate. The HTL, the EML, and the ETL may be organic thin films formed of organic compounds.

An operating principle of an OLED having the above-described structure is as follows.

When a voltage is applied between the anode and the cathode, holes injected from the anode move to the EML via the HTL, and electrons injected from the cathode move to the EML via the ETL. Carriers such as the holes and electrons recombine in the EML to generate excitons. When the excitons drop from an excited state to a ground state, light is emitted.

SUMMARY

Embodiments are directed to an organic light-emitting diode including a first electrode, a second electrode, and an organic layer between the first electrode and the second electrode. The organic layer includes a heterocyclic compound represented by Formula 1 below:

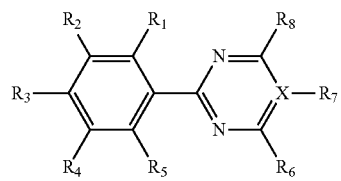

<Formula 1> wherein $R_1$ to $R_6$ and $R_8$ in Formula 1 may each independently be a hydrogen atom, a deuterium atom, a halogen atom, a cyano group, a nitro group, a hydroxyl group, a carboxyl group, a substituted or unsubstituted $C_1$-$C_{60}$ alkyl group, a substituted or unsubstituted $C_3$-$C_{60}$ cycloalkyl group, a substituted or unsubstituted $C_1$-$C_{60}$ alkoxy group, a substituted or unsubstituted $C_6$-$C_{60}$ aryloxy group, a substituted or unsubstituted $C_6$-$C_{60}$ arylthio group, a substituted or unsubstituted $C_6$-$C_{60}$ aryl group, an amino group substituted with a $C_6$-$C_{60}$ aryl group, a substituted or unsubstituted $C_2$-$C_{60}$ heteroaryl group, or a substituted or unsubstituted $C_6$-$C_{60}$ condensed polycyclic group, $R_7$ may be an non-bonding electron pair, a hydrogen atom, a deuterium atom, a halogen atom, a cyano group, a nitro group, a hydroxyl group, a carboxyl group, a substituted or unsubstituted $C_1$-$C_{60}$ alkyl group, a substituted or unsubstituted $C_3$-$C_{60}$ cycloalkyl group, a substituted or unsubstituted $C_1$-$C_{60}$ alkoxy group, a substituted or unsubstituted $C_6$-$C_{60}$ aryloxy group, a substituted or unsubstituted $C_6$-$C_{60}$ arylthio group, a substituted or unsubstituted $C_6$-$C_{60}$ aryl group, an amino group substituted with a $C_6$-$C_{60}$ aryl group, a substituted or unsubstituted $C_2$-$C_{60}$ heteroaryl group, or a substituted or unsubstituted $C_6$-$C_{60}$ condensed polycyclic group, and X is C or N. X may be N and $R_7$ may be a non-bonding electron pair.

$R_1$, $R_3$, and $R_5$ may each independently be a hydrogen atom or a deuterium atom.

$R_2$, $R_4$, $R_6$, and $R_8$ may each independently be a substituted or unsubstituted $C_1$-$C_{60}$ alkyl group, a substituted or unsubstituted $C_3$-$C_{60}$ cycloalkyl group, a substituted or unsubstituted $C_1$-$C_{60}$ alkoxy group, a substituted or unsubstituted $C_6$-$C_{60}$ aryloxy group, a substituted or unsubstituted $C_6$-$C_{60}$ arylthio group, a substituted or unsubstituted $C_6$-$C_{60}$ aryl group, an amino group substituted with a $C_6$-$C_{60}$ aryl group, a substituted or unsubstituted $C_2$-$C_{60}$ heteroaryl group, or a substituted or unsubstituted $C_6$-$C_{60}$ condensed polycyclic group.

$R_2$, $R_4$, $R_6$, and $R_8$ may each independently be represented by one of Formulas 2a to 2h below:

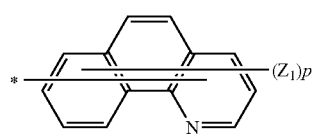
2g

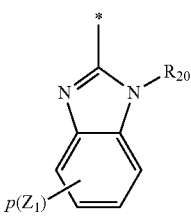
2h wherein, in the Formulas above, $Z_1$ and $R_{20}$ are each independently a hydrogen atom, a deuterium atom, a substituted or unsubstituted $C_1$-$C_{20}$ alkyl group, a substituted or unsubstituted $C_6$-$C_{20}$ aryl group, a substituted or unsubstituted $C_2$-$C_{20}$ heteroaryl group, a substituted or unsubstituted $C_6$-$C_{20}$ condensed polycyclic group, an amino group substituted with a $C_6$-$C_{20}$ aryl group or a $C_2$-$C_{20}$ heteroaryl group, a halogen atom, a cyano group, a nitro group, a hydroxyl group, or a carboxyl group; p is an integer from 1 to 9; and * indicates a binding site.

The compound of Formula 1 may be one of Compounds 1 to 66 below:

1

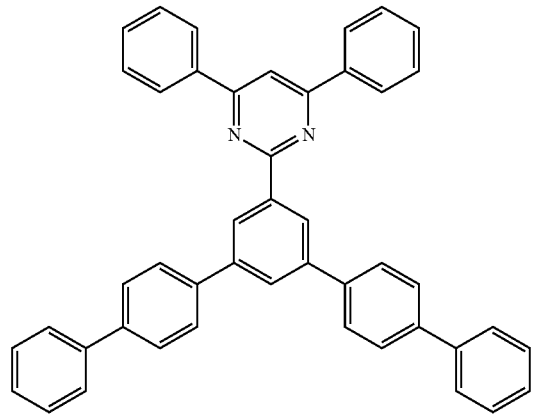

2

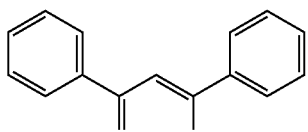
3

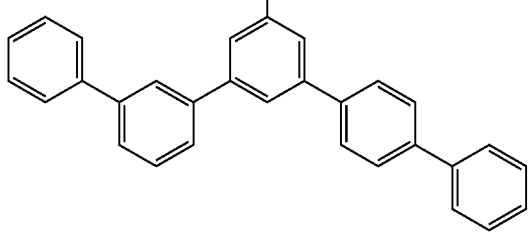
4

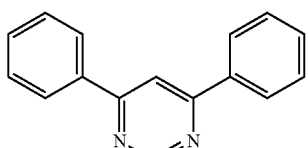
5

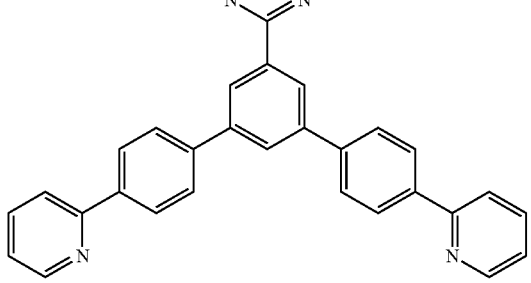
6

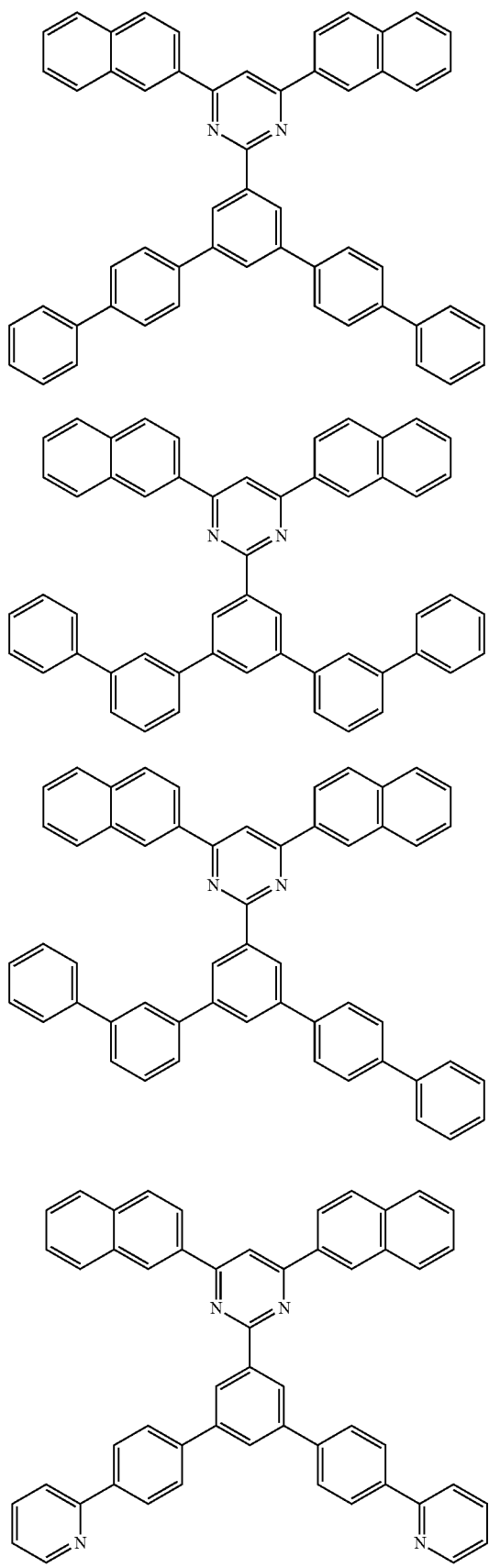
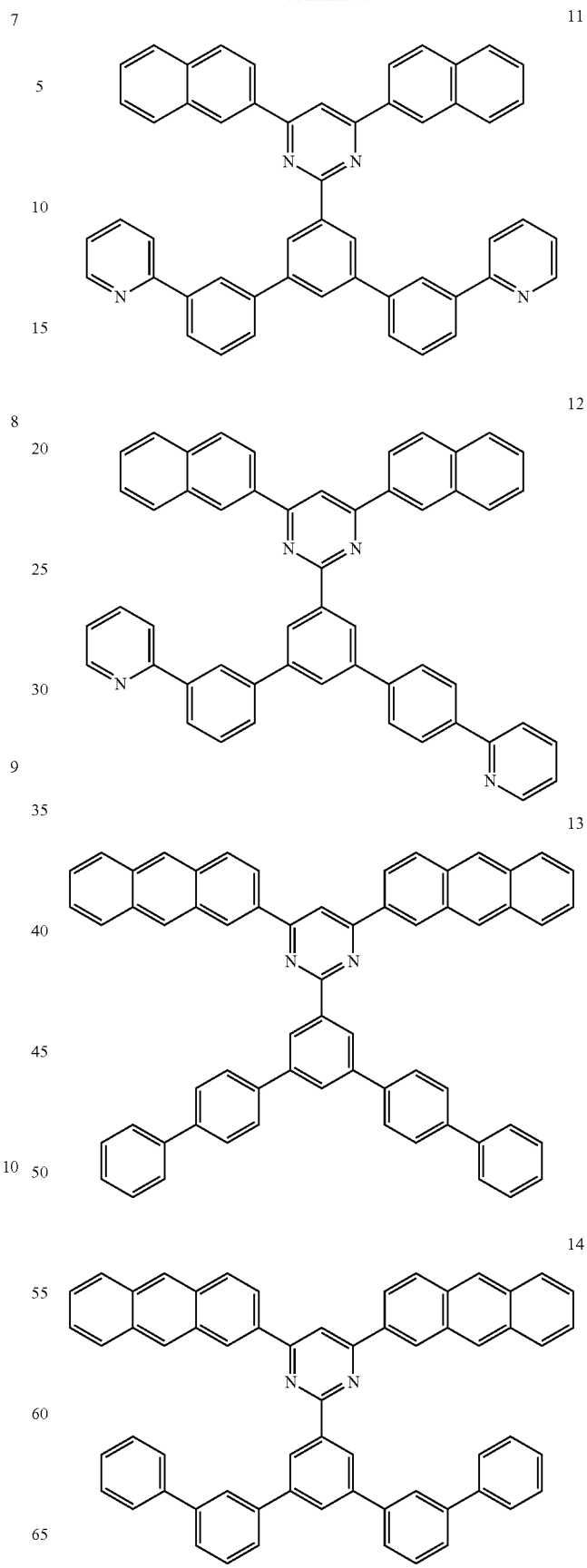

15
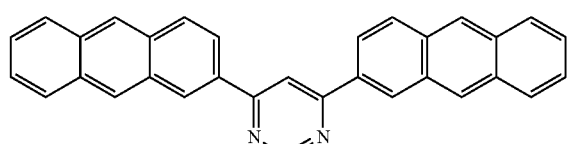
16
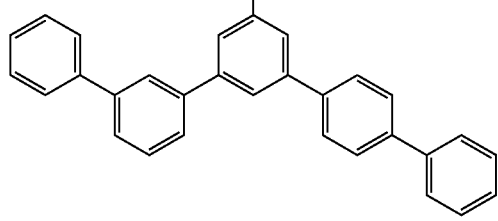
17
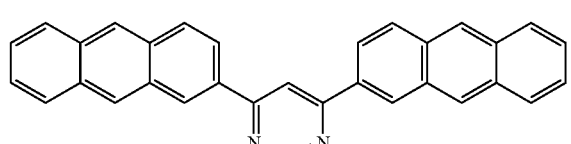
18
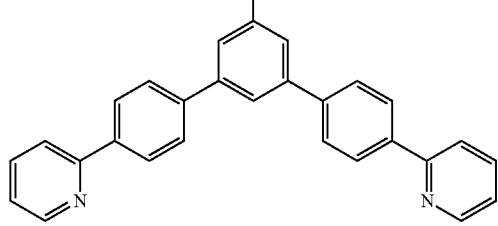
19
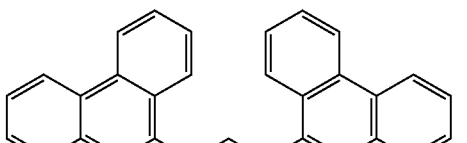
20
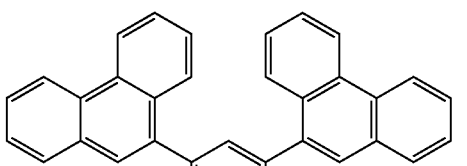
21
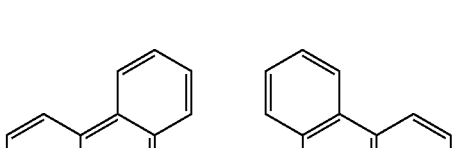

22
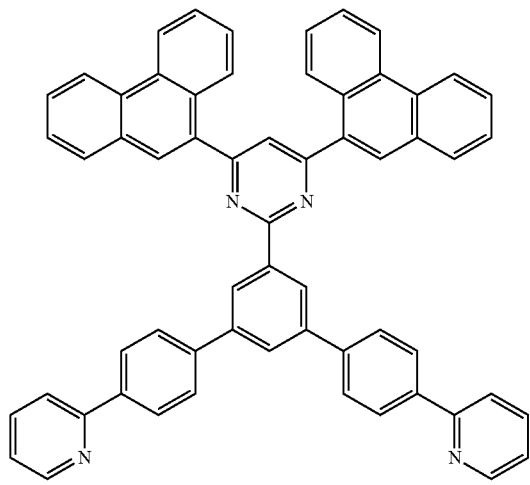
23
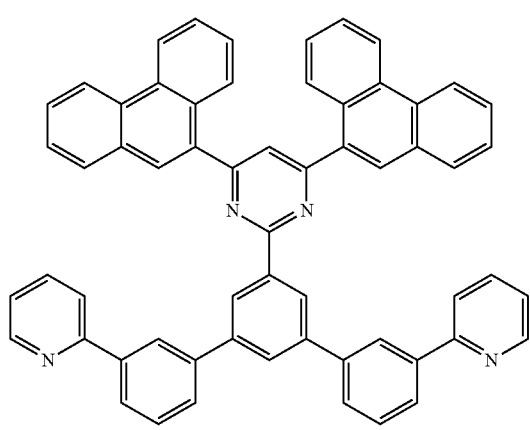
24
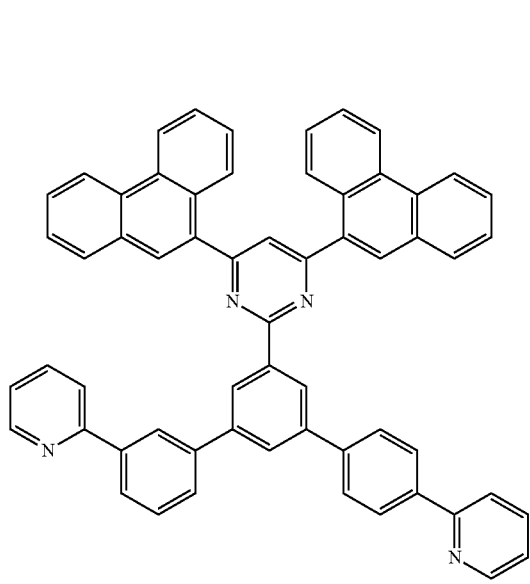
25
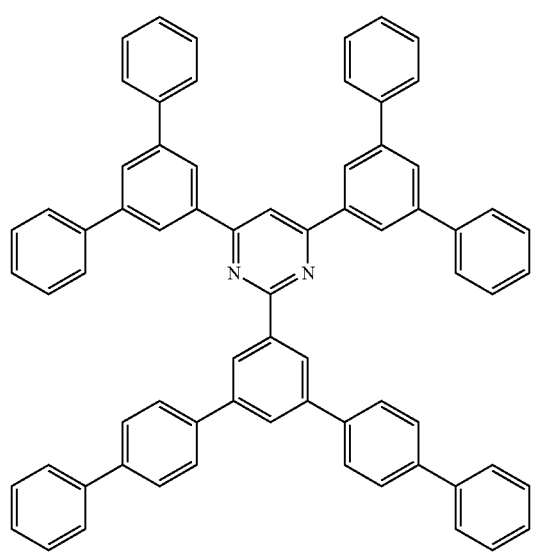
26
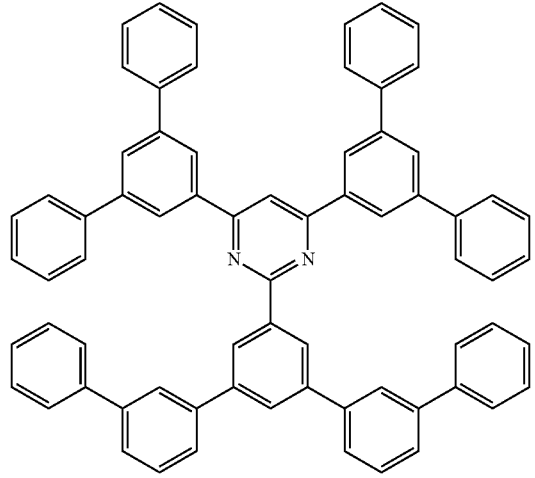
27
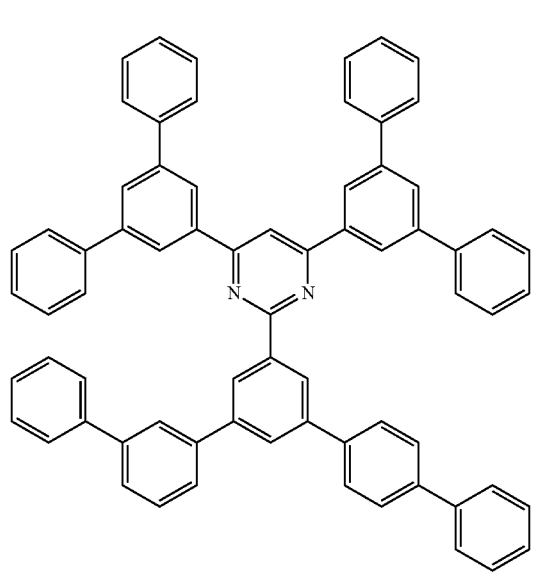

28
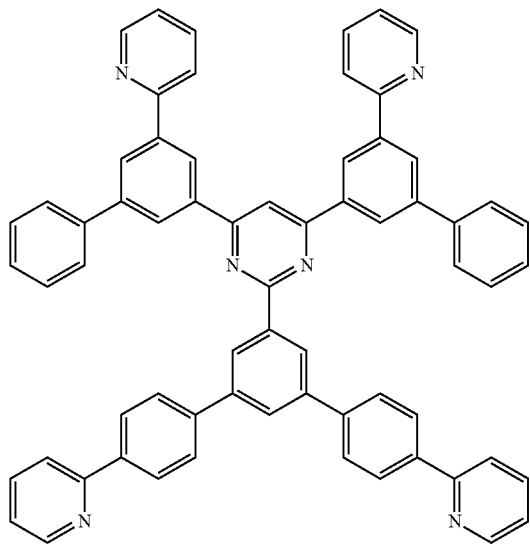
29
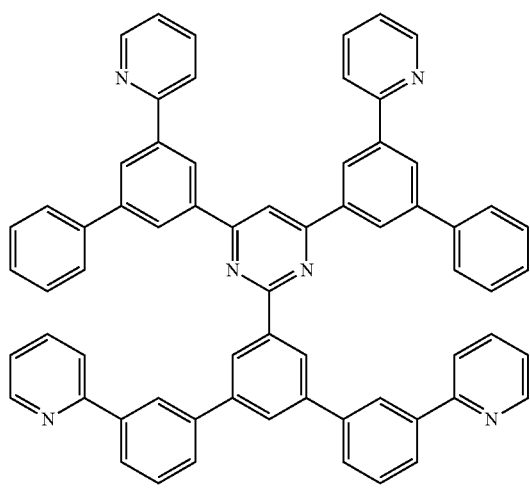
30
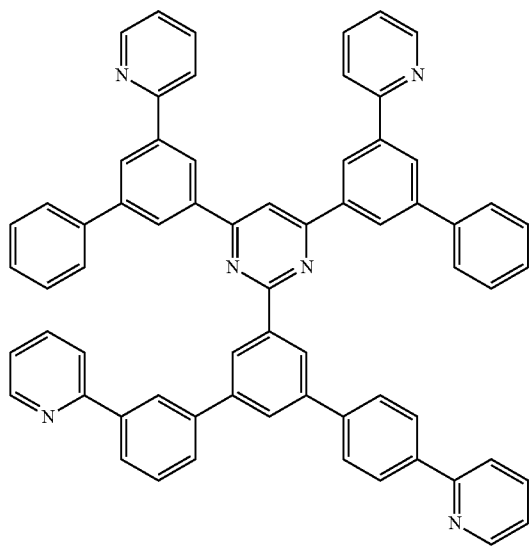
31
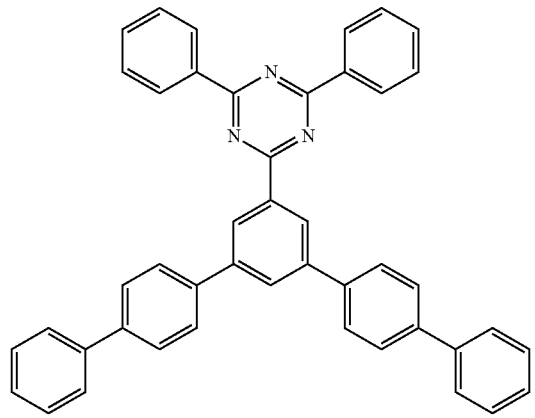
32
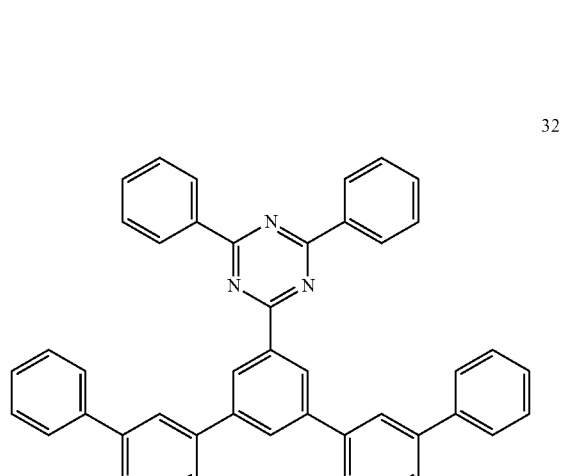
33

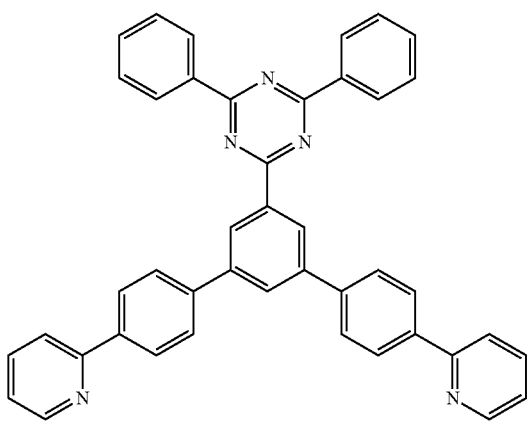
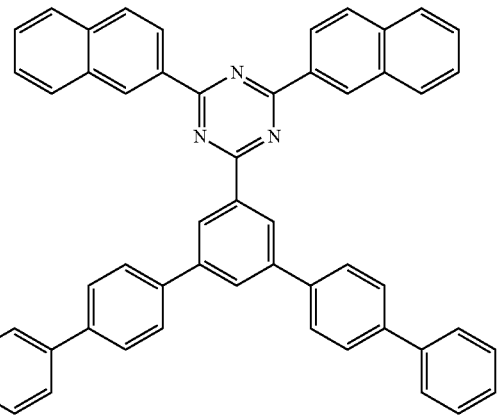
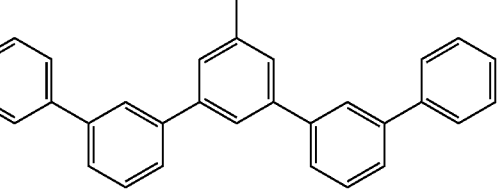

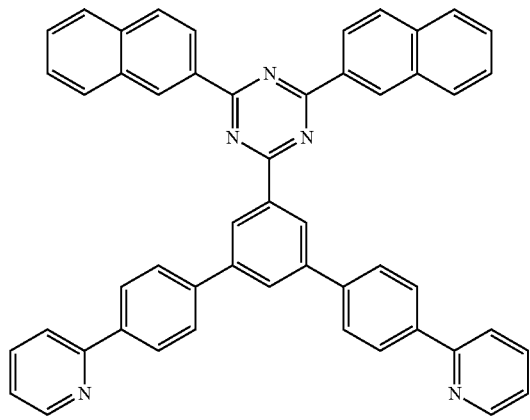
40
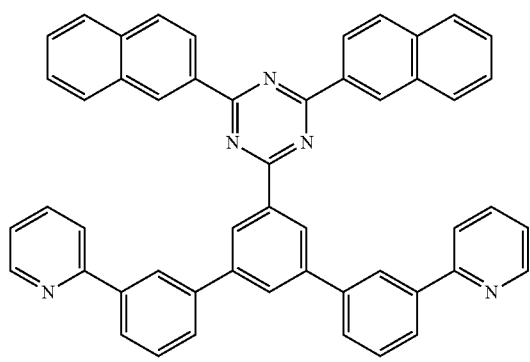
41
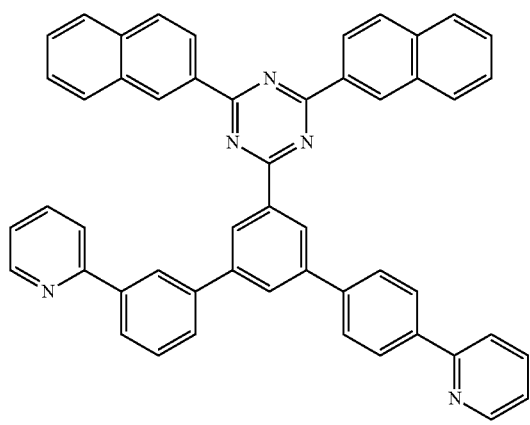
42
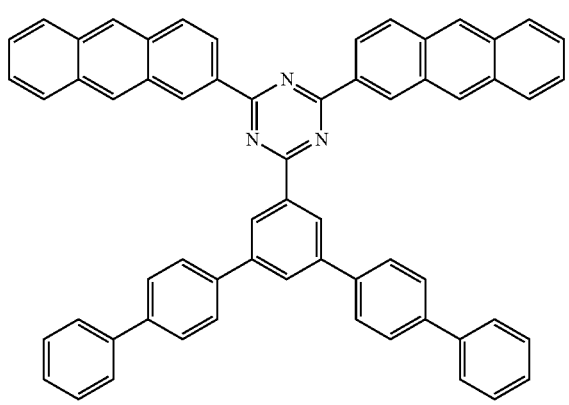
43
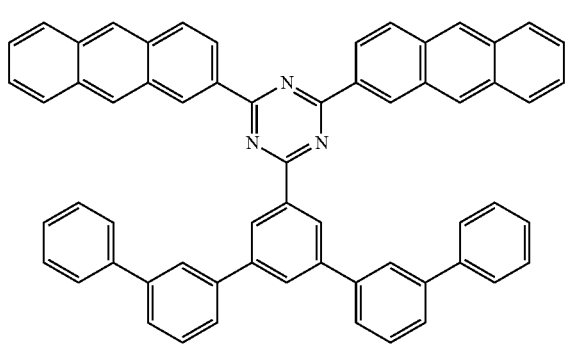
44
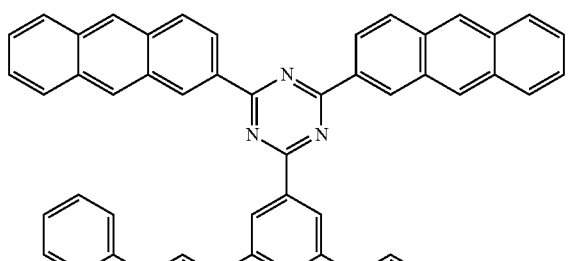
45
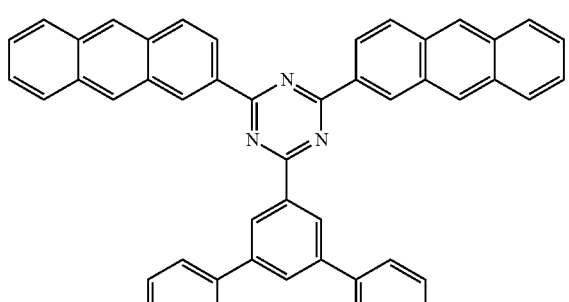
46

17
-continued
47
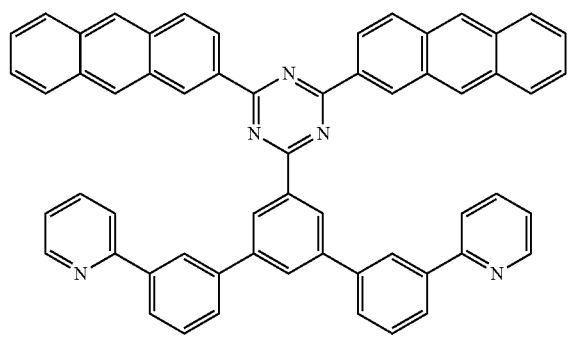
48
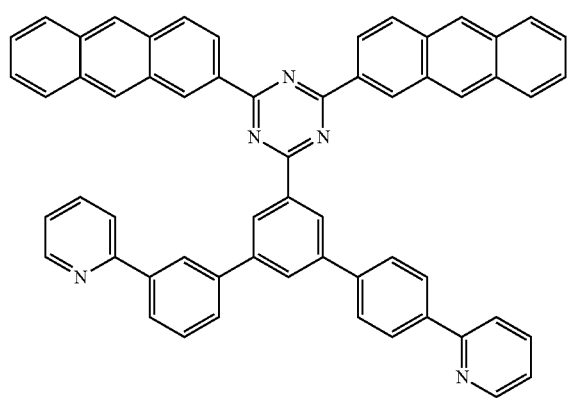
49
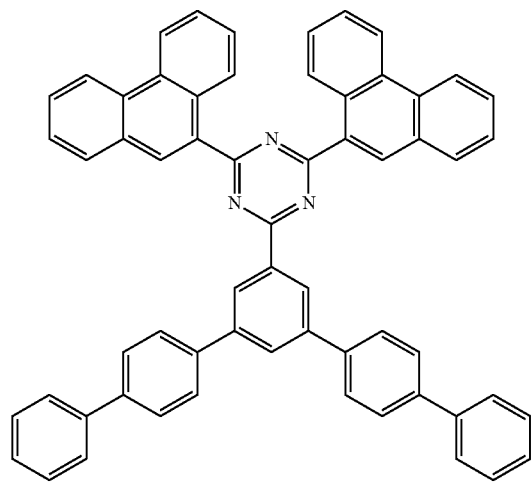
18
-continued
50
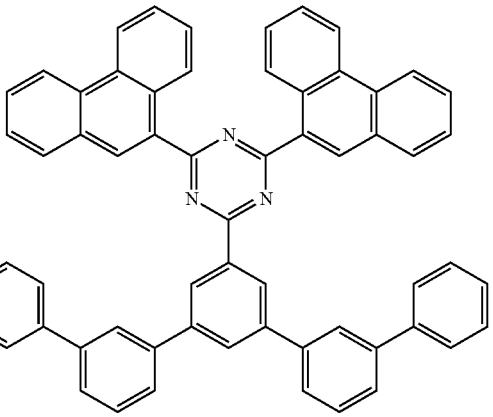
51
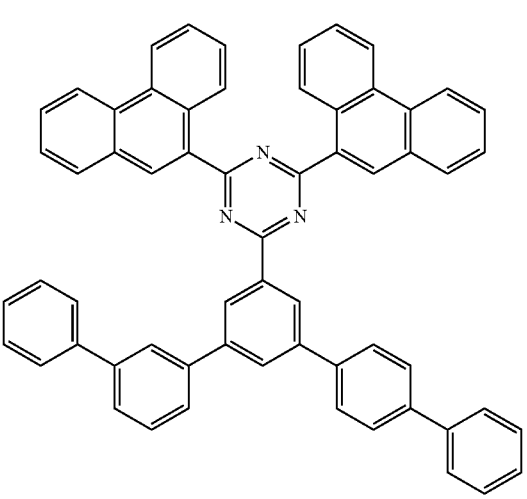
52
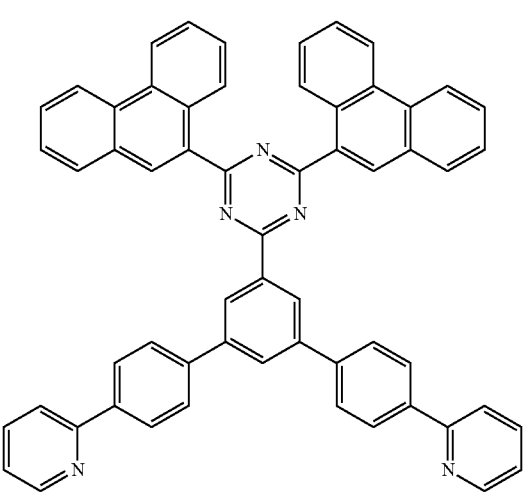

53
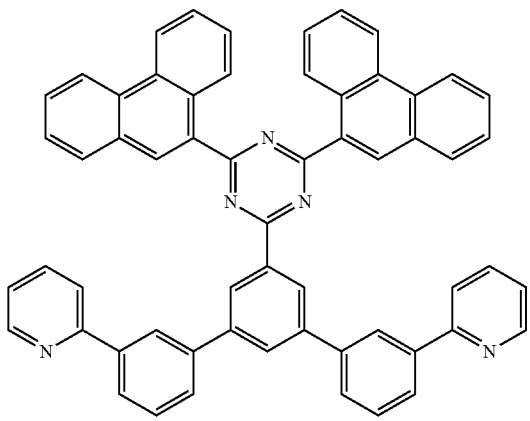
54
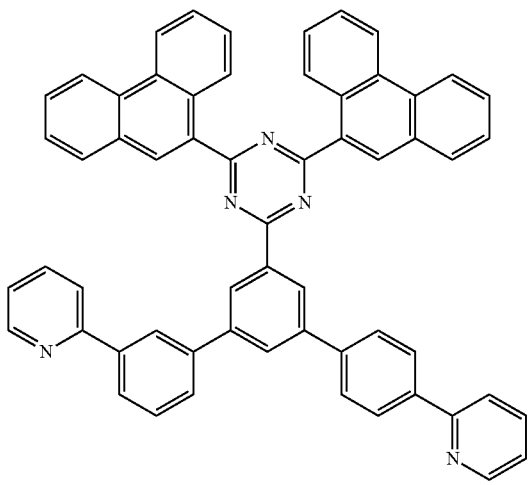
55
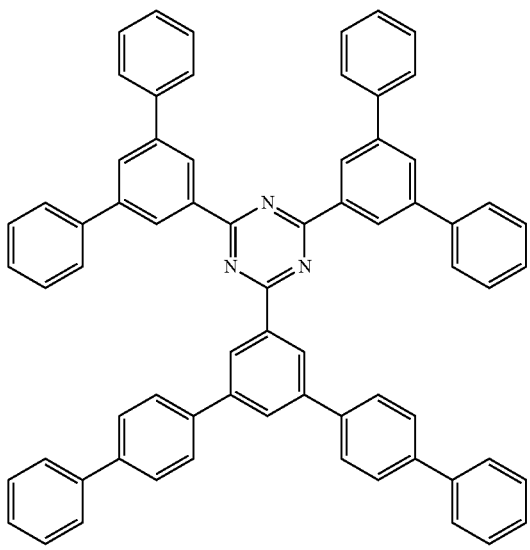
56
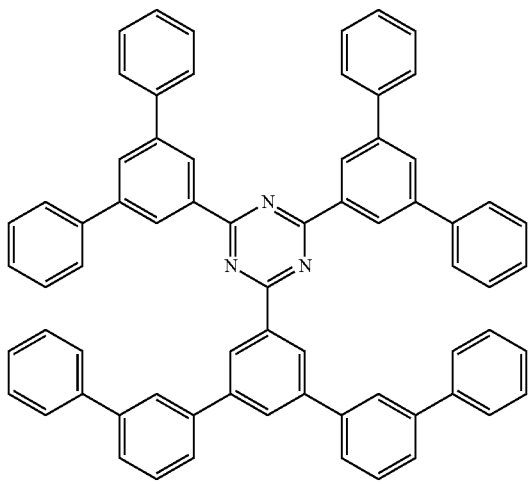
57
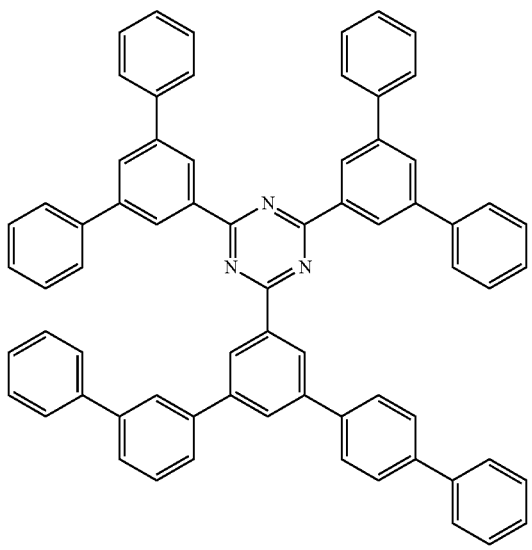
58
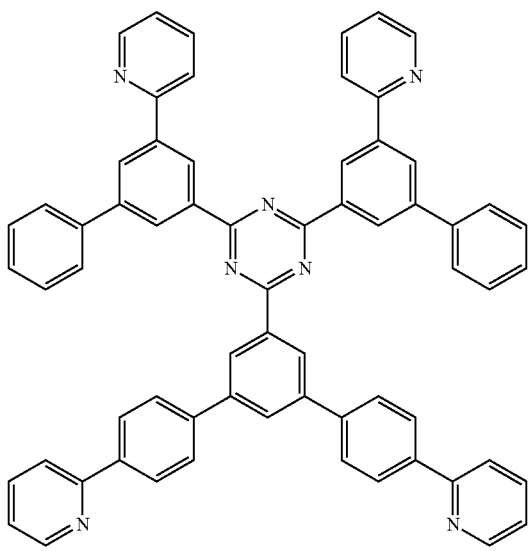

59
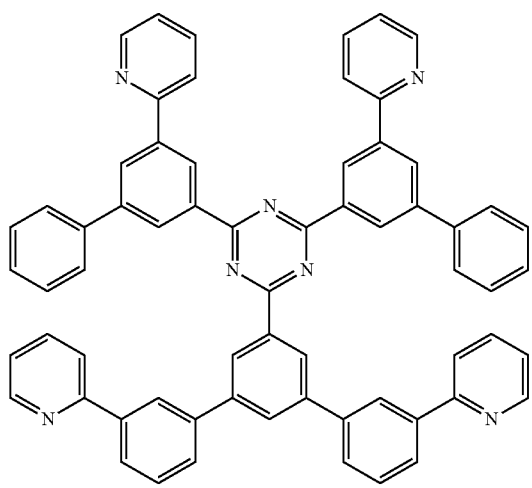
60
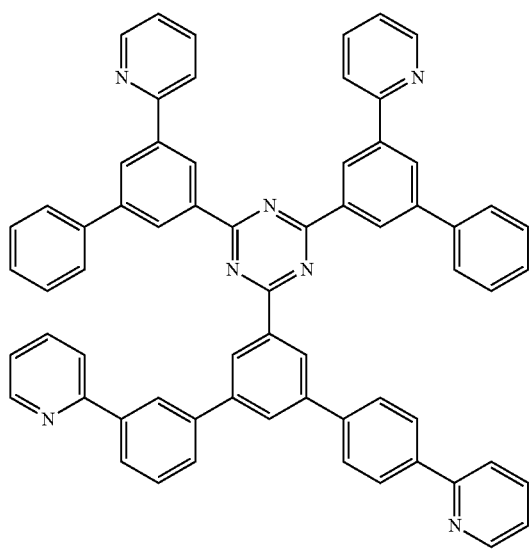
61
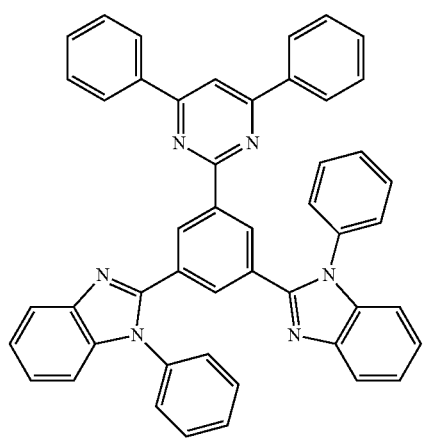
62
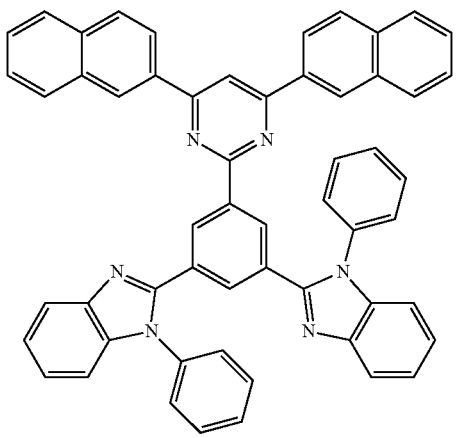
63
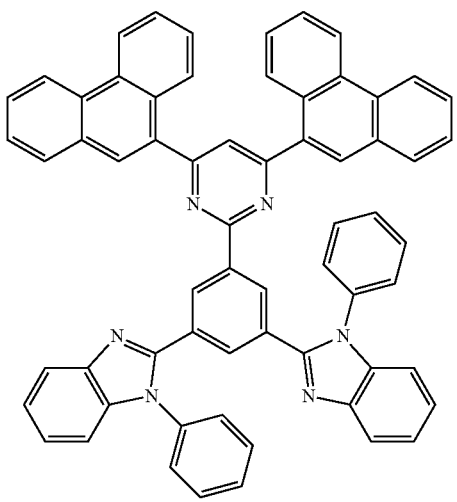
64
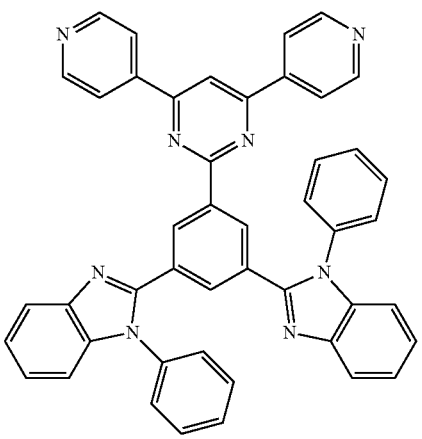

-continued

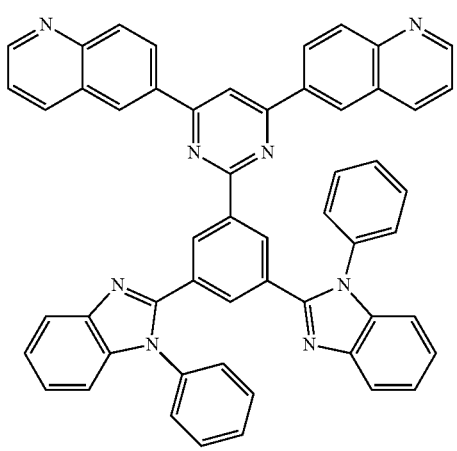

65

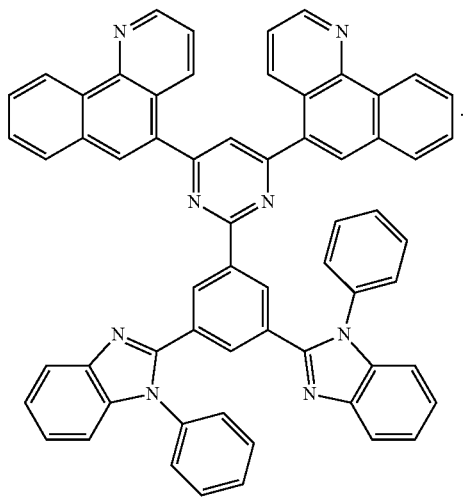

66

The organic layer may include an electron transport layer (ETL), an electron injection layer (EIL), or a functional layer having both electron injection and electron transport capabilities.

The organic layer may include an emission layer (EML). The EML may include a phosphorescent compound or a fluorescent compound.

The EML may include a fluorescent compound represented by Formula 2 below:

<Formula 2>

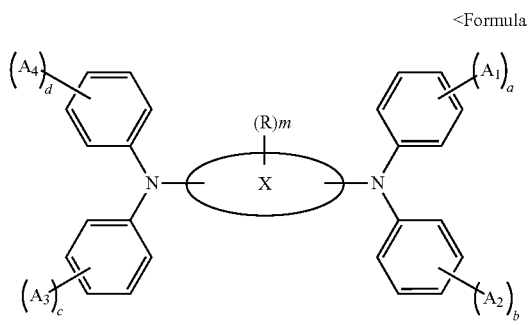

wherein, in Formula 2 above, $A_1$ to $A_4$ and R are each independently a hydrogen atom, a deuterium atom, a cyano group, a halogen atom, a substituted or unsubstituted $C_1$-$C_{60}$ alkyl group, a substituted or unsubstituted $C_6$-$C_{60}$ aryl group, or a substituted or unsubstituted $C_3$-$C_{60}$ cycloalkyl group, and X is a substituted or unsubstituted $C_6$-$C_{60}$ arylene group, or a substituted or unsubstituted $C_2$-$C_{60}$ heteroarylene group, a, b, c, and d, are each independently an integer from 1 to 5 and m is an integer from 1 to 10.

X in Formula 2 may be a substituted or unsubstituted pyrenylene group, a substituted or unsubstituted anthracenylene group, a substituted or unsubstituted phenanthrolinylene group, a substituted or unsubstituted benzopyrenylene group, a substituted or unsubstituted phenalenylene group, or a substituted or unsubstituted chrysenylene group.

$A_1$ to $A_4$ and R in Formula 2 each independently a hydrogen atom, a deuterium atom, a halogen atom, or a substituted or unsubstituted $C_1$-$C_{20}$ alkyl group.

The compound of Formula 2 may be one of compounds represented by Formulas below:

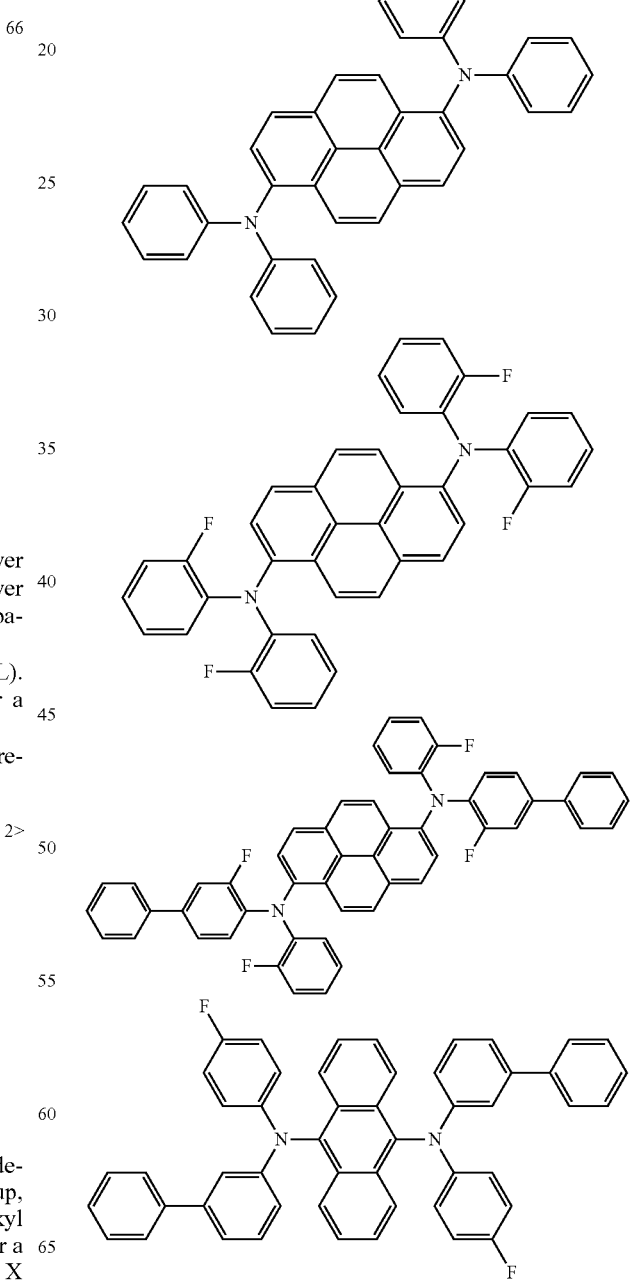

-continued

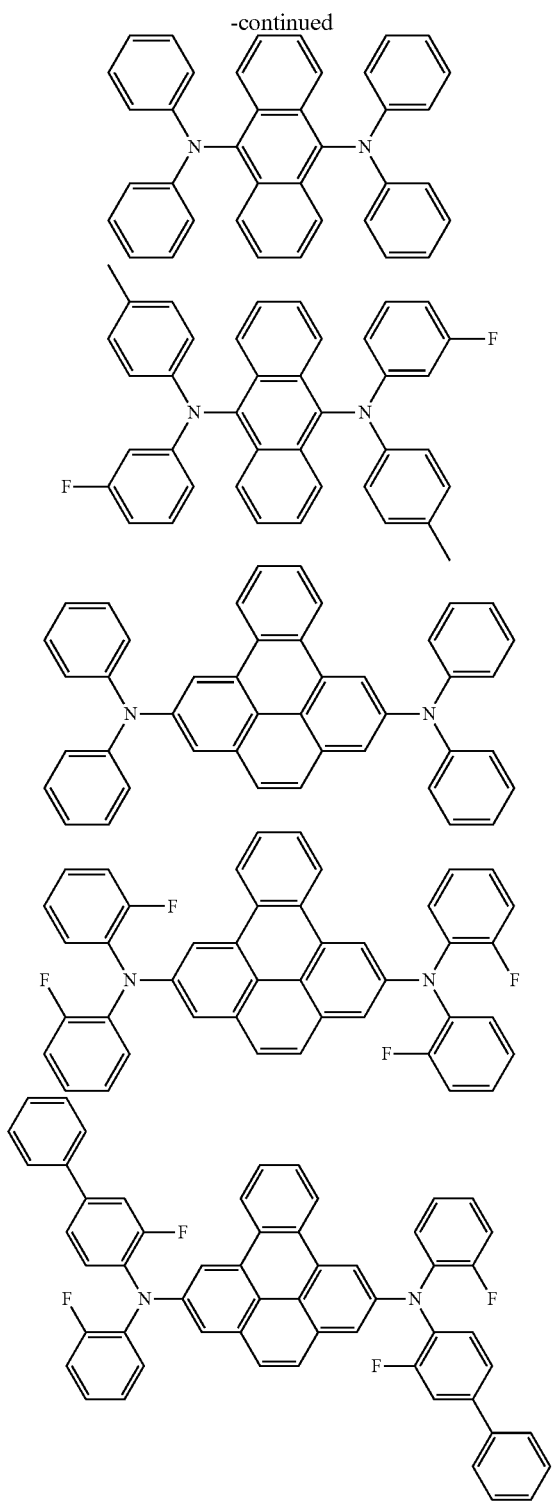

The organic layer may include an emission layer (EML), an electron injection layer (EIL), an electron transport layer (ETL), wherein the EIL and ETL may be in a form of separate layers or in a form of a single functional layer having both electron injection and electron transport capabilities, a hole injection layer (HIL), and a hole transport layer (HTL), wherein the HIL and the HTL may be in a form of separate layers or in a form of a single functional layer having both hole injection and hole transport capabilities. The EML may include at least one layer of a red EML, a green EML, a blue EML, or a white EML that includes a phosphorescent compound.

The hole injection layer (HIL) and the hole transport layer (HTL), or the functional layer having both hole injection and hole transport capabilities may include a charge-generating material.

The charge-generating material may be a p-dopant.

The p-dopant may be a quinone derivative, a metal oxide, or a cyano group-containing compound.

The organic layer may include an electron transport layer (ETL). The ETL may include a metal complex.

The organic layer may be formed of compounds for forming the organic layer by using a wet process.

A flat panel display device may include the organic light-emitting diode. The first electrode of the organic light-emitting diode may be electrically connected to a source electrode or a drain electrode of a thin-film transistor.

BRIEF DESCRIPTION OF THE DRAWING

Features will become apparent to those of skill in the art by describing in detail exemplary embodiments with reference to the attached drawings in which:

FIG. 1 illustrates a schematic view of a structure of an organic light-emitting diode (OLED) according to an embodiment.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present.

As used herein, the term "and/or" includes any and all combinations of one or more of the associated listed items. Expressions such as "at least one of," when preceding a list of elements, modify the entire list of elements and do not modify the individual elements of the list.

According to an aspect, an organic light-emitting diode (OLED) includes a first electrode; a second electrode; and an organic layer that is interposed between the first electrode and the second electrode. The organic layer includes a heterocyclic compound represented by Formula 1 below:

<Formula 1>

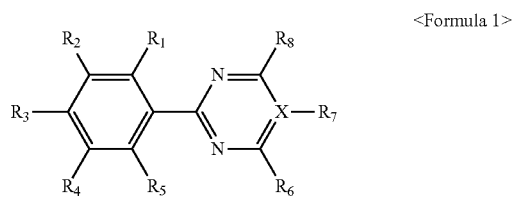

In Formula 1, $R_1$ to $R_6$ and $R_8$ in Formula 1 may each independently be a hydrogen atom, a deuterium atom, a halogen atom, a cyano group, a nitro group, a hydroxyl group, a carboxyl group, a substituted or unsubstituted $C_1$-$C_{60}$ alkyl group, a substituted or unsubstituted $C_3$-$C_{60}$ cycloalkyl group, a substituted or unsubstituted $C_1$-$C_{60}$ alkoxy group, a substituted or unsubstituted $C_6$-$C_{60}$ aryloxy group, a substituted or unsubstituted $C_6$-$C_{60}$ arylthio group, a substituted or unsubstituted $C_6$-$C_{60}$ aryl group, an amino group substituted with a $C_6$-$C_{60}$ aryl group, a substituted or unsubstituted $C_2$-$C_{60}$ heteroaryl group, or a substituted or unsubstituted $C_6$-$C_{60}$ condensed polycyclic group, $R_7$ may be an non-bonding electron pair, a hydrogen atom, a deuterium atom, a halogen atom, a cyano group, a nitro group, a hydroxyl group, a carboxyl group, a substituted or unsubstituted $C_1$-$C_{60}$ alkyl group, a substituted or unsubstituted $C_3$-$C_{60}$ cycloalkyl group, a substituted or unsubstituted $C_1$-$C_{60}$ alkoxy group, a substituted or unsubstituted $C_6$-$C_{60}$ aryloxy group, a substituted or unsubstituted $C_6$-$C_{60}$ arylthio group, a substituted or unsubstituted $C_6$-$C_{60}$ aryl group, an amino group substituted with a $C_6$-$C_{60}$ aryl group, a substituted or unsubstituted $C_2$-$C_{60}$ heteroaryl group, or a substituted or unsubstituted $C_6$-$C_{60}$ condensed polycyclic group, and X may be C or N.

The definition of representative substituent used in the compound of Formula 1 above will now be described in detail.

In some implementations, X in Formula 1 above may be N and $R_7$ in Formula 1 above may be a non-bonding electron pair.

In some implementations, $R_1$, $R_3$, and $R_5$ in Formula 1 above may each independently be a hydrogen atom or a deuterium atom.

In some implementations, $R_2$, $R_4$, $R_6$, and $R_8$ in Formula 1 above may each independently be a substituted or unsubstituted $C_1$-$C_{60}$ alkyl group, a substituted or unsubstituted $C_3$-$C_{60}$ cycloalkyl group, a substituted or unsubstituted $C_1$-$C_{60}$ alkoxy group, a substituted or unsubstituted $C_6$-$C_{60}$ aryloxy group, a substituted or unsubstituted $C_6$-$C_{60}$ arylthio group, a substituted or unsubstituted $C_6$-$C_{60}$ aryl group, an amino group substituted with a $C_6$-$C_{60}$ aryl group, a substituted or unsubstituted $C_2$-$C_{60}$ heteroaryl group, or a substituted or unsubstituted $C_6$-$C_{60}$ condensed polycyclic group.

In some implementations, in Formula 1 above, $R_2$, $R_4$, $R_6$, and $R_8$ may each independently be a group represented by one of Formulas 2a to 2h below:

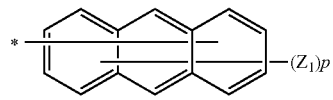

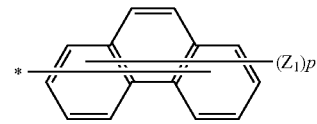

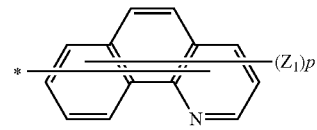

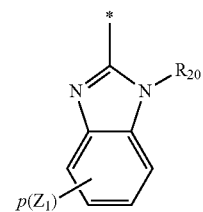

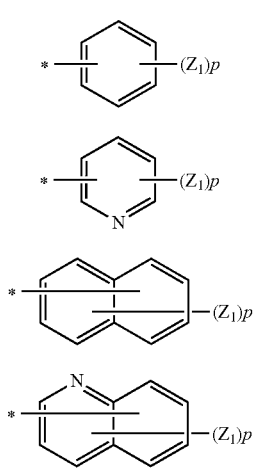

In the Formulas above, $Z_1$ and $R_{20}$ may each independently be a hydrogen atom, a deuterium atom, a substituted or unsubstituted $C_1$-$C_{20}$ alkyl group, a substituted or unsubstituted $C_6$-$C_{20}$ aryl group, a substituted or unsubstituted $C_2$-$C_{20}$ heteroaryl group, a substituted or unsubstituted $C_6$-$C_{20}$ condensed polycyclic group, an amino group substituted with a $C_6$-$C_{20}$ aryl group or a $C_2$-$C_{20}$ heteroaryl group, a halogen atom, a cyano group, a nitro group, a hydroxyl group, or a carboxyl group; p may be an integer from 1 to 9; and * indicates a binding site.

Examples of the compound of Formula 1 above include Compounds 1 to 66 below:

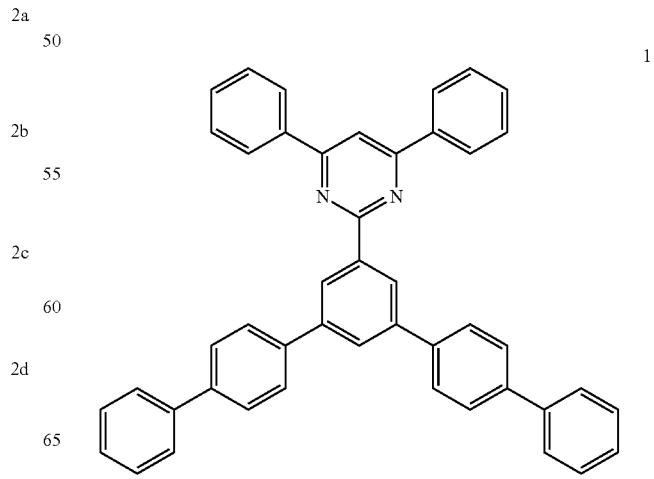

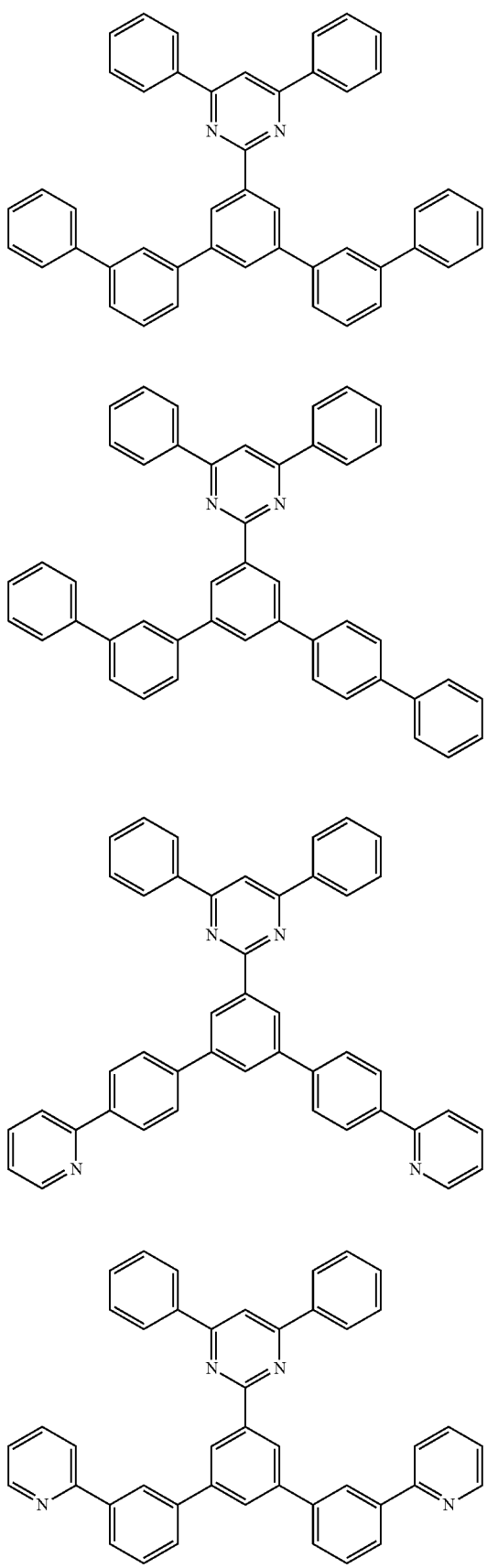
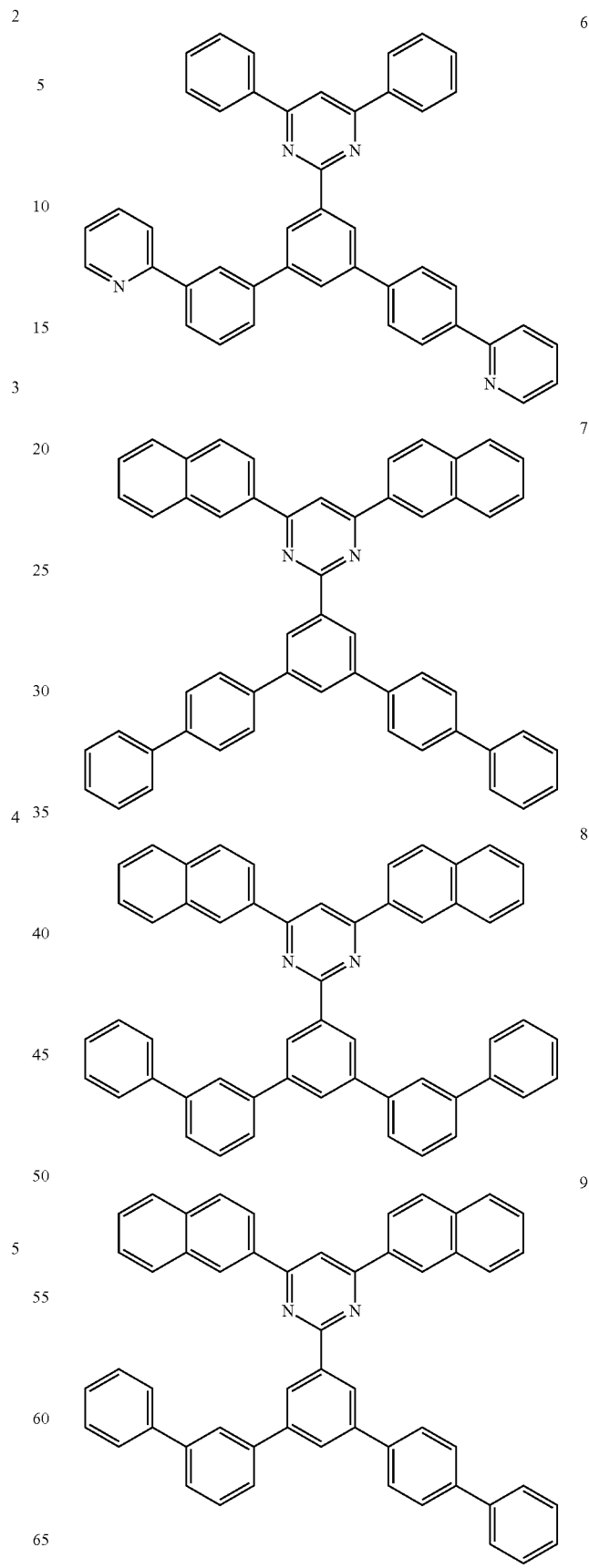

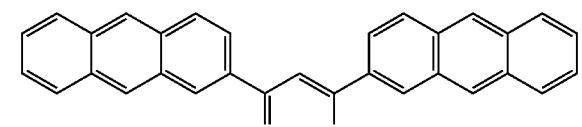
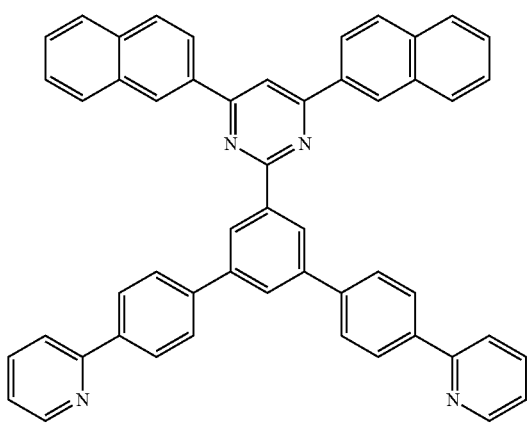
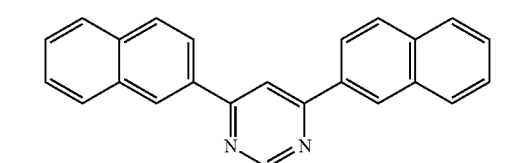
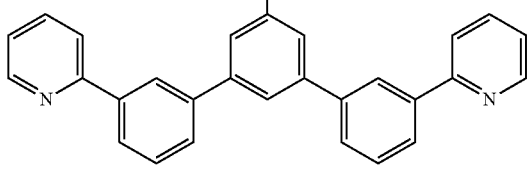
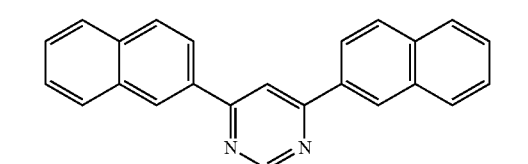
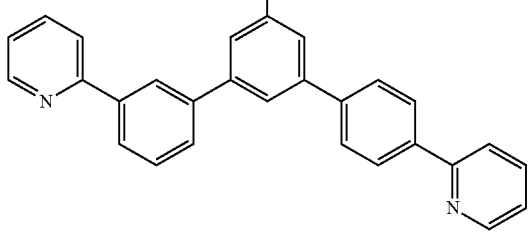
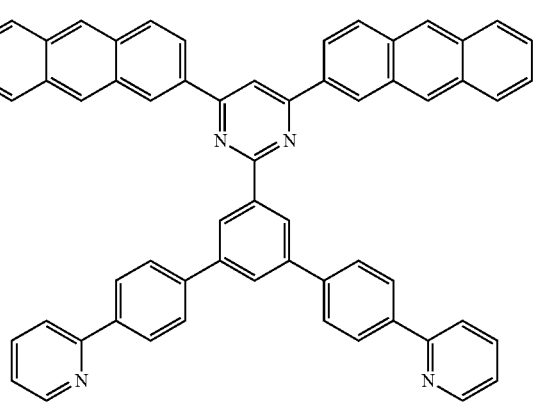

17
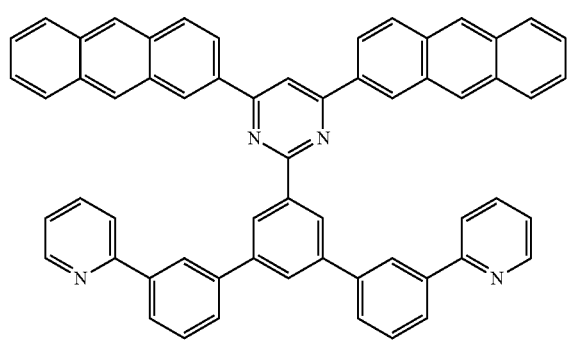
18
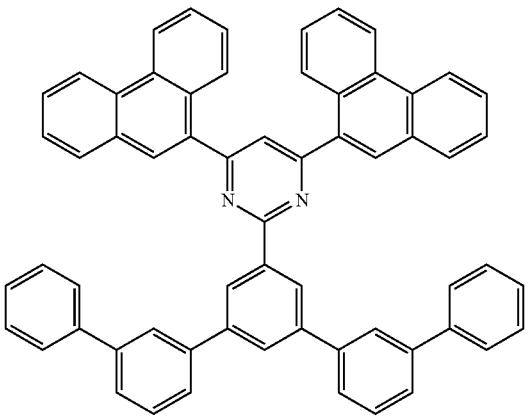
19
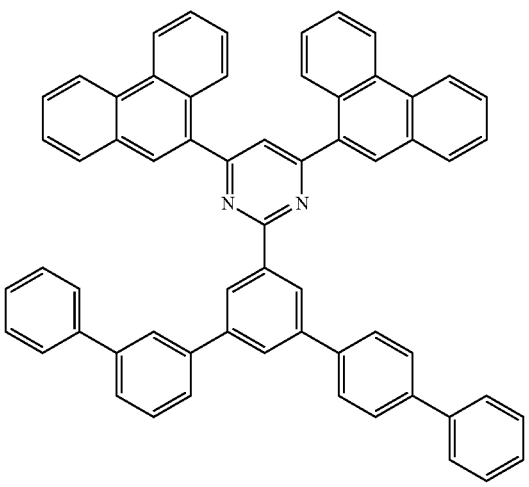
20
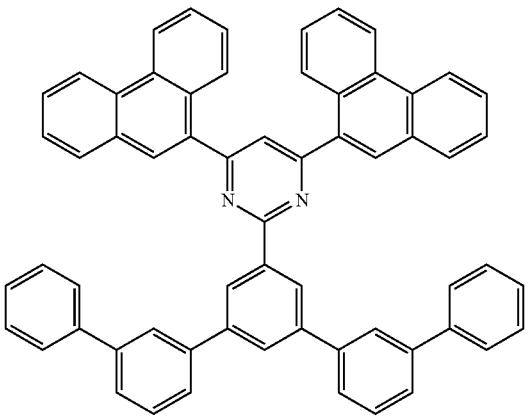
21
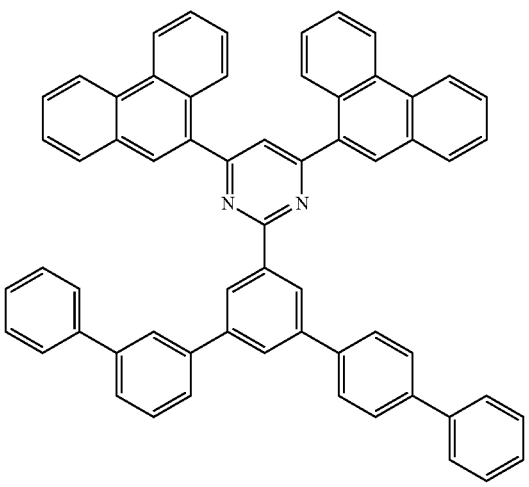
22
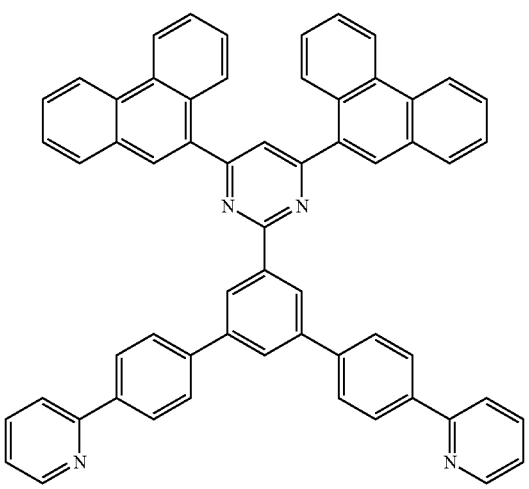

23
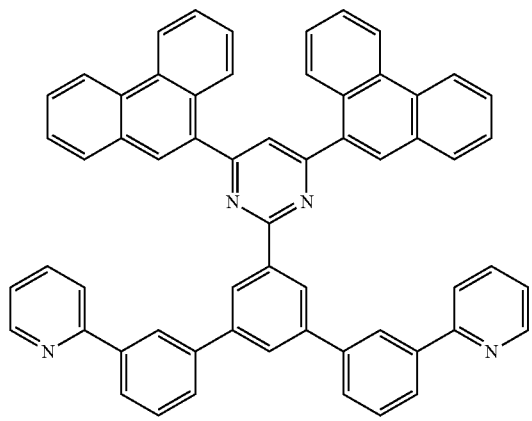
24
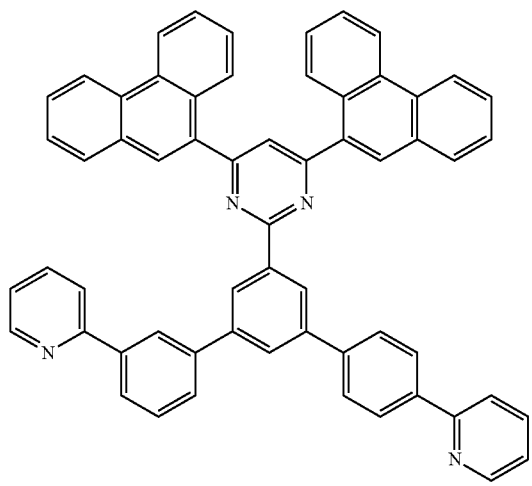
25
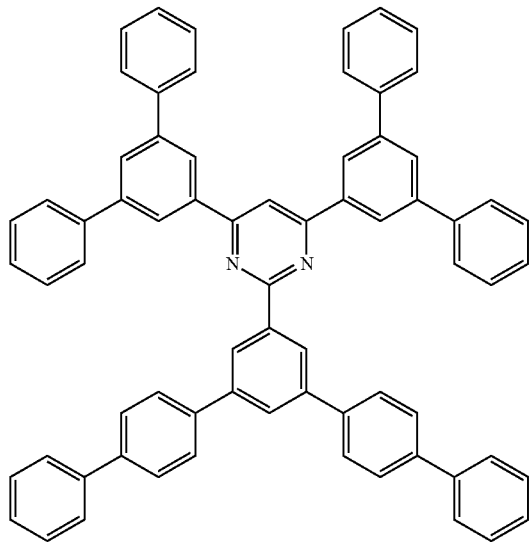
26
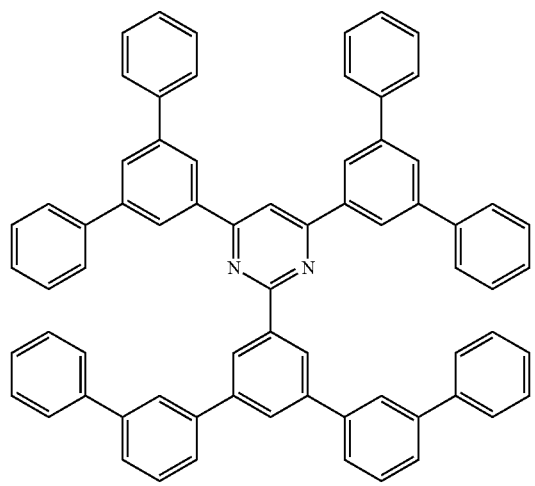
27
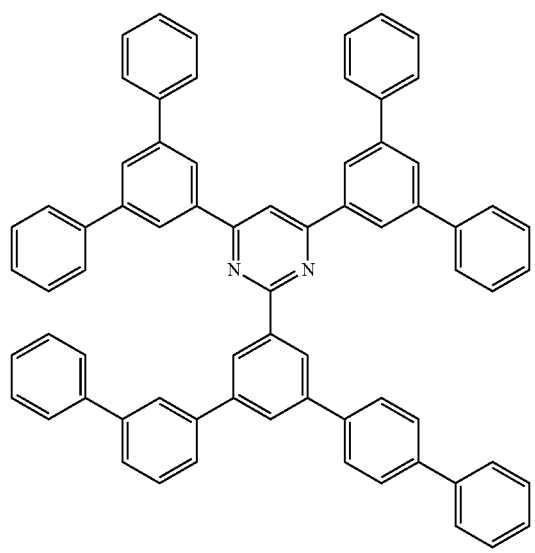
28
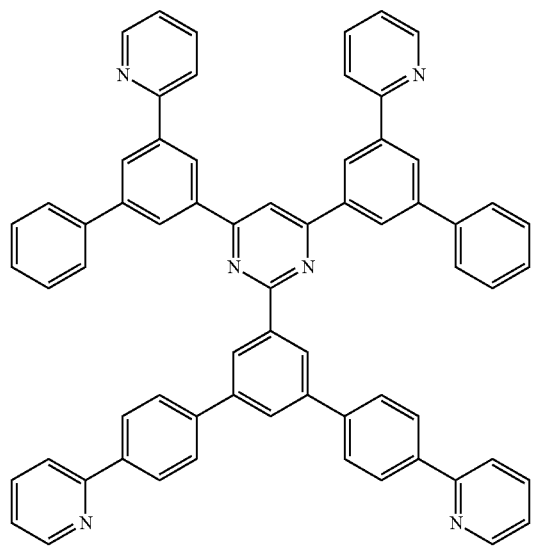

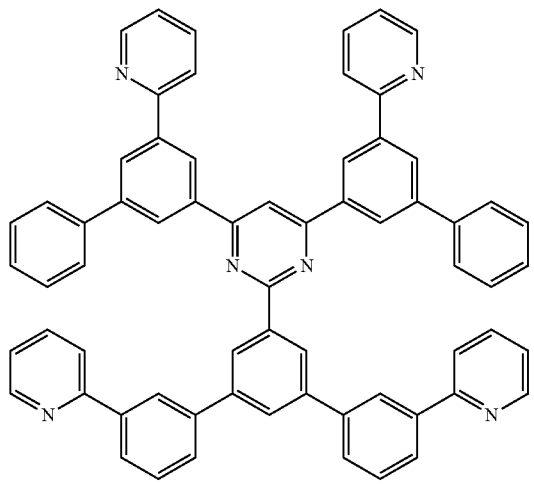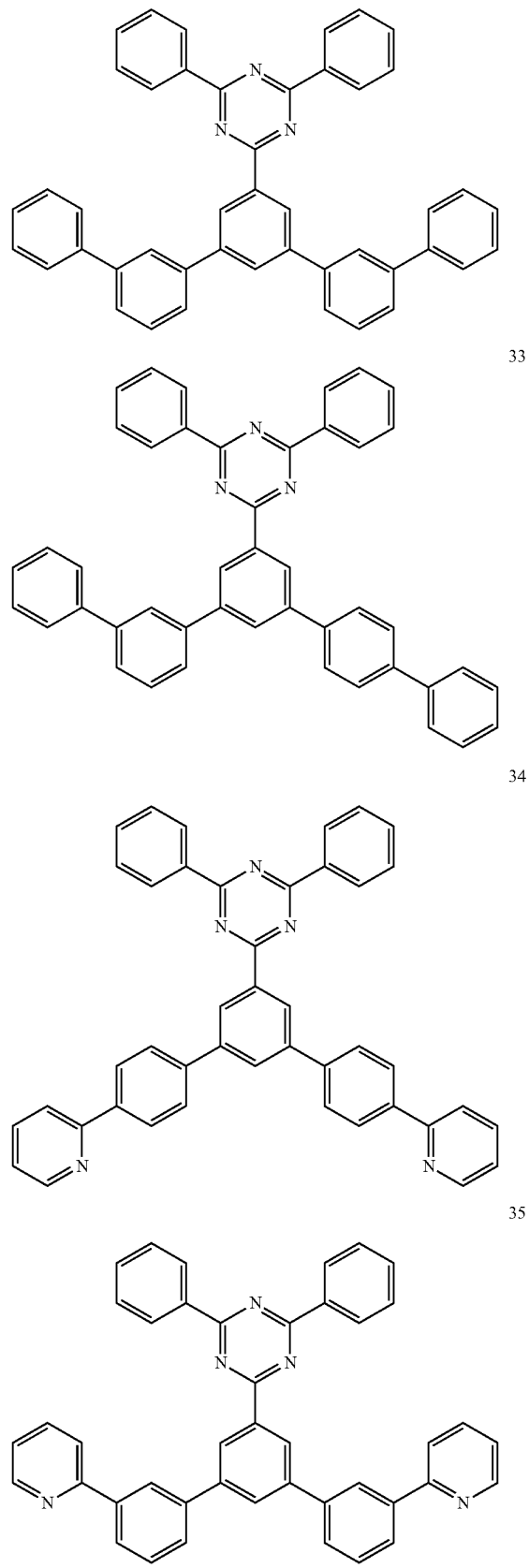

36
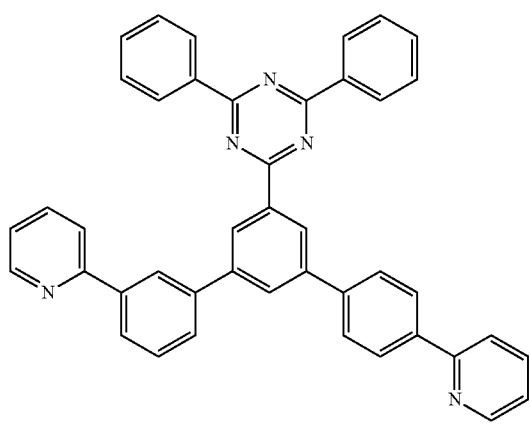
37
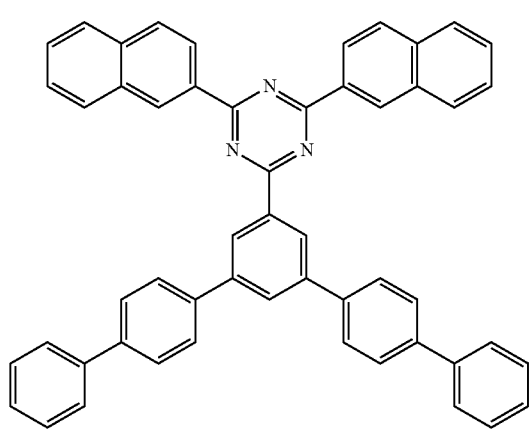
38
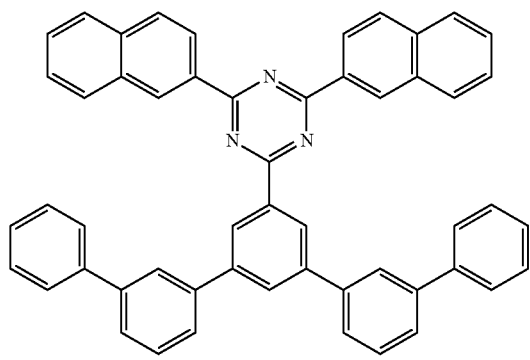
39
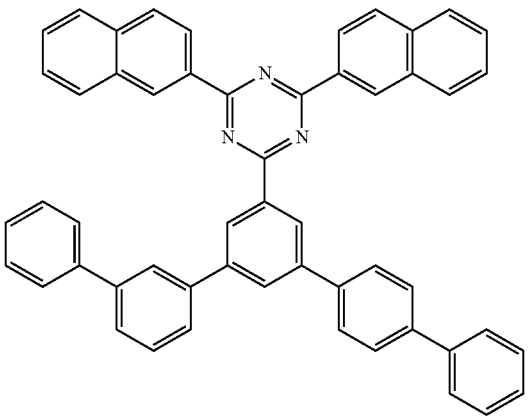
40
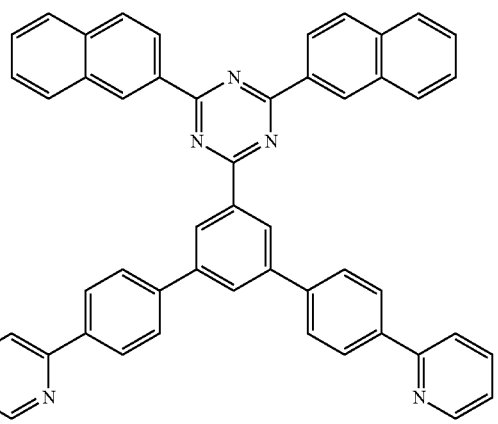
41
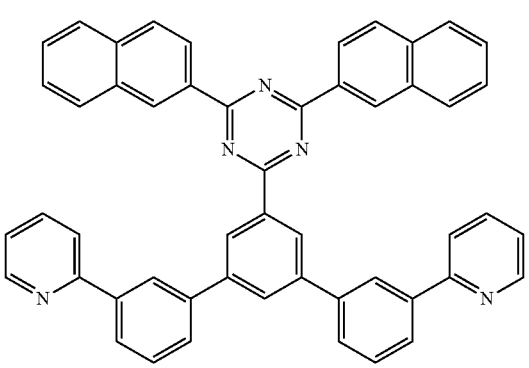

42
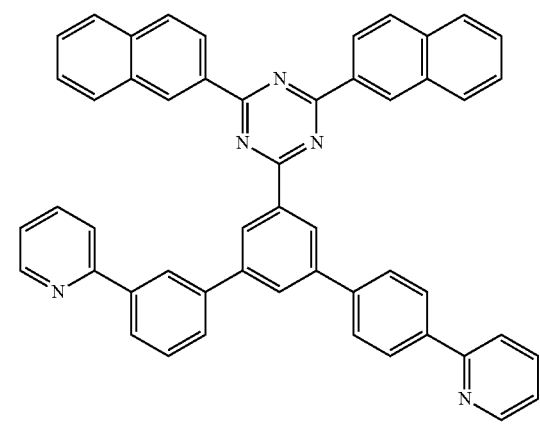
43
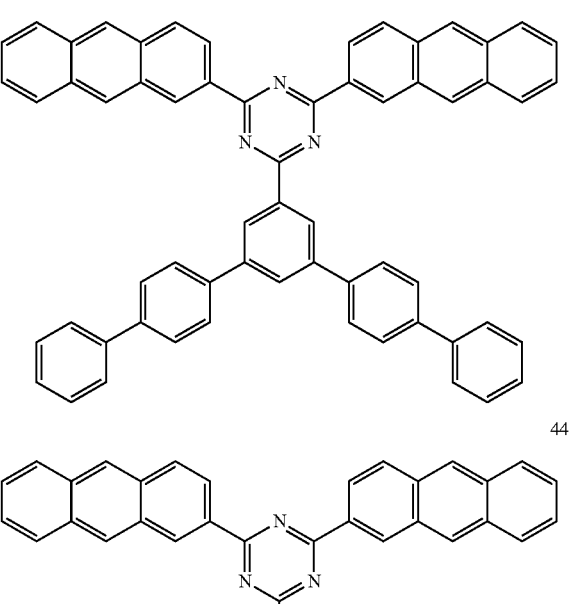
44
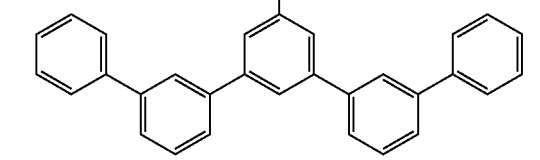
45
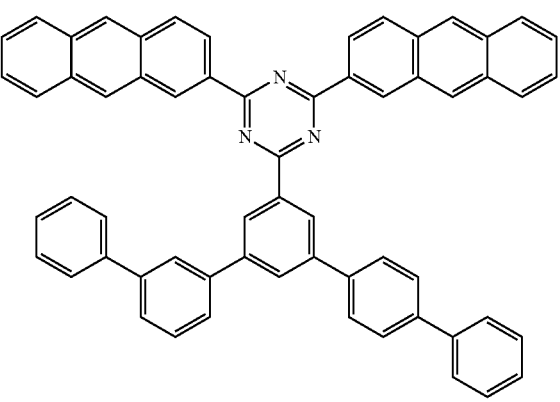
46
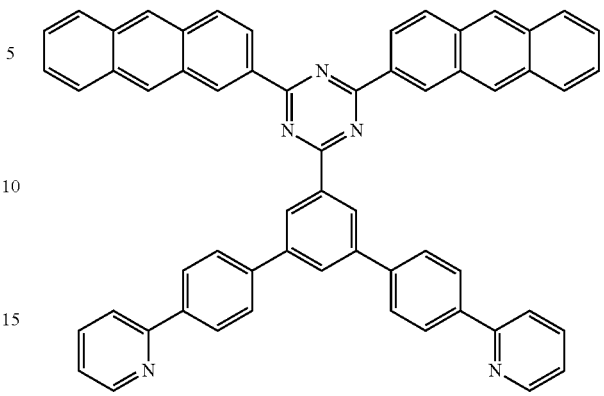
47
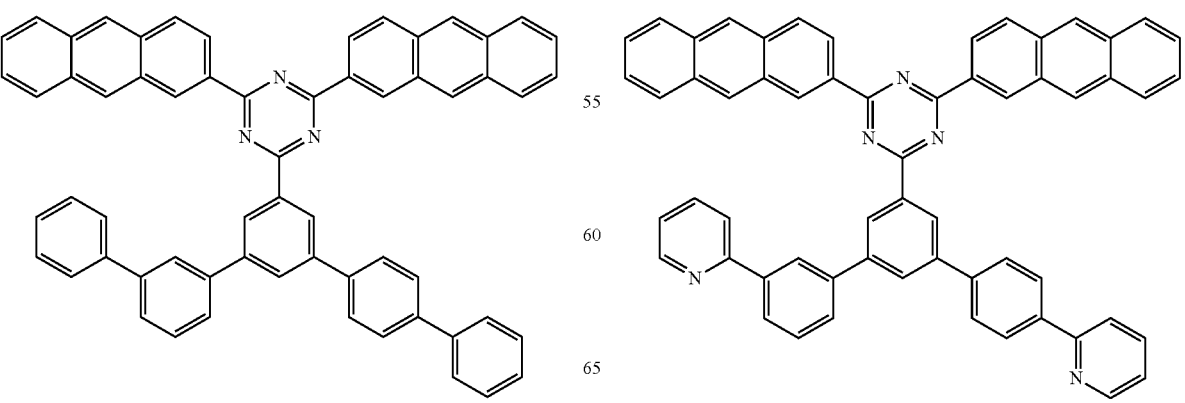
48
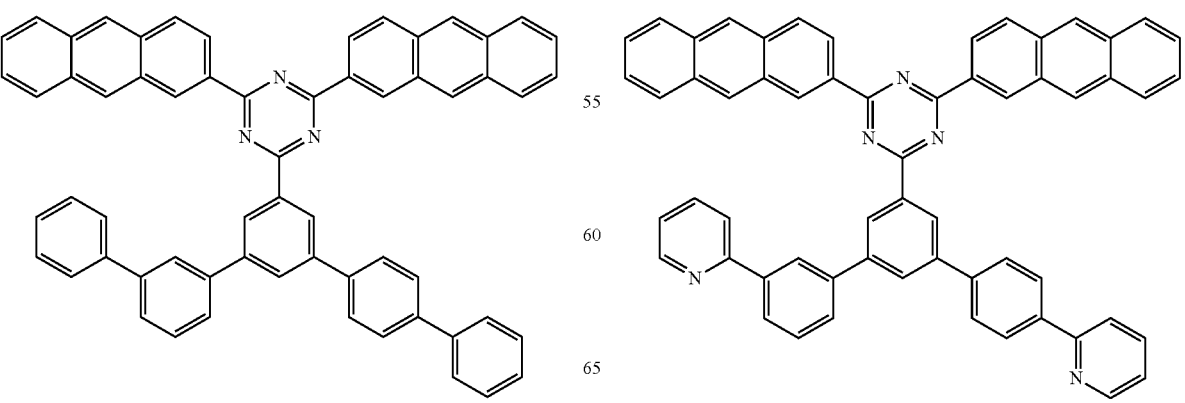

49
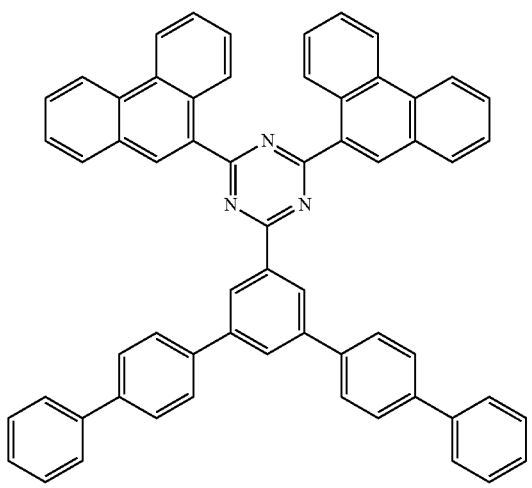
50
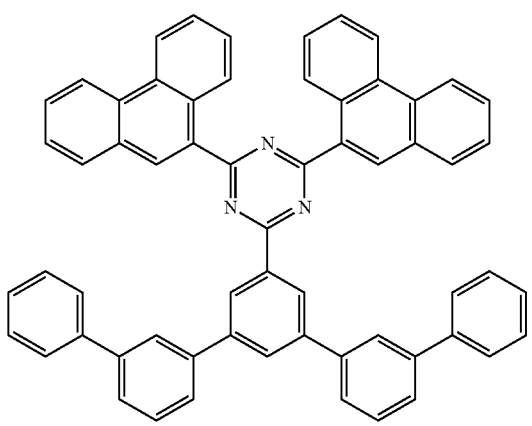
51
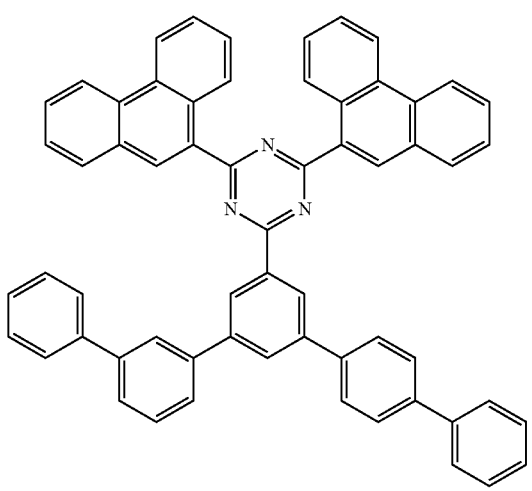
52
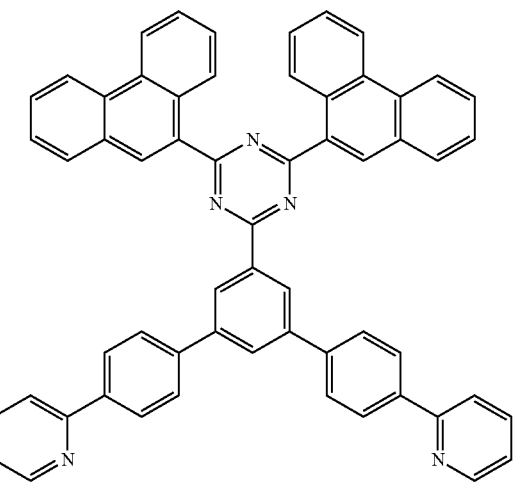
53
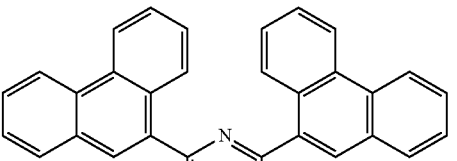
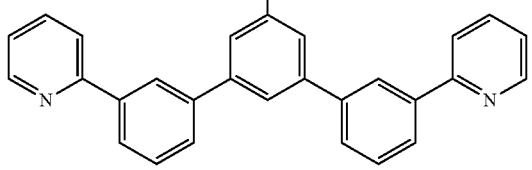
54
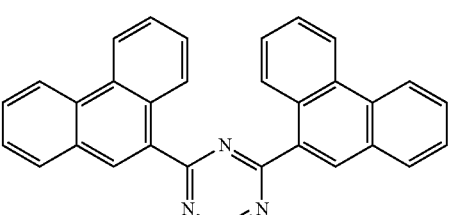
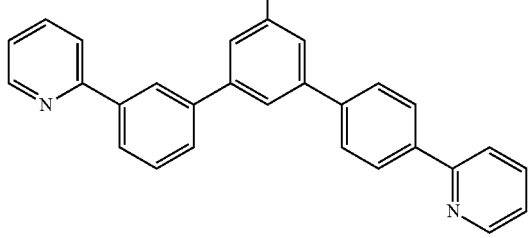

55
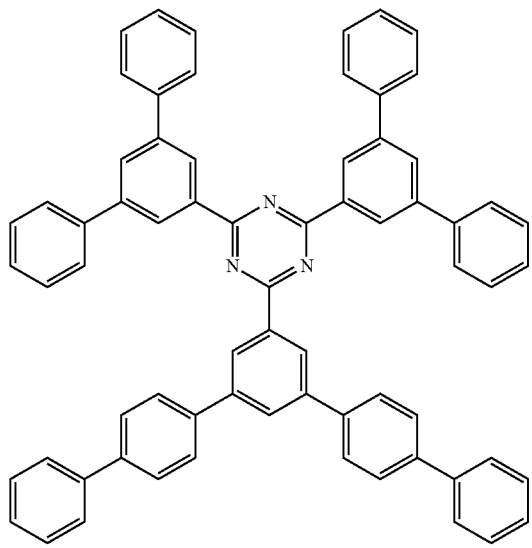
56
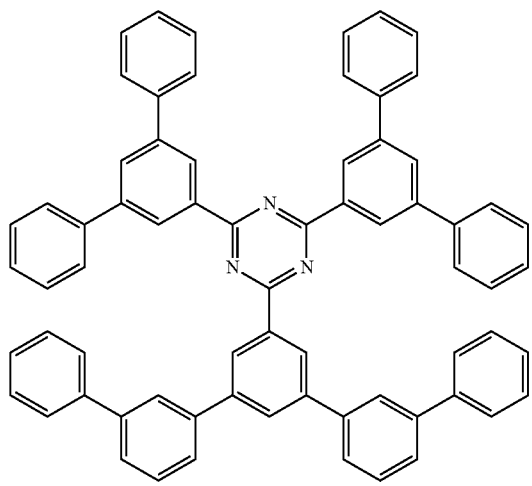
57
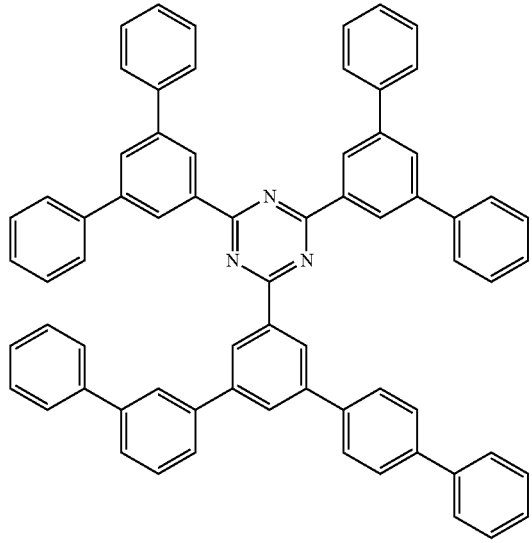
58
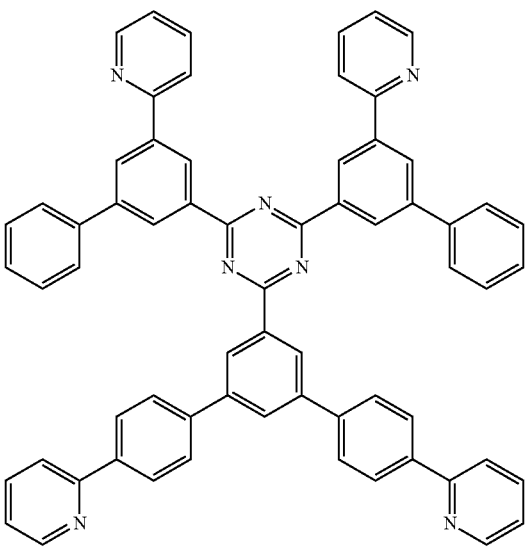
59
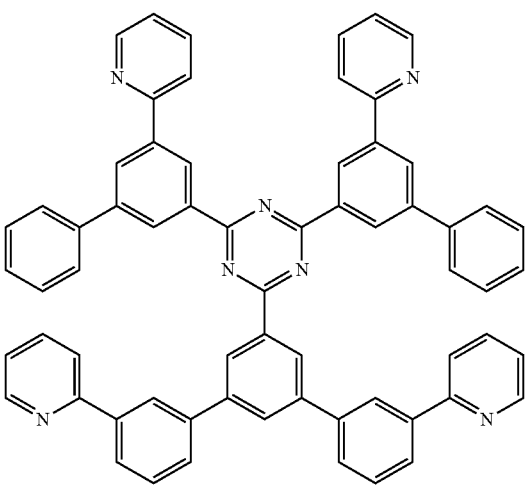
60
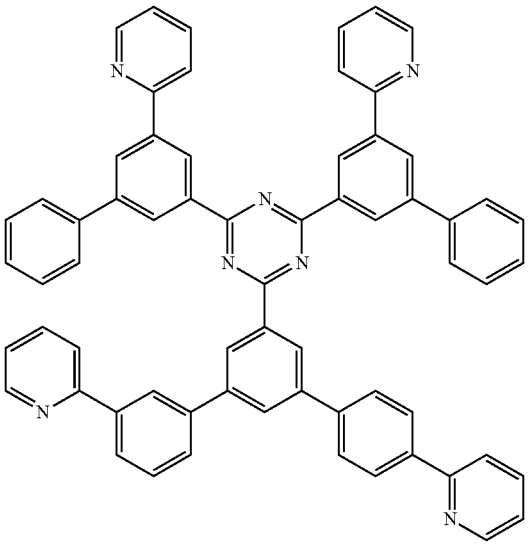

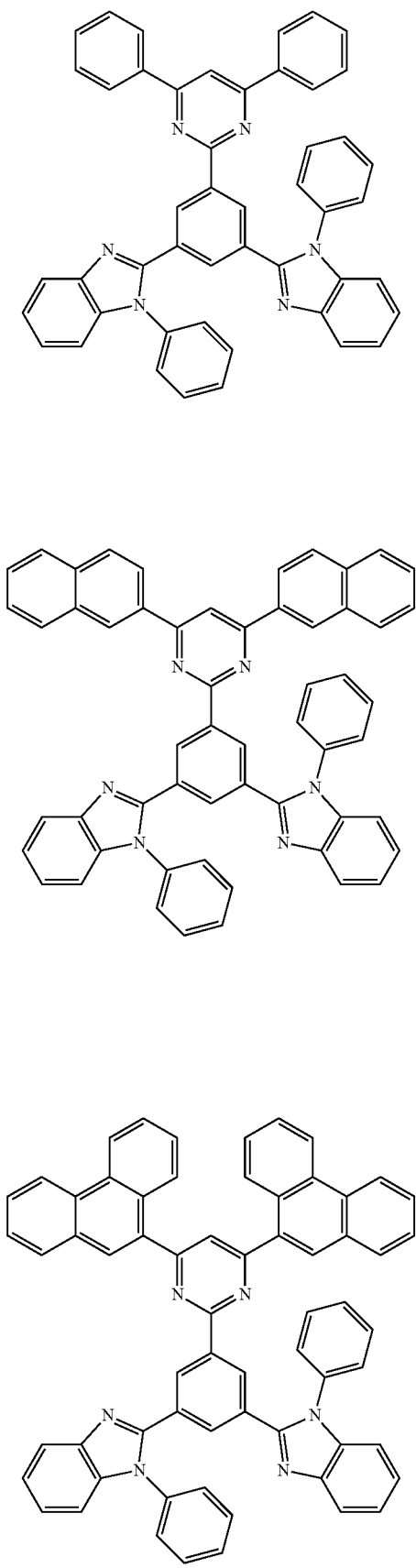
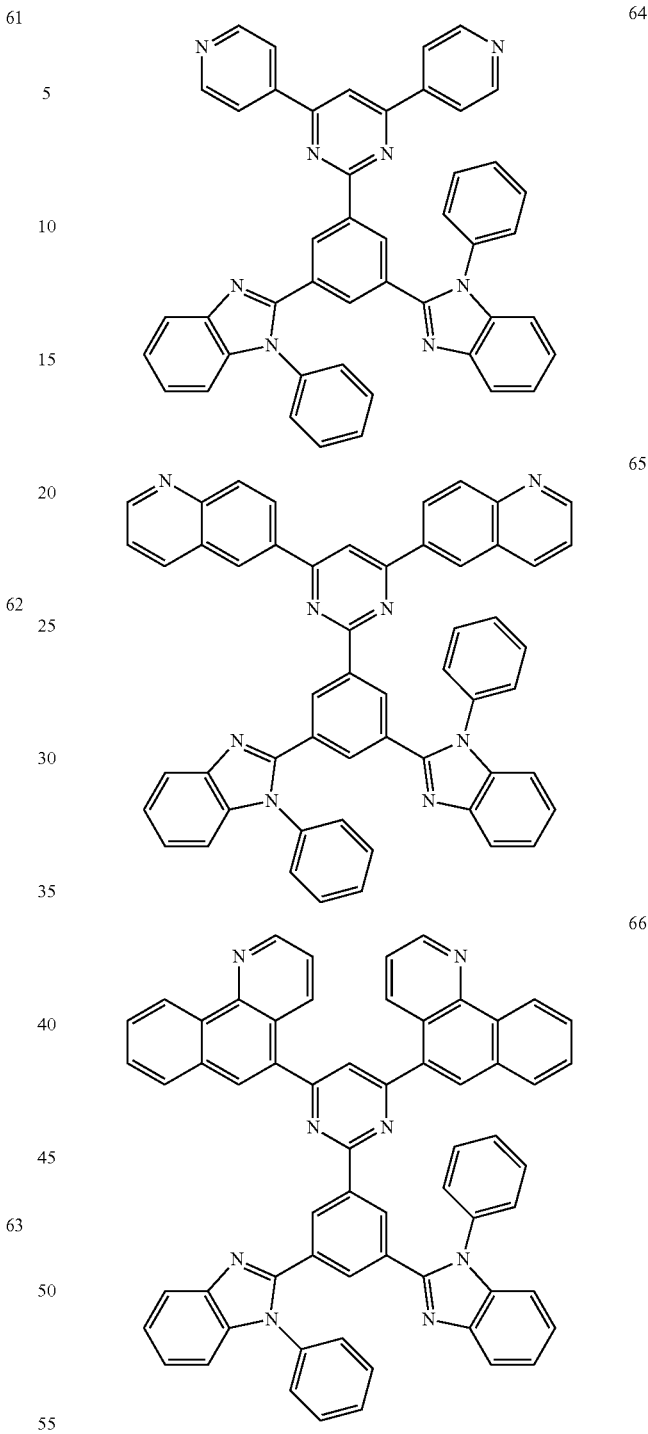

Hereinafter, the definition of representative substituents used herein will now be described in detail. (In this regard, numbers of carbons limiting a substituent are non-limited, and thus the substituent characteristics are not limited).

The unsubstituted $C_1$-$C_{60}$ alkyl group may be linear or branched. Non-limiting examples of unsubstituted $C_1$-$C_{60}$ alkyl group include a methyl group, an ethyl group, a propyl group, an iso-butyl group, a sec-butyl group, a pentyl group, an iso-amyl group, a hexyl group, a heptyl group, an octyl group, a nonanyl group, and a dodecyl group. To provide a substituted $C_1$-$C_{60}$ alkyl group, at least one hydrogen atom of the unsubstituted $C_1$-$C_{60}$ alkyl group may be substituted with a deuterium atom, a halogen atom, a hydroxyl group, a nitro group, a cyano group, an amino group, an amidino group, a hydrazine, a hydrazone, a carboxyl group or a salt thereof, a sulfonic acid group or a salt thereof, a phosphoric acid group or a salt thereof, a $C_1$-$C_{10}$ alkyl group, a $C_1$-$C_{60}$ alkoxy group, a $C_2$-$C_{10}$ alkenyl group, a $C_2$-$C_{10}$ alkynyl group, a $C_6$-$C_{16}$ aryl group, or a $C_4$-$C_{16}$ heteroaryl group.

The term "unsubstituted $C_2$-$C_{60}$ alkenyl group" refers to an unsubstituted alkyl group having at least one carbon-carbon double bond in the center or at a terminal thereof. Examples of the unsubstituted $C_2$-$C_{60}$ alkenyl group are an ethenyl group, a propenyl group, and a butenyl group. To provide a substituted $C_2$-$C_{60}$ alkenyl group, at least one hydrogen atom of the unsubstituted $C_2$-$C_{60}$ alkenyl group may be substituted with a substituent described above with respect to the substituted alkyl group.

The term "unsubstituted $C_2$-$C_{60}$ alkynyl group" refers to an unsubstituted alkyl group having at least one carbon-carbon triple bond in the center or at a terminal end thereof. Examples of the unsubstituted $C_2$-$C_{60}$ alkynyl group are acetylene, propylene, phenylacetylene, naphthylacetylene, isopropylacetylene, t-butylacetylene, and diphenylacetylene. To provide a substituted $C_2$-$C_{60}$ alkynyl group, at least one hydrogen atom of the unsubstituted $C_2$-$C_{60}$ alkynyl group may be substituted with a substituent described above with respect to the substituted alkyl group.

The term "unsubstituted $C_3$-$C_{60}$ cycloalkyl group" refers to an alkyl group in the form of a $C_3$-$C_{60}$ ring or rings. To provide a substituted $C_3$-$C_{60}$ cycloalkyl group, at least one hydrogen atom of the unsubstituted $C_3$-$C_{60}$ cycloalkyl group may be substituted with a substituent described above with respect to the substituted $C_1$-$C_{60}$ alkyl group.

The unsubstituted $C_1$-$C_{60}$ alkoxy group has a structure of —OA (wherein, A is an unsubstituted $C_1$-$C_{60}$ alkyl group described above). Non-limiting examples of the unsubstituted $C_1$-$C_{60}$ alkoxy group are a methoxy group, an ethoxy group, a propoxy group, an isopropyloxy group, a butoxy group, and a pentoxy group. To provide a substituted $C_1$-$C_{60}$ alkoxy group, at least one hydrogen atom of the unsubstituted $C_1$-$C_{60}$ alkoxy group may be substituted with a substituent described above with respect to the substituted alkyl group.

The term "unsubstituted $C_6$-$C_{60}$ aryl group" refers to a carbocyclic aromatic system including at least one ring. When the unsubstituted $C_6$-$C_{60}$ aryl group has two or more of rings, the rings may be fused or linked to each other by a single bond. The term 'aryl' refers to an aromatic system, such as, for example, phenyl, naphthyl, or anthracenyl. To provide a substituted $C_6$-$C_{60}$ aryl group, at least one hydrogen atom of the unsubstituted $C_6$-$C_{60}$ aryl group may be substituted with a substituent described above with respect to the substituted $C_1$-$C_{60}$ alkyl group.

Examples of the substituted or unsubstituted $C_6$-$C_{60}$ aryl group include a phenyl group, a $C_1$-$C_{10}$ alkylphenyl group (i.e., an ethylphenyl group), a halophenyl group (i.e., an o-, m-, and p-fluorophenyl group and a dichlorophenyl group), a cyanophenyl group, a dicyanophenyl group, a trifluoromethoxyphenyl group, a biphenyl group, a halobiphenyl group, a cyanobiphenyl group, a $C_1$-$C_{10}$ alkylbiphenyl group, a $C_1$-$C_{10}$ alkoxybiphenyl group, an o-, m-, and p-tolyl group, an o-, m-, and p-cumenyl group, a mesityl group, a phenoxyphenyl group, an (α,α-dimethylbenzene)phenyl group, an (N,N'-dimethyl)aminophenyl group, an (N,N'-diphenyl)aminophenyl group, a pentalenyl group, an indenyl group, a naphthyl group, a halonaphthyl group (i.e., a fluoronaphthyl group), a $C_1$-$C_{10}$ alkylnaphthyl group (i.e., a methylnaphthyl group), a $C_1$-$C_{10}$ alkoxynaphthyl group (i.e., a methoxynaphthyl group), a cyanonaphthyl group, an anthracenyl group, an azulenyl group, a heptalenyl group, an acenaphthylenyl group, a phenalenyl group, a fluorenyl group, an anthraquinolyl group, a methylanthryl group, a phenanthryl group, a triphenylene group, a pyrenyl group, a chrycenyl group, an ethyl-chrycenyl group, a picenyl group, a perylenyl group, a chloroperylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, and an ovalenyl group.

The term "unsubstituted $C_2$-$C_{60}$ heteroaryl group" refers to an aromatic ring system including one, two, three, or four hetero atoms selected from N, O, P, or S. When the unsubstituted $C_2$-$C_{60}$ heteroaryl group has two or more of rings, the rings may be fused or linked to each other by a single bond. Examples of the unsubstituted $C_2$-$C_{60}$ heteroaryl group include a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazol group, an indolyl group, a quinolyl group, an isoquinolyl group, and a dibenzothiophene group. In addition, To provide a substituted $C_2$-$C_{60}$ heteroaryl group at least one hydrogen atom of the unsubstituted $C_2$-$C_{60}$ heteroaryl group may be substituted with a substituent described above with respect to the substituted $C_1$-$C_{60}$ alkyl group.

The unsubstituted $C_6$-$C_{60}$ aryloxy group is a group represented by —$OA_1$, wherein $A_1$ is a $C_6$-$C_{60}$ aryl group. An example of the unsubstituted $C_6$-$C_{60}$ aryloxy group is a phenoxy group. To provide a substituted $C_6$-$C_{60}$ aryloxy group, at least one hydrogen atom of the unsubstituted $C_6$-$C_{60}$ aryloxy group may be substituted with a substituent described above with respect to the substituted $C_1$-$C_{60}$ alkyl group.

The unsubstituted $C_6$-$C_{60}$ arylthio group is a group represented by —$SA_1$, wherein $A_1$ is a $C_6$-$C_{60}$ aryl group. Examples of the unsubstituted $C_6$-$C_{60}$ arylthio group include a benzenethio group and a naphthylthio group. To provide a substituted $C_6$-$C_{60}$ arylthio group, at least one hydrogen atom of the unsubstituted $C_6$-$C_{60}$ arylthio group may be substituted with a substituent described above with respect to the substituted $C_1$-$C_{60}$ alkyl group.

The term "unsubstituted $C_6$-$C_{60}$ condensed polycyclic group" used herein refers to a substituent including at least two rings, wherein at least one aromatic ring and/or at least one non-aromatic ring are fused to each other, or refers to a substituent having an unsaturated group in a ring that may not form a conjugated structure. Thus, the unsubstituted $C_6$-$C_{60}$ condensed polycyclic group is distinct from an aryl group or a heteroaryl group in terms of being non-aromatic. To provide a substituted $C_6$-$C_{60}$ condensed polycyclic group, at least one hydrogen atom of the unsubstituted $C_6$-$C_{60}$ condensed polycyclic group may be substituted with a substituent described above with respect to the substituted $C_1$-$C_{60}$ alkyl group.

According to another aspect, an organic-light emitting diode (OLED) includes a first electrode, a second electrode; and an organic layer that is disposed between the first electrode and the second electrode.

The organic layer may include at least one layer selected from a hole injection layer (HIL), a hole transport layer (HTL), a functional layer having both hole injection and hole transport capabilities (hereinafter, referred as a "H-functional layer"), a buffer layer, an electron blocking layer (EBL), an emission layer (EML), a hole blocking layer (HBL), an electron transport layer (ETL), an electron injection layer (EIL), and a functional layer having both electron injection and electron transport capabilities (hereinafter, referred as an "E-functional layer").

In some implementations, the OLED may include an EIL, an ETL, an EML, a HIL, a HTL, or a H-functional layer having both hole injection and hole transport capabilities, wherein the EML further includes an anthracene-based compound, an arylamine-based compound, or a styryl-based compound.

In some implementations, the OLED may include an EIL, an ETL, an EML, a HIL, a HTL, or a H-functional layer having both hole injection and hole transport capabilities, wherein at least one layer of a red EML, a green EML, a blue EML, and a white EML of the EML includes a phosphorescent compound, and the HIL, the HTL, or the H-functional layer having both hole injection and hole transport capabilities includes a charge-generating material. The charge-generating material may be a p-dopant. As examples, the p-dopant may be a quinone derivative, a metal oxide, or a cyano group-containing compound.

In some implementations, the organic layer may include an ETL, which may include an electron-transporting organic compound and a metal complex. The metal complex may be a lithium (Li) complex.

The term "organic layer" used herein refers to a single layer and/or a multi-layer disposed between the first electrode and the second electrode of the OLED.

FIG. 1 illustrates a schematic view of a structure of an OLED according to an embodiment. Hereinafter, a structure and a manufacturing method of an OLED according to an embodiment will be described in detail with reference to FIG. 1.

A substrate (not illustrated), may be any suitable substrate for use in an OLED. For example, the substrate may be a glass substrate or a transparent plastic substrate with excellent mechanical strength, thermal stability, transparency, surface smoothness, ease of handling, and water resistance.

The first electrode may be formed by depositing or sputtering a first electrode-forming material on the substrate. When the first electrode is an anode, a material having a high work function may be used as the first electrode-forming material to facilitate hole injection. The first electrode may be a reflective electrode or a transmission electrode. The first electrode may be formed as a reflective electrode using magnesium (Mg), aluminum (Al), aluminum-lithium (Al—Li), calcium (Ca), magnesium-indium (Mg—In), or magnesium-silver (Mg—Ag).

The first electrode may have a single-layer structure or a multi-layer structure including at least two layers. For example, the first electrode may have a three-layered structure of ITO/Ag/ITO.

An organic layer may be disposed on the first electrode.

An organic layer may include a HIL, a HTL, a buffer layer (not illustrated), an EML, an ETL, or an EIL.

An HIL may be formed on the first electrode by a suitable method, such as vacuum deposition, spin coating, casting, or Langmuir-Blodgett (LB) deposition.

When the HIL is formed using vacuum deposition, the vacuum deposition conditions may vary according to the compound that is used to form the HIL, and the desired structure and thermal properties of the HIL to be formed. For example, the vacuum deposition may be performed at a temperature of about 100° C. to about 500° C., a pressure of about $10^{-8}$ torr to about $10^{-3}$ torr, and a deposition rate of about 0.01 Å/sec to about 100 Å/sec.

When the HIL is formed using spin coating, the coating conditions may vary according to the compound that is used to form the HIL, and the desired structure and thermal properties of the HIL to be formed. For example, the coating rate may be in a range from about 2,000 rpm to about 5,000 rpm, and a temperature at which heat treatment is performed to remove a solvent after coating may be in a range from about 80° C. to about 200° C.

The HIL may be formed of any suitable material that is commonly used to form a HIL Examples of the material that can be used to form the HIL include N,N'-diphenyl-N,N'-bis-[4-(phenyl-m-tolyl-amino)-phenyl]-biphenyl-4,4'-diamine, (DNTPD), a phthalocyanine compound such as copper phthalocyanine, 4,4',4"-tris(3-methylphenylphenylamino)triphenylamine (m-MTDATA), N,N'-di(1-naphthyl)-N,N'-diphenylbenzidine (NPB), TDATA, 2T-NATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), and polyaniline)/poly(4-styrenesulfonate (PANI/PSS):

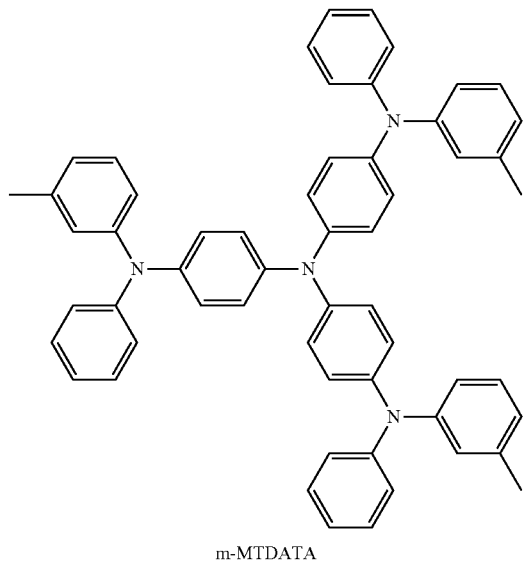

m-MTDATA

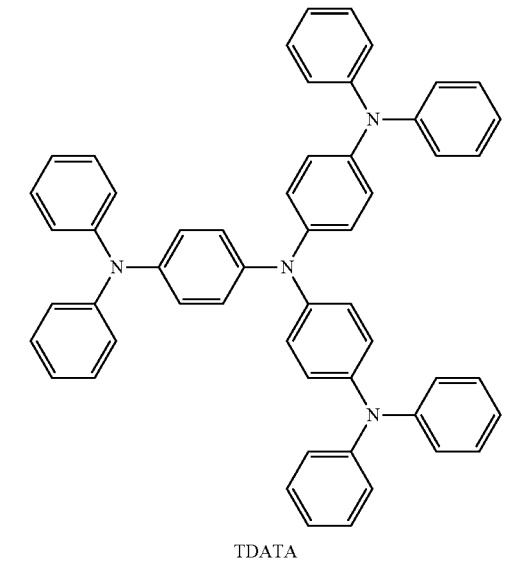

TDATA

-continued

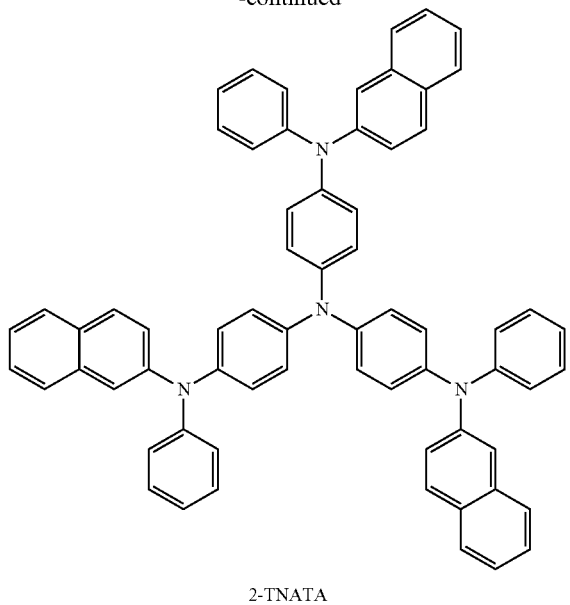

2-TNATA

A thickness of the HIL may be in a range from about 100 Å to about 10,000 Å, for example, from about 100 Å to about 1,000 Å. When the thickness of the HIL is within the above ranges, the HIL may have satisfactory hole injecting capabilities without a substantial increase in a driving voltage.

Then, an HTL may be formed on the HIL by using a method, such as vacuum deposition, spin coating, casting, or LB deposition. When the HTL is formed using vacuum deposition or spin coating, the deposition and coating conditions may be similar to those for the formation of the HIL, although the deposition and coating conditions may vary according to a compound that is used to form the HTL.

The HTL may be formed of any suitable hole-transporting materials. Examples of suitable hole-transporting materials include a carbazole derivative such as N-phenylcarbazole or polyvinylcarbazole, N,N'-bis(3-methylphenyl)-N,N'-diphenyl-[1,1-biphenyl]-4,4'-diamine (TPD), 4,4',4''-tris(N-carbazolyl)triphenylamine) (TCTA), and N,N'-di(1-naphthyl)-N,N'-diphenylbenzidine (NPB):

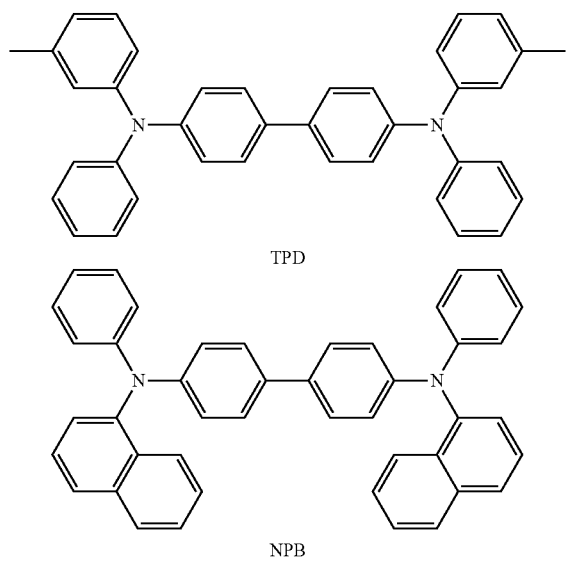

TPD

NPB

A thickness of the HTL may be in a range from about 50 Å to about 2,000 Å, for example, from about 100 Å to about 1,500 Å. When the thickness of the HTL is within the above ranges, the HTL may have satisfactory hole transporting capabilities without a substantial increase in a driving voltage.

The H-functional layer (having both hole injection and hole transport capabilities) may include at least one material selected from the above-described materials for the HIL and the HTL. A thickness of the H-functional layer may be in a range from about 500 Å to about 10,000 Å, for example, from about 100 Å to about 1,000 Å. When the thickness of the H-functional layer is within the above ranges, the H-functional layer may have satisfactory hole injecting and transporting capabilities without a substantial increase in a driving voltage.

In some other embodiments, at least one layer of the HIL, the HTL, and the H-functional layer may include at least one of the compounds represented by Formulas 300 and 350 below:

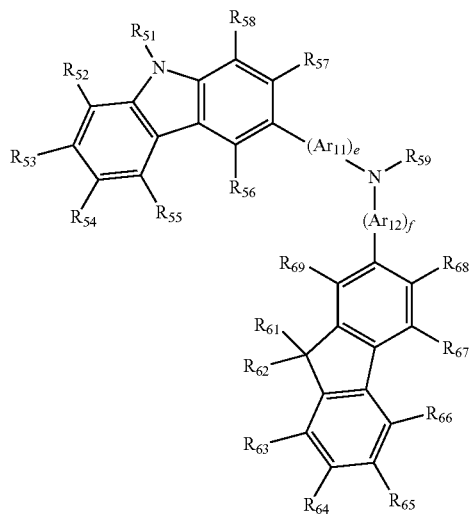

<Formula 300>

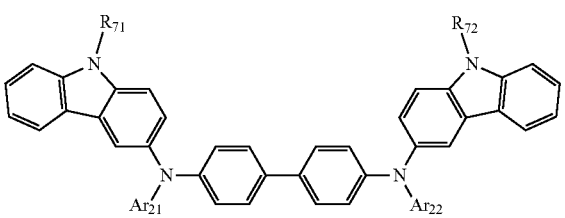

<Formula 350>

In Formulas 300 and 350, $Ar_{11}$ and $Ar_{12}$ may each independently be a substituted or unsubstituted $C_5$-$C_{60}$ arylene group, and $Ar_{21}$, and $Ar_{22}$ may each independently be a substituted or unsubstituted $C_5$-$C_{60}$ aryl group.

In Formula 300, e and f in Formula 300 may each independently be an integer from 0 to 5, for example, 0, 1, or 2. In some implementations, e may be 1 and f may be 0, as examples.

In Formulas 300 and 350, $R_{51}$ to $R_{58}$, $R_{61}$ to $R_{69}$, $R_{71}$, and $R_{72}$ may each independently be a hydrogen atom, a deuterium atom a halogen atom, a hydroxyl group, a cyano group, a nitro group, an amino group, an amidino group, a hydrazine, a hydrazone, a carboxyl group or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_5$-$C_{60}$ aryl group, a substituted or unsubstituted $C_5$-$C_{60}$ aryloxy group, or a substituted or unsubstituted $C_5$-$C_{60}$ arylthio group.

For example, $R_{51}$ to $R_{58}$, $R_{61}$ to $R_{69}$, $R_{71}$, and $R_{72}$ may each independently be a hydrogen atom; a deuterium atom; a halogen atom; a hydroxyl group; a cyano group; a nitro group; an amino group; an amidino group; a hydrazine; a hydrazone; a carboxyl group or a salt thereof;

- a sulfonic acid or a salt thereof; a phosphoric acid or a salt thereof; a $C_1$-$C_{10}$ alkyl group (i.e., a methyl group, an ethyl group, a propyl group, a butyl group, a pentyl group, and a hexyl group); a $C_1$-$C_{10}$ alkoxy group (i.e., a methoxy group, an ethoxy group, a propoxy group, a butoxy group, and a pentoxy group);
- a $C_1$-$C_{10}$ alkyl group and a $C_1$-$C_{10}$ alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid or a salt thereof, and a phosphoric acid or a salt thereof;
- a phenyl group; a naphthyl group; an anthryl group; a fluorenyl group; a pyrenyl group; and
- a phenyl group, a naphthyl group, an anthryl group, a fluorenyl group, and a pyrenyl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid or a salt thereof, a phosphoric acid or a salt thereof, a $C_1$-$C_{10}$ alkyl group, and a $C_1$-$C_{10}$ alkoxy group, but are not limited thereto.

In Formula 300, $R_{59}$ may be a phenyl group; a naphthyl group; an anthryl group; a biphenyl group; or a pyridyl group. The phenyl group, naphthyl group, anthryl group, biphenyl group, or a pyridyl group may be substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid or a salt thereof, a phosphoric acid or a salt thereof, a substituted or unsubstituted $C_1$-$C_{20}$ alkyl group, and a substituted or unsubstituted $C_1$-$C_{20}$ alkoxy group.

In some implementations, the compound of Formula 300 may be a compound represented by Formula 300A below, as an example:

<Formula 300A>

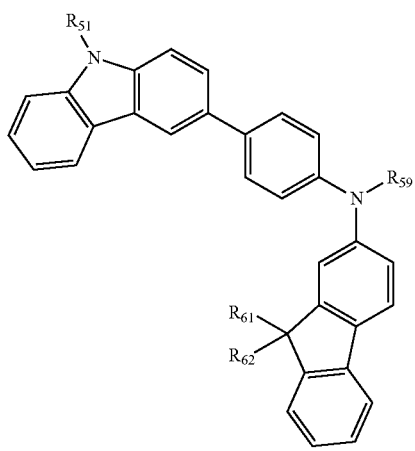

In Formula 300A, $R_{51}$, $R_{61}$, $R_{62}$, and $R_{59}$ may be as defined above.

For example, at least one layer of the HIL, HTL, and H-functional layer may include at least one of Compounds 301 to 320:

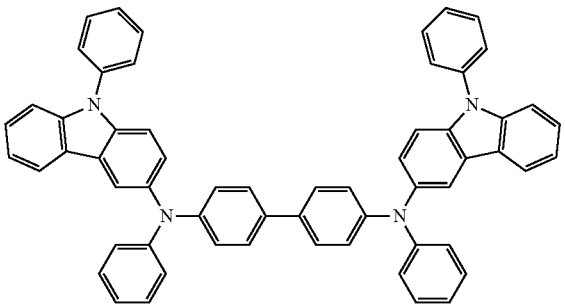

301

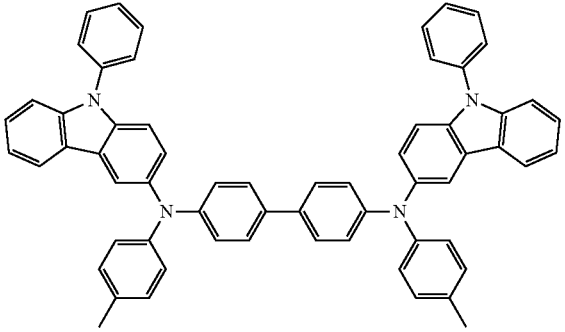

302

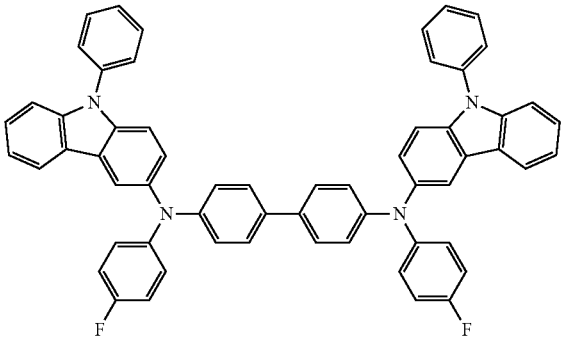

303

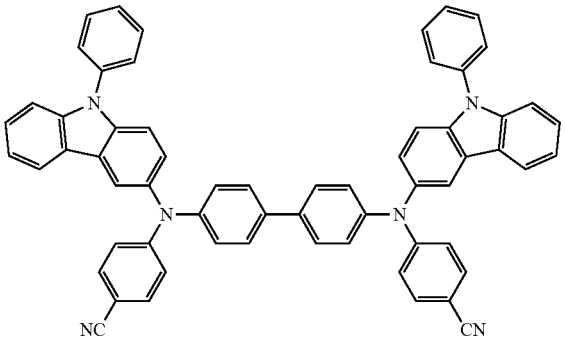

304

305
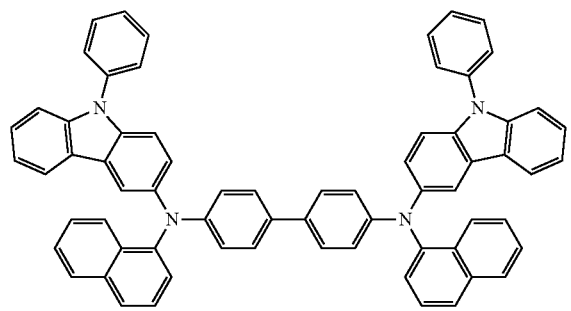
306
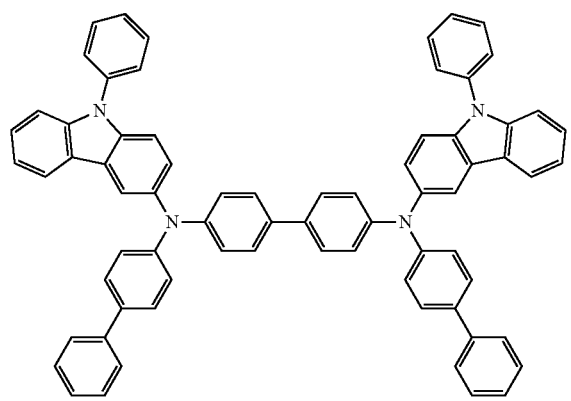
307
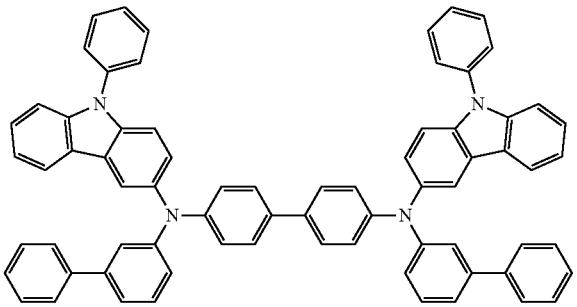
308
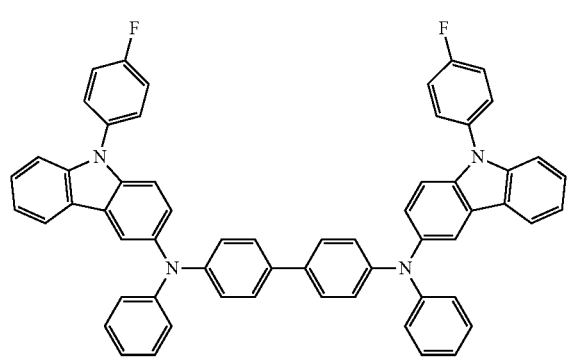
309
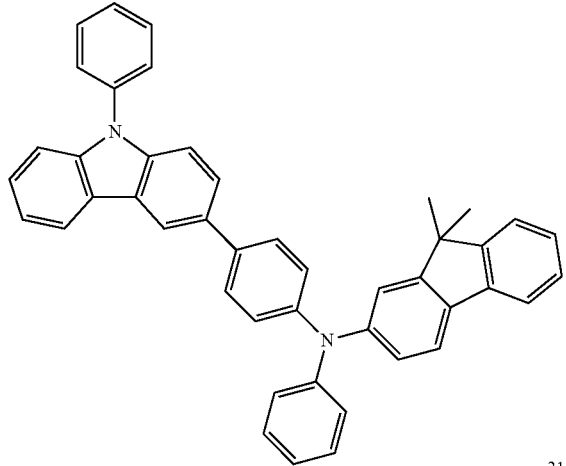
310
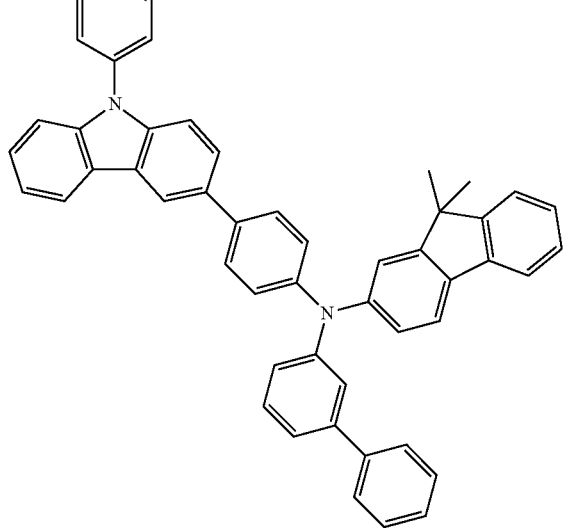
311
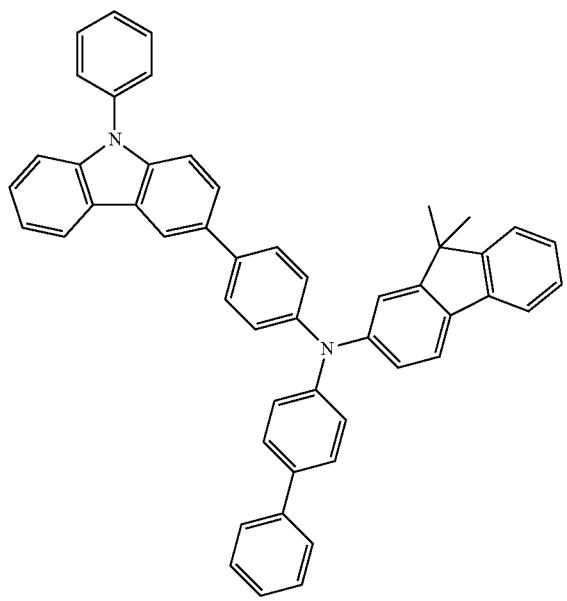

312
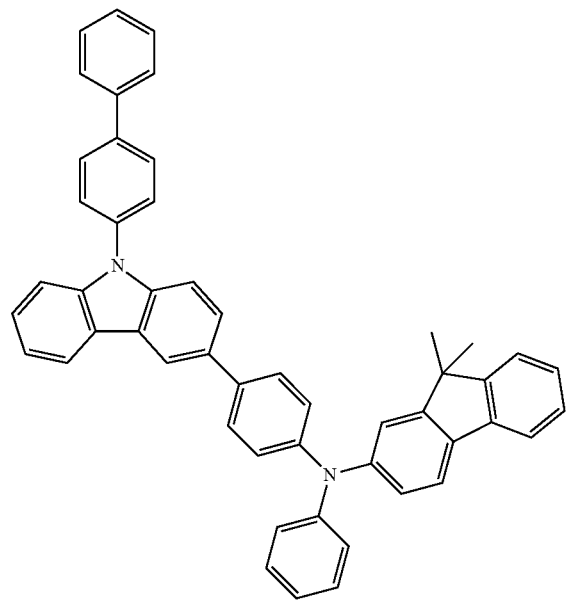
313
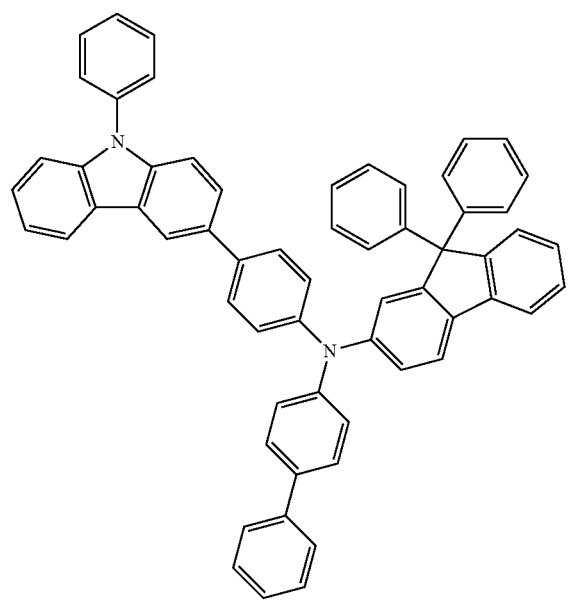
314
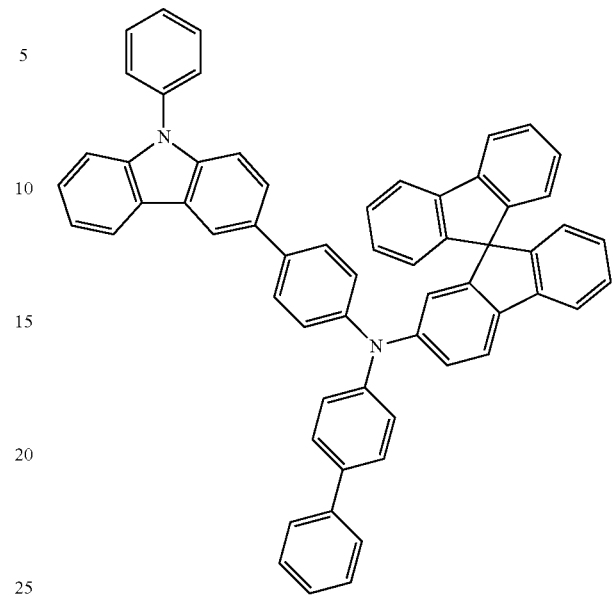
315

-continued

316
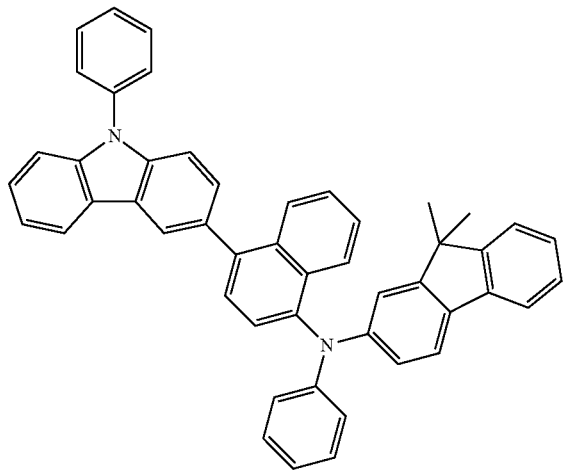

317
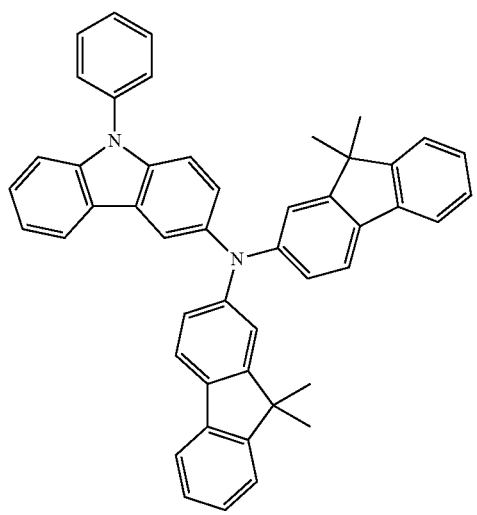

318
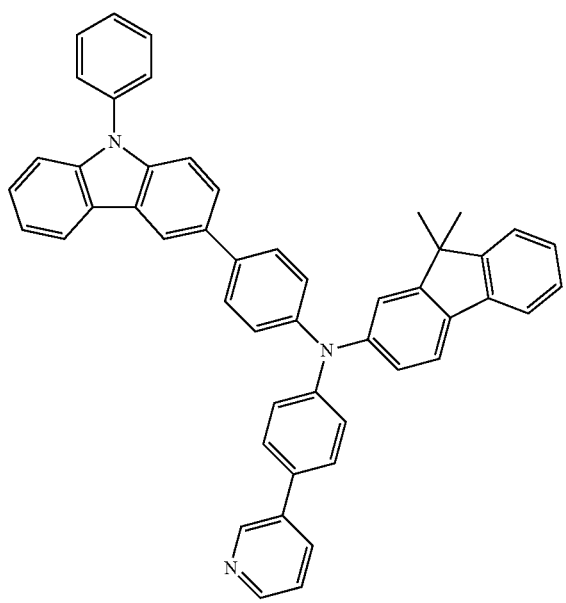

-continued

319
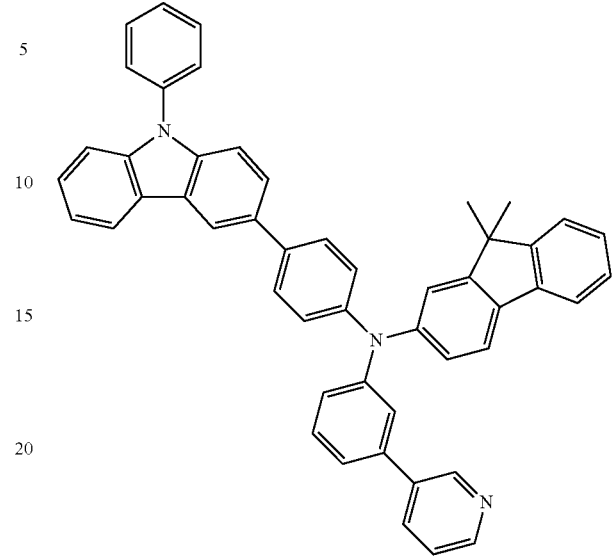

320
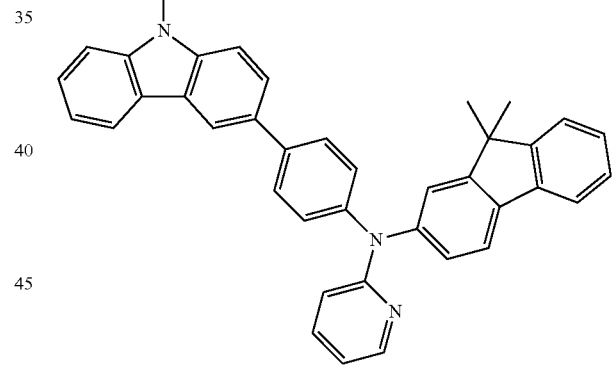

At least one layer of the HIL, HTL, and the H-functional layer may further include a charge-generating material to improve conductivity of a film, in addition to suitable hole-injecting materials, suitable hole-transporting materials, and/or suitable H-functional materials having both hole injection and hole transport capabilities The charge-generating material may be, for example, a p-dopant. The p-dopant may be one of a quinone derivative, a metal oxide, and a cyano group-containing group, as examples. For example, the p-dopant may be a quinone derivative such as tetracyanoquinodimethane (TCNQ) or 2,3, 5,6-tetrafluoro-tetracyano-1,4-benzoquinodimethane (F4-TCNQ); a metal oxide such as a tungsten oxide or a molybdenum oxide; or a cyano group-containing compound such as Compound 200 below:

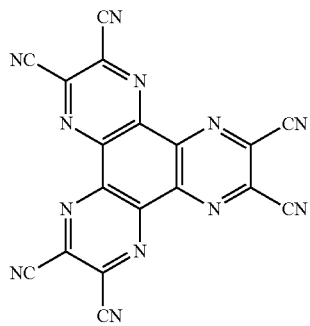

<Compound 200>

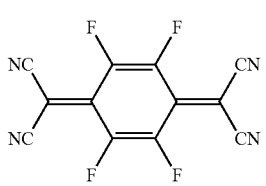

<F4-TCNQ>

When the HIL, the HTL, or the H-functional layer further includes the charge-generating material, the charge-generating material may be homogeneously dispersed or non-homogeneously distributed in the layers above.

A buffer layer may be disposed between at least one of the HIL, HTL, and the H-functional layer, and the EML. The buffer layer may compensate for an optical resonance distance of light according to a wavelength of the light emitted from the EML, and thus may increase efficiency. The buffer layer may include any suitable hole injecting material or hole transporting material. In some implementations, the buffer layer may include the same material as one of the materials included in the HIL, the HTL, and the H-functional layer that underlie the buffer layer.

An EML may be formed on the HIL, the H-functional layer, or the buffer layer by vacuum deposition, spin coating, casting, or LB deposition. When the EML is formed using vacuum deposition or spin coating, the deposition and coating conditions may be similar to those for the formation of the HIL, although the conditions for deposition and coating may vary depending on the material that is used to form the EML.

The EML may be formed using a suitable light-emitting material, for example, a host and a dopant. In regard to the dopant, both a fluorescent dopant and a phosphorescent dopant may be used.

Examples of the host include $Alq_3$, 4,4'-N,N'-dicarbazole-biphenyl (CBP), poly(n-vinylcarbazole) (PVK), 9,10-di (naphthylene-2-yl)anthracene (ADN), TCTA, 1,3,5-tris(N-phenylbenzimidazole-2-yl)benzene (TPBI), 3-tert-butyl-9,10-di(naphth-2-yl) anthracene (TBADN), E3, distyrylarylene (DSA), dmCBP (see Formula below), and Compounds 501 to 509 below.

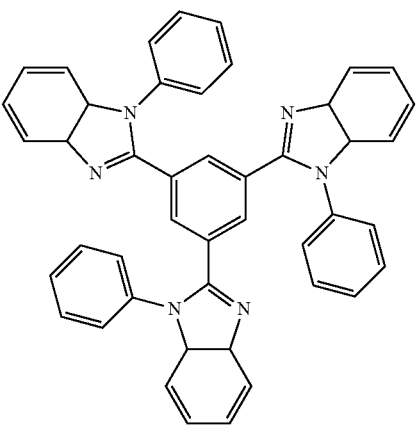

TPBI

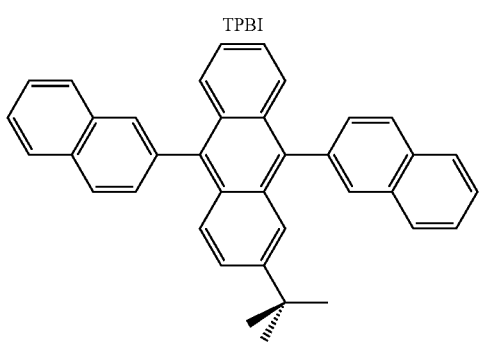

TBADN

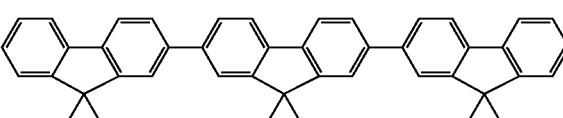

E3

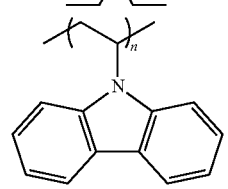

PVK

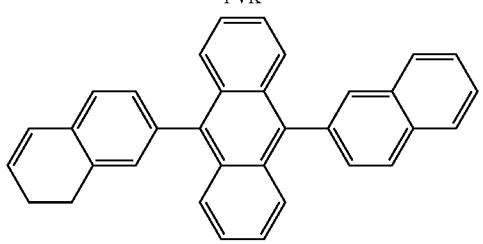

ADN

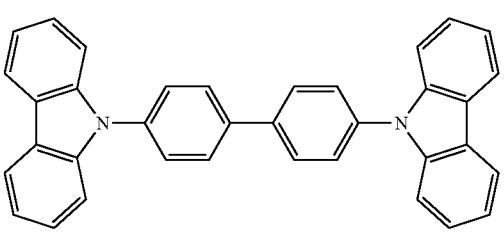

CDP

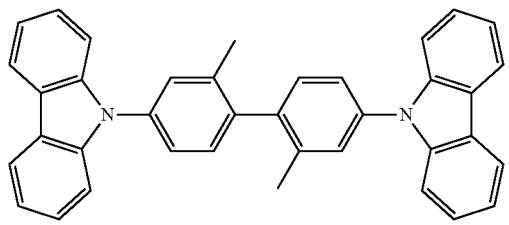
dmCBP
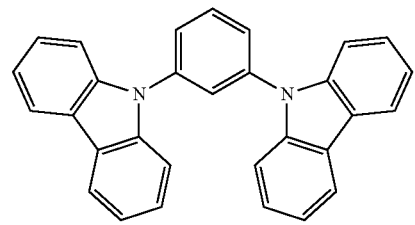
501
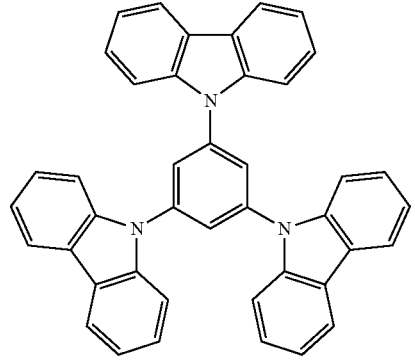
502
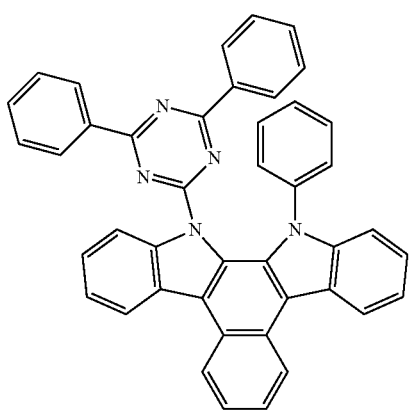
503
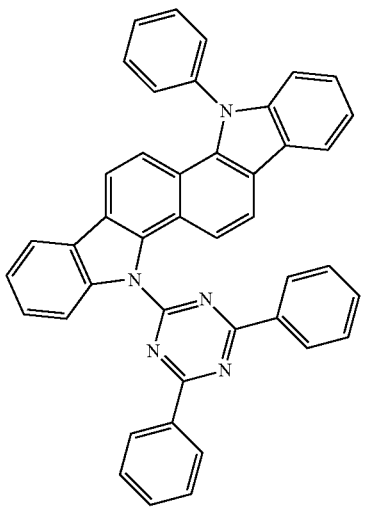
504
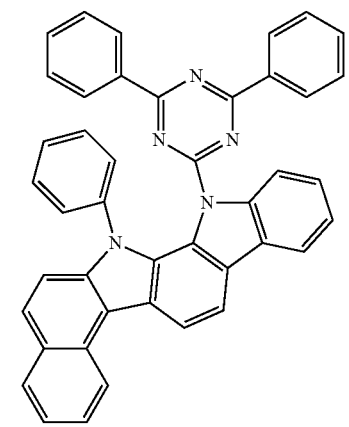
505
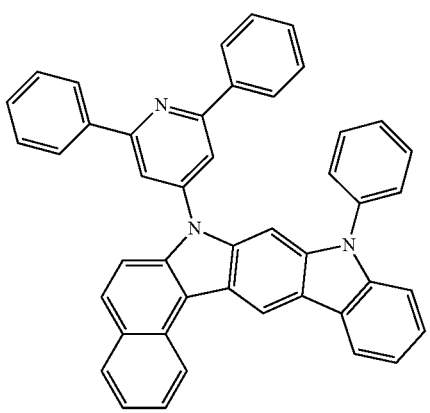
506

-continued

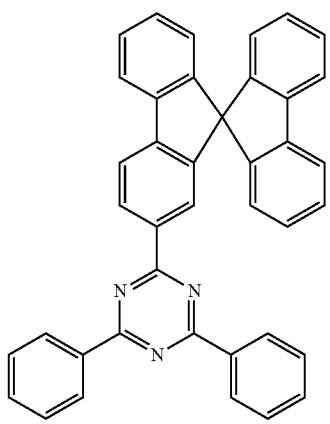

507

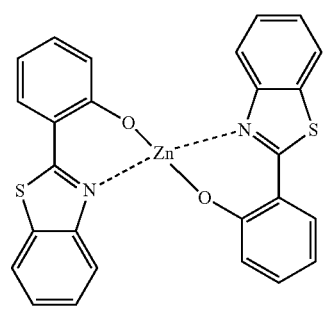

508

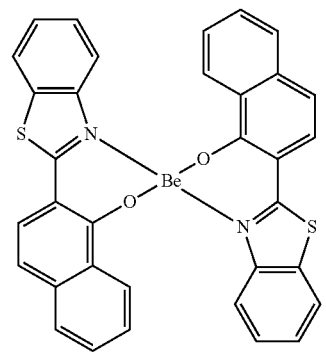

509

In some implementations, an anthracene-based compound represented by Formula 400 below may be used as the host:

<Formula 400>

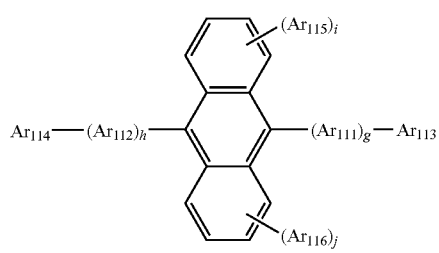

In Formula 400 above, $Ar_{111}$ and $Ar_{112}$ may each independently be a substituted or unsubstituted $C_5$-$C_{60}$ arylene group; $Ar_{113}$ to $Ar_{116}$ may be each independently a substituted or unsubstituted $C_1$-$C_{10}$ alkyl group or a substituted or unsubstituted $C_5$-$C_{60}$ aryl group; g, h, I, and j may be each independently an integer from 0 to 4.

In some implementations, in Formula 400 above, $Ar_{111}$ $Ar_{112}$ may each independently be a phenylene group, a naphthylene group, a phenanthrenylene group, a fluorenyl group or a pyrenylene group. The phenylene, naphthylene, phenanthrenylene, fluorenyl, or pyrenylene group may be unsubstituted or substituted with at least one of a phenyl group, a naphthyl group, or an anthryl group, as examples.

In Formula 400 above, g, h, i, and j may be each independently 0, 1, or 2.

In Formula 400 above, $Ar_{113}$ to $A_{r116}$ may be each independently a $C_1$-$C_{10}$ alkyl group substituted with at least one of a phenyl group, a naphthyl group, and an anthryl group; a phenyl group; a naphthyl group; an anthryl group; a pyrenyl group; a phenanthrenyl group; a fluorenyl group; a deuterium atom, a halogen atom, a hydroxyl group, a cyano group, a nitro group. The phenyl, naphthyl, anthryl, pyrenyl, phenanthrenyl, or fluorenyl group may be unsubstituted or may be substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a pyrenyl group, a phenanthrenyl group, and a fluorenyl group; and

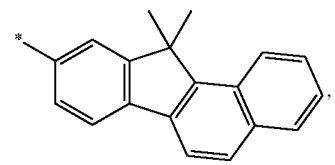

as examples.

For example, the anthracene-based compound of Formula 400 above may be one of the compounds represented by Formulas below:

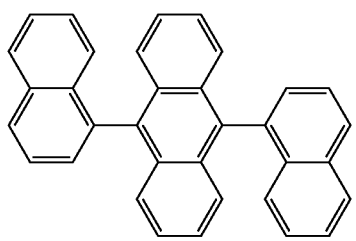

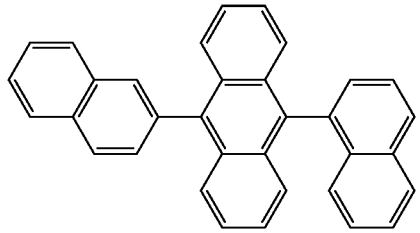

69
-continued
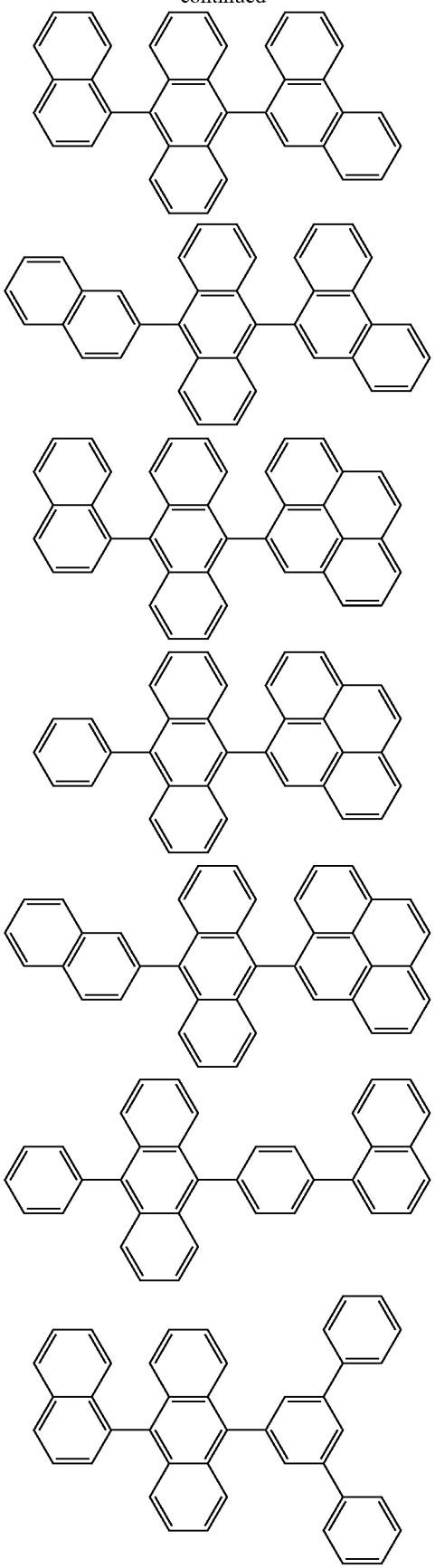
70
-continued
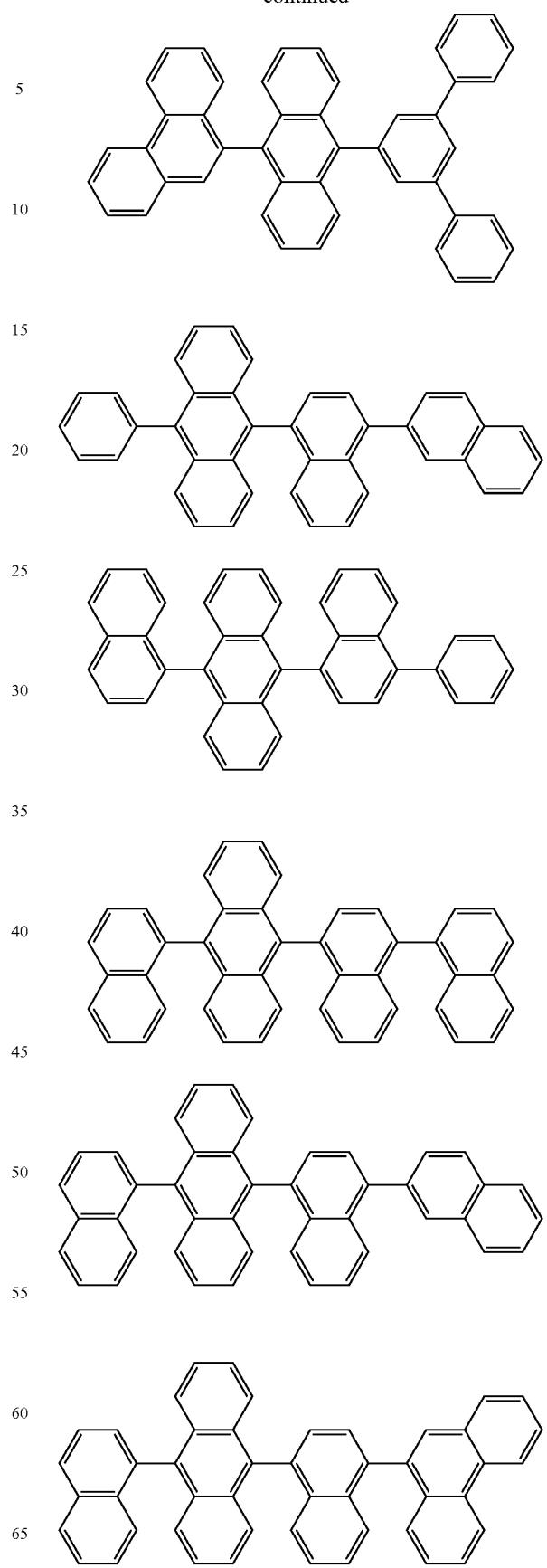

-continued
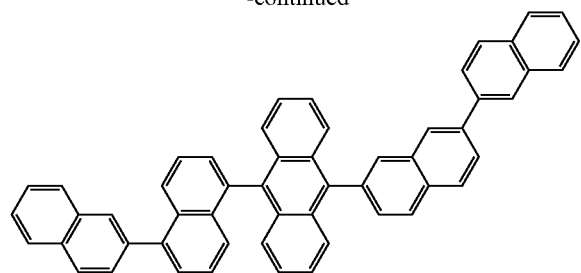
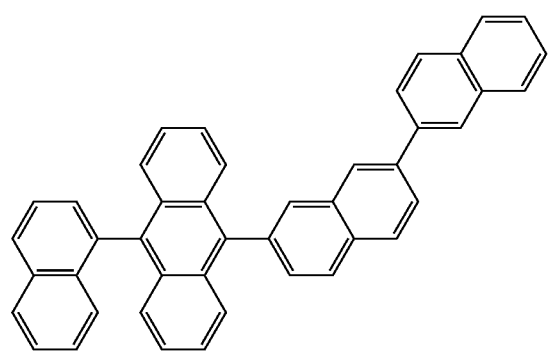
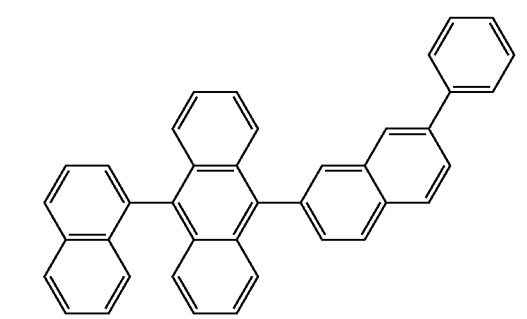
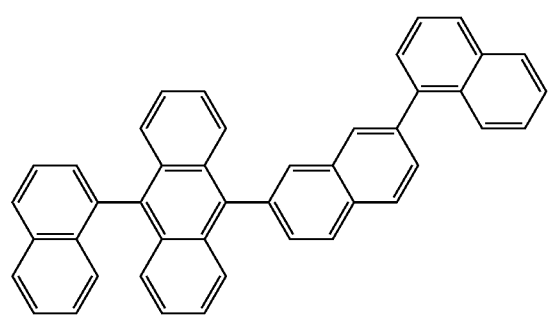
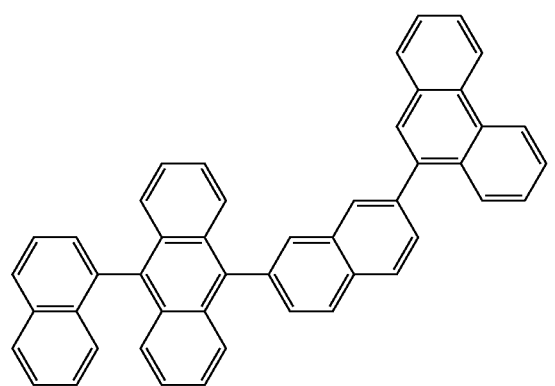
-continued
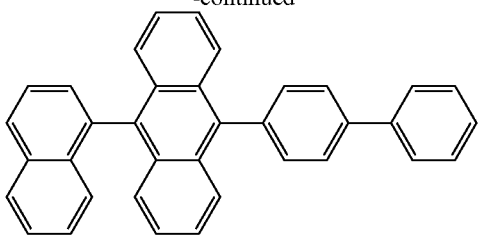
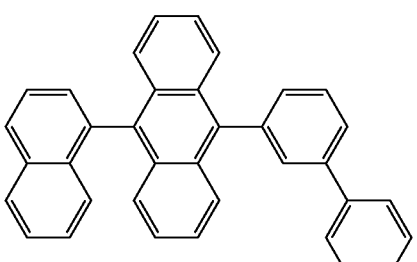
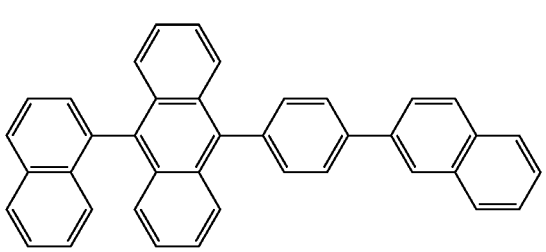
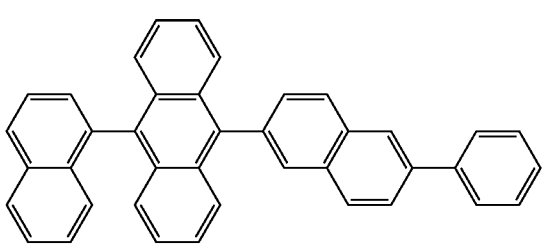
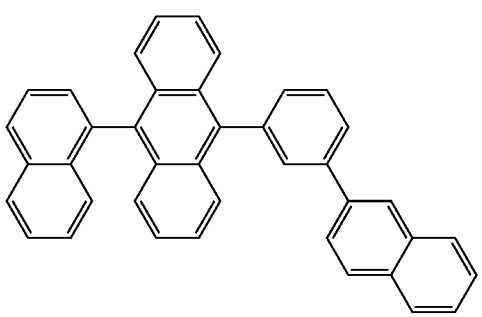
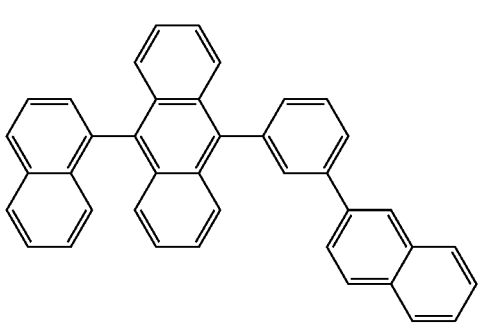

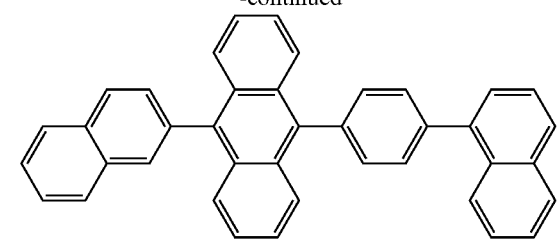

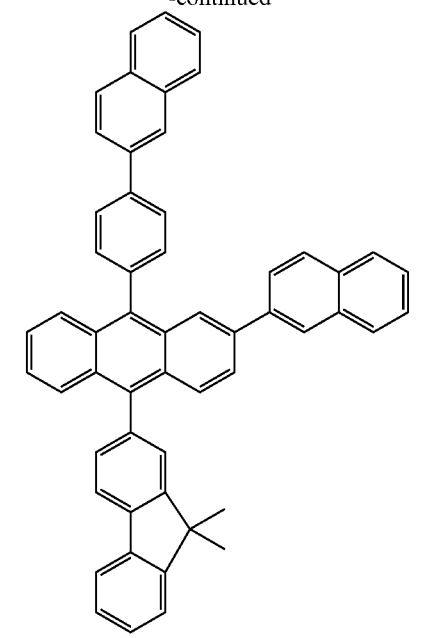
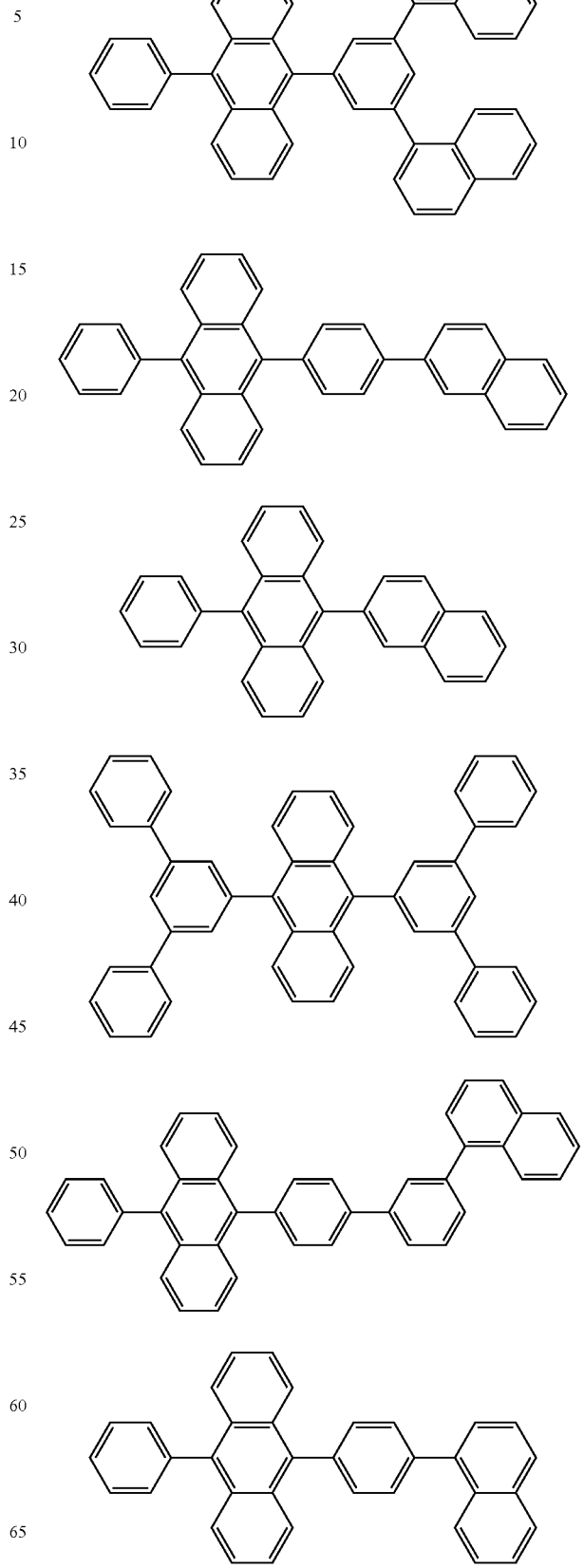

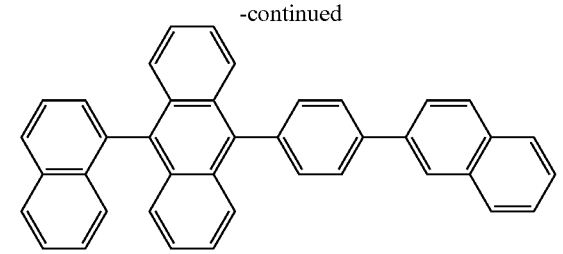

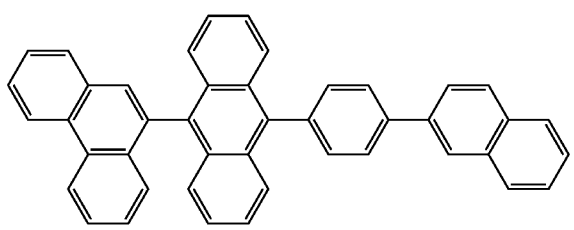

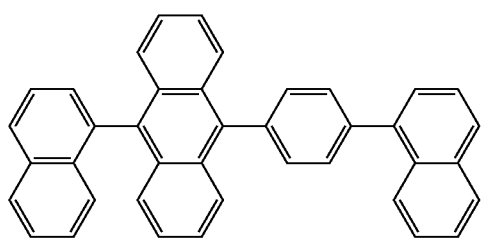

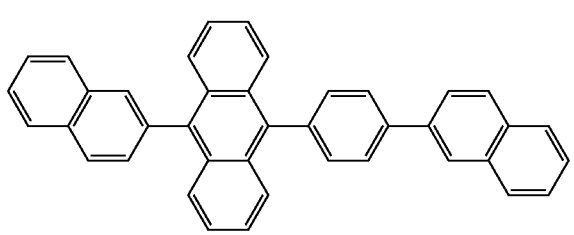

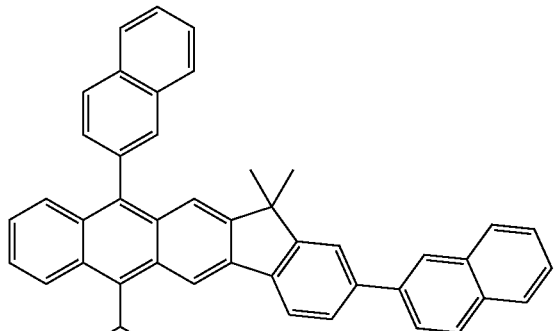

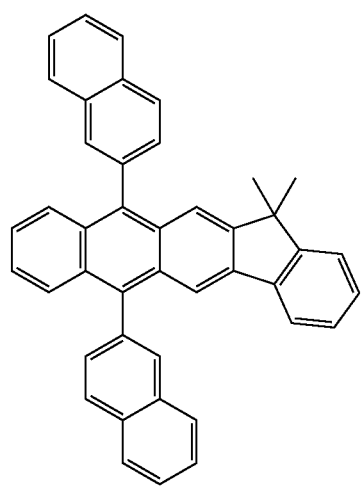

In some implementations, an anthracene-based compound represented by Formula 401 below may be used as the host:

<Formula 401>

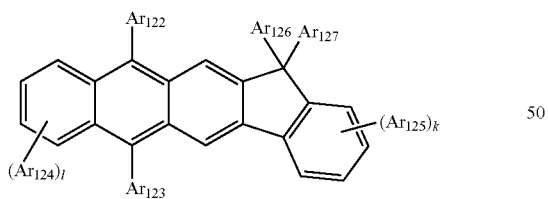

In Formula 401 above, $Ar_{122}$ to $Ar_{125}$ may be defined as described above in conjunction with Ar113 of Formula 400, and thus detailed descriptions thereof will not be repeated here.

In Formula 401 above, $Ar_{126}$ and $Ar_{127}$ may each independently be a $C_1$-$C_{10}$ alkyl group (i.e., a methyl group, an ethyl group, or a propyl group).

In Formula 401 above, k and l may each independently be an integer from 0 to 4, for example, 0, 1, or 2.

In some implementations, the anthracene compound of Formula 401 above may be one of the compounds represented by the Formulas below, as examples:

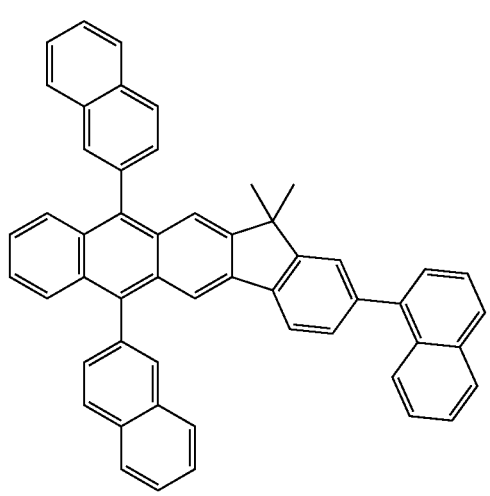

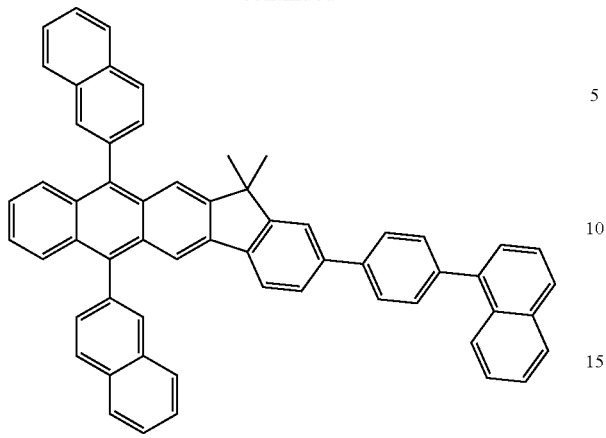

In some implementations, a compound represented by Formula 2 below may be used as the host:

<Formula 2>

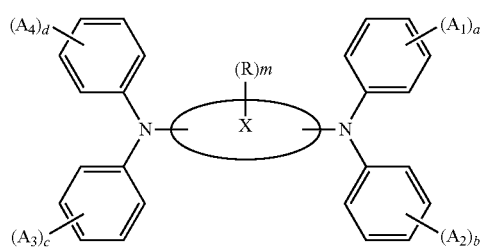

In Formula 2,
- $A_1$ to $A_4$ and R may each independently be a hydrogen atom, a deuterium atom, a cyano group, a halogen atom, a substituted or unsubstituted $C_1$-$C_{60}$ alkyl group, a substituted or unsubstituted $C_6$-$C_{60}$ aryl group, or a substituted or unsubstituted $C_3$-$C_{60}$ cycloalkyl group;
- X may be a substituted or unsubstituted $C_6$-$C_{60}$ arylene group or a substituted or unsubstituted $C_2$-$C_{60}$ heteroarylene group; and
- a, b, c, d, and m may be an integer from 1 to 10.

In Formula 2 above, X may be a substituted or unsubstituted pyrene group, a substituted or unsubstituted anthracenyl group, a substituted or unsubstituted phenanthroline group, a substituted or unsubstituted benzopyrene group, a substituted or unsubstituted phenalene group, or a substituted or unsubstituted chrysenyl group.

In Formula 1 above, $A_1$ to $A_4$ and R may be each independently a hydrogen atom, a deuterium atom, a halogen atom, or a substituted or unsubstituted $C_1$-$C_{20}$ alkyl group.

In greater detail, the compound of Formula 2 may be one of compounds represented by Formulas below:

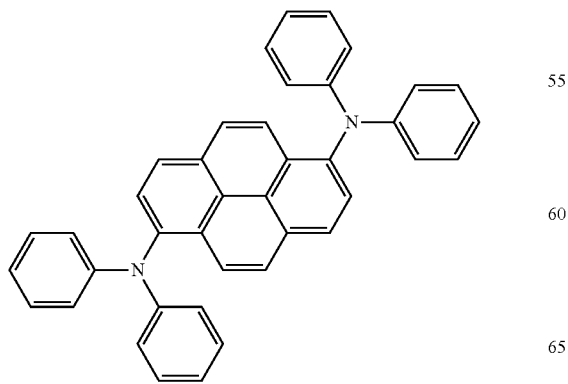

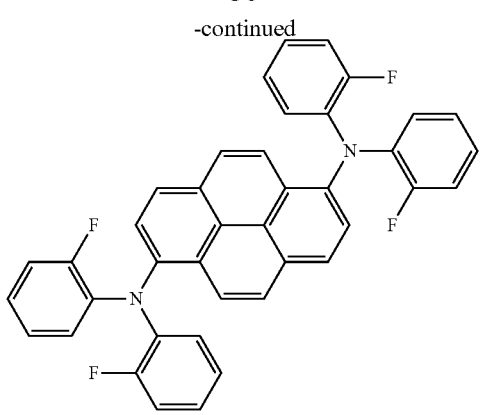

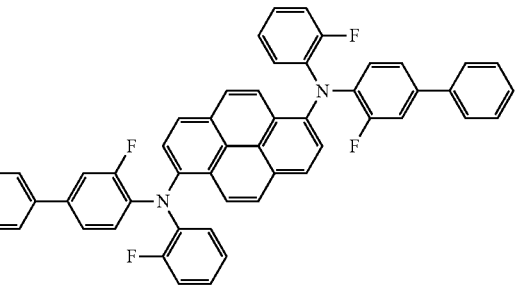

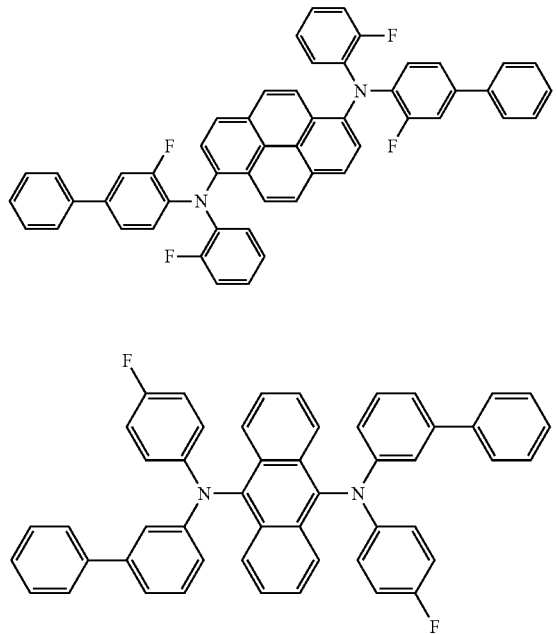

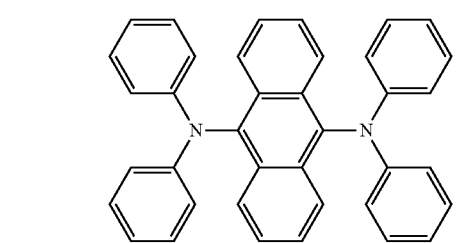

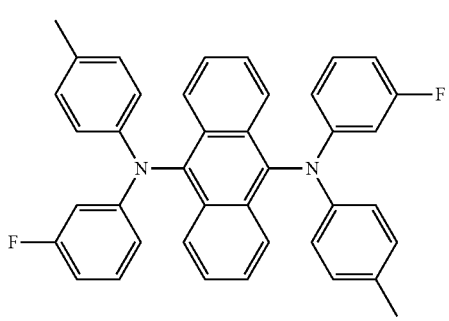

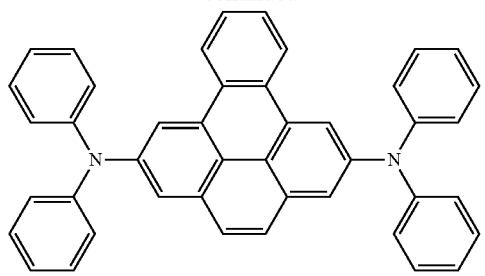
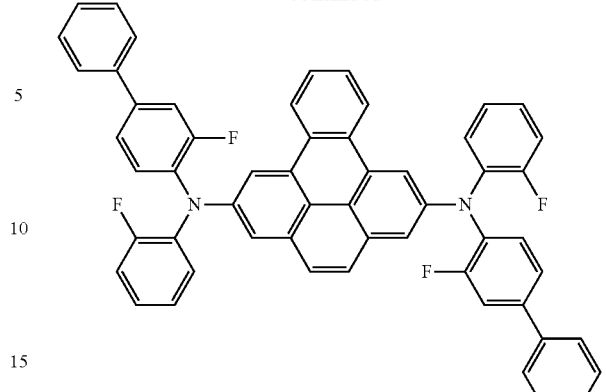
When the OLED is a full color OLED, the EML may be patterned into a red EML, a green EML, and a blue EML.
At least one layer of the red EML, the green EML, and the blue EML may include one of the dopants below (ppy=phenylpyridine).
Examples of the blue dopant include compounds represented by the following formulas:
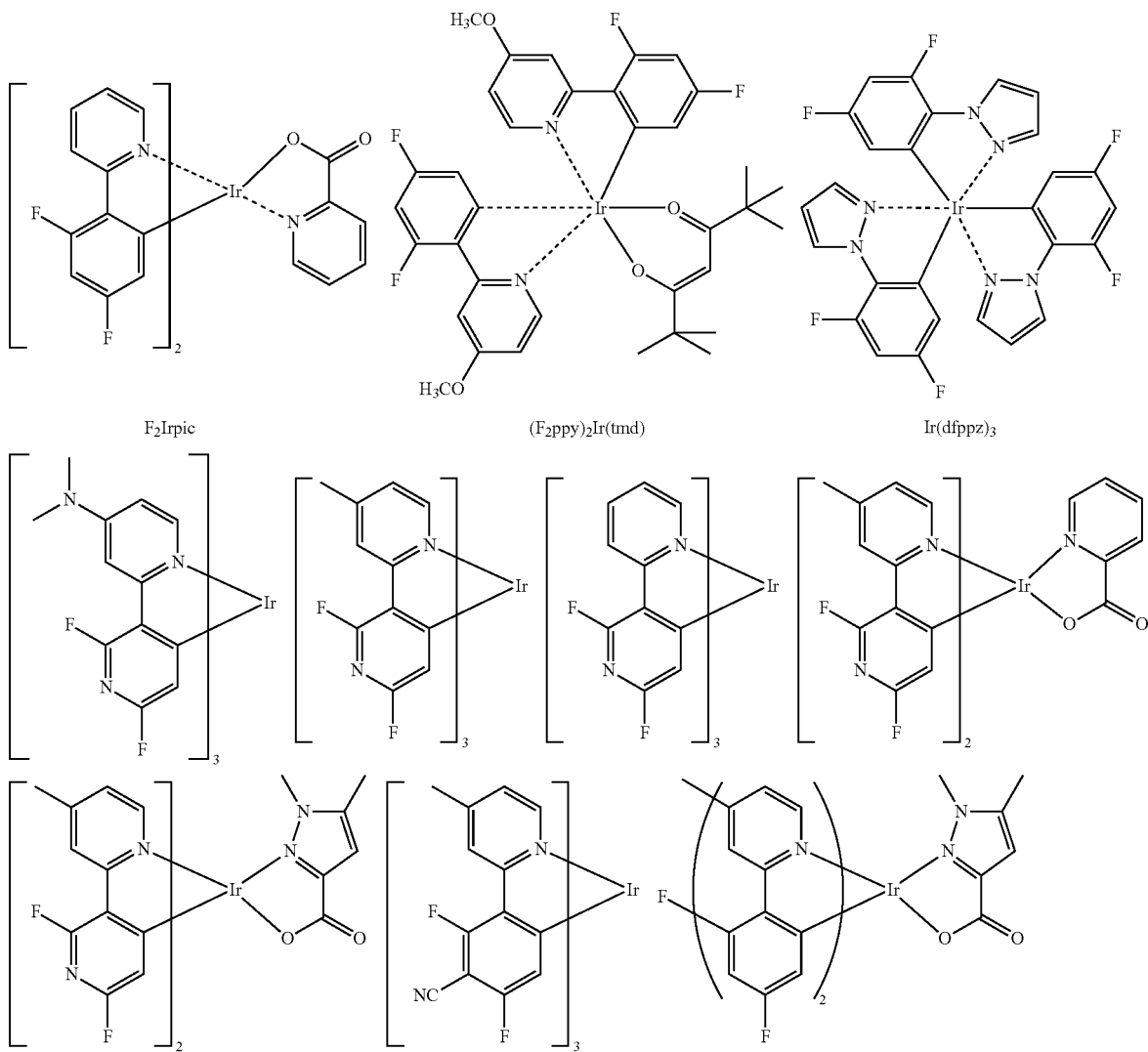

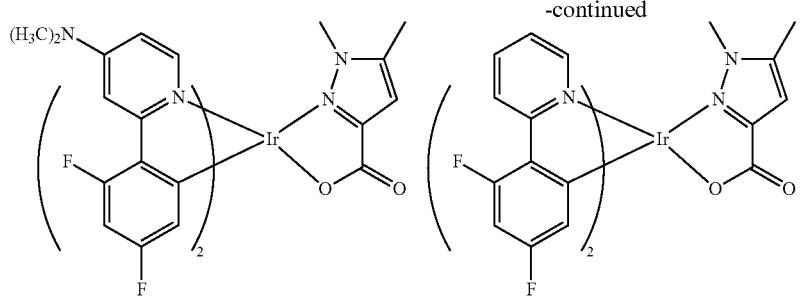
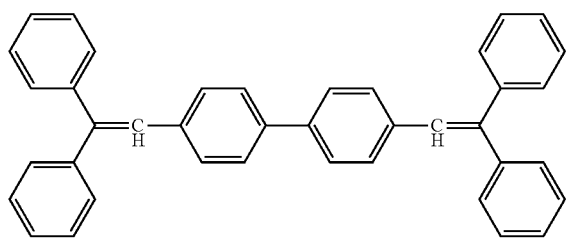
DPVBi
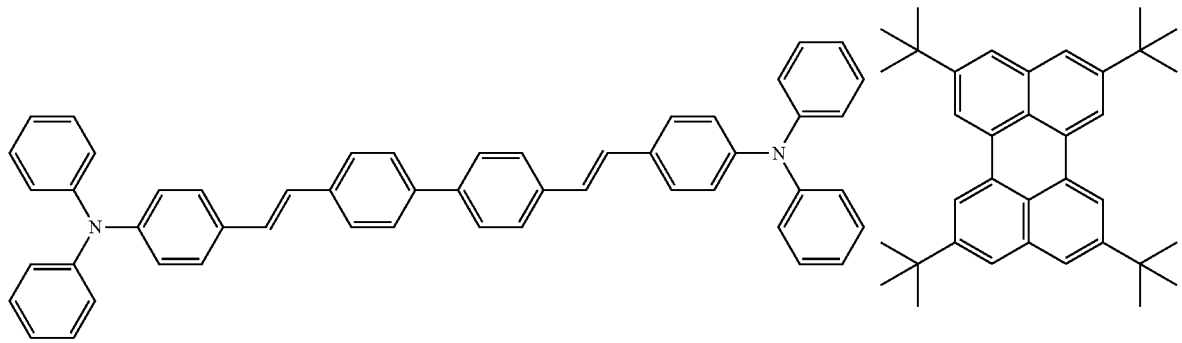
DPAVBi                                                        TBPe
Examples of the red dopant include compounds represented by the following formulas:
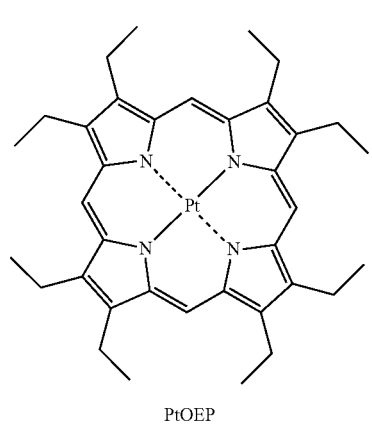
PtOEP
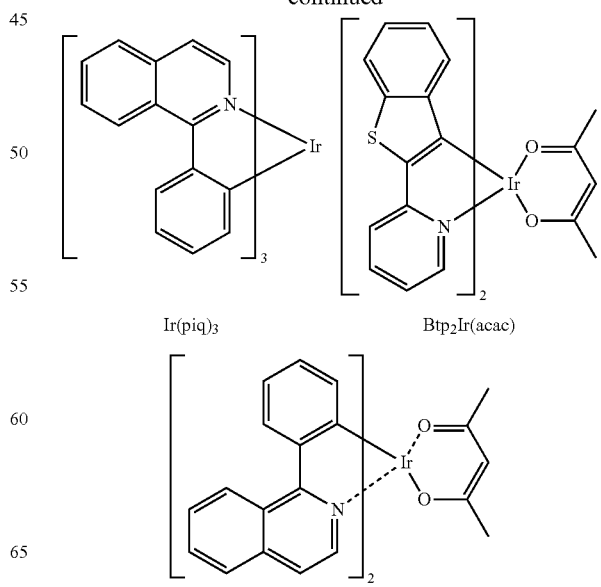
Ir(piq)₃             Btp₂Ir(acac)

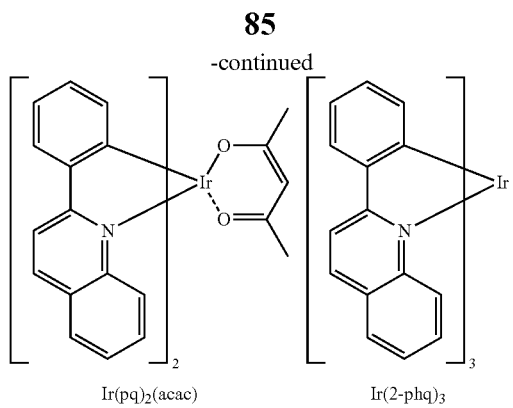
Ir(pq)₂(acac)　　Ir(2-phq)₃
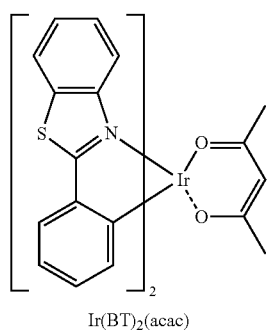
Ir(BT)₂(acac)
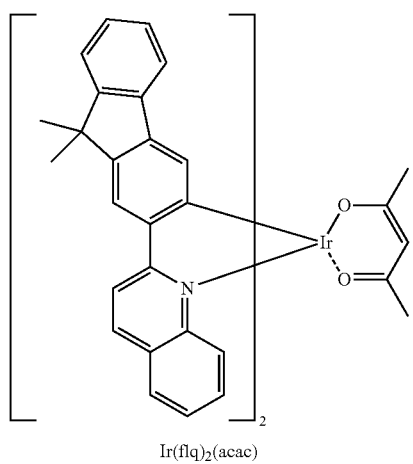
Ir(flq)₂(acac)
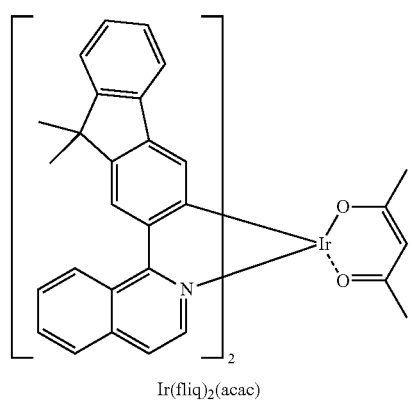
Ir(fliq)₂(acac)
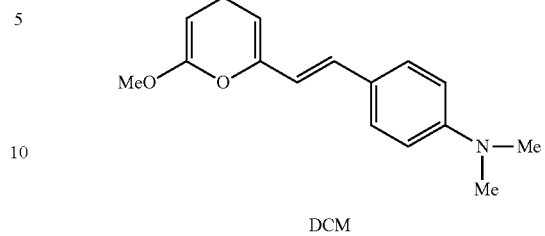
DCM
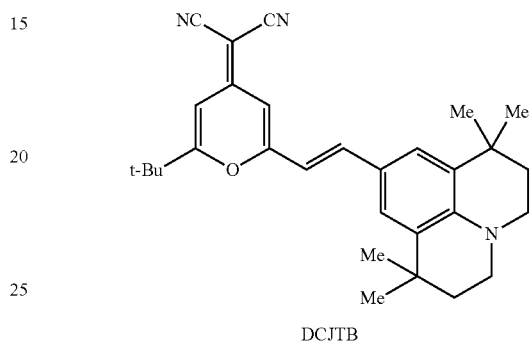
DCJTB
Examples of the green dopant include compounds represented by the following formulas:
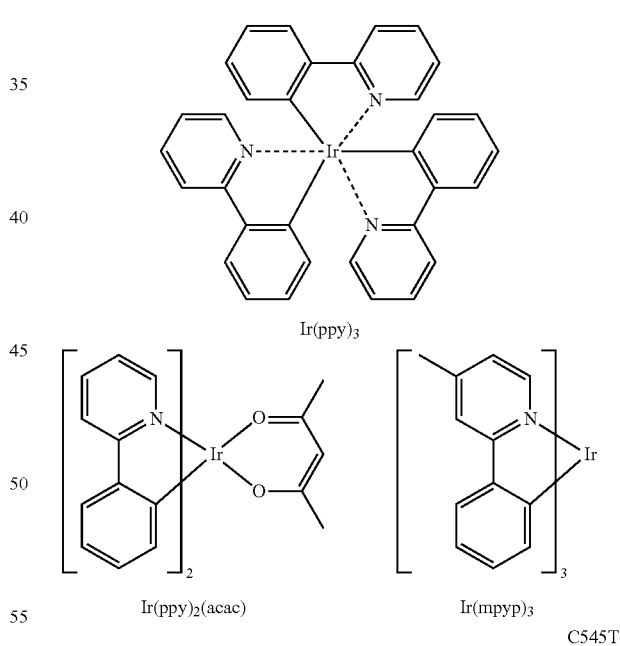
Ir(ppy)₃
Ir(ppy)₂(acac)　　Ir(mpyp)₃
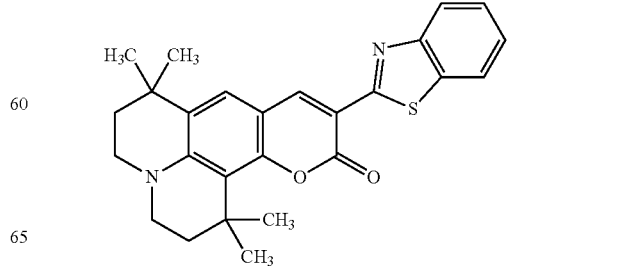
C545T Examples of dopants that may be used in the EML include Pd complexes or Pt-complexes represented by Formulas below:
D1
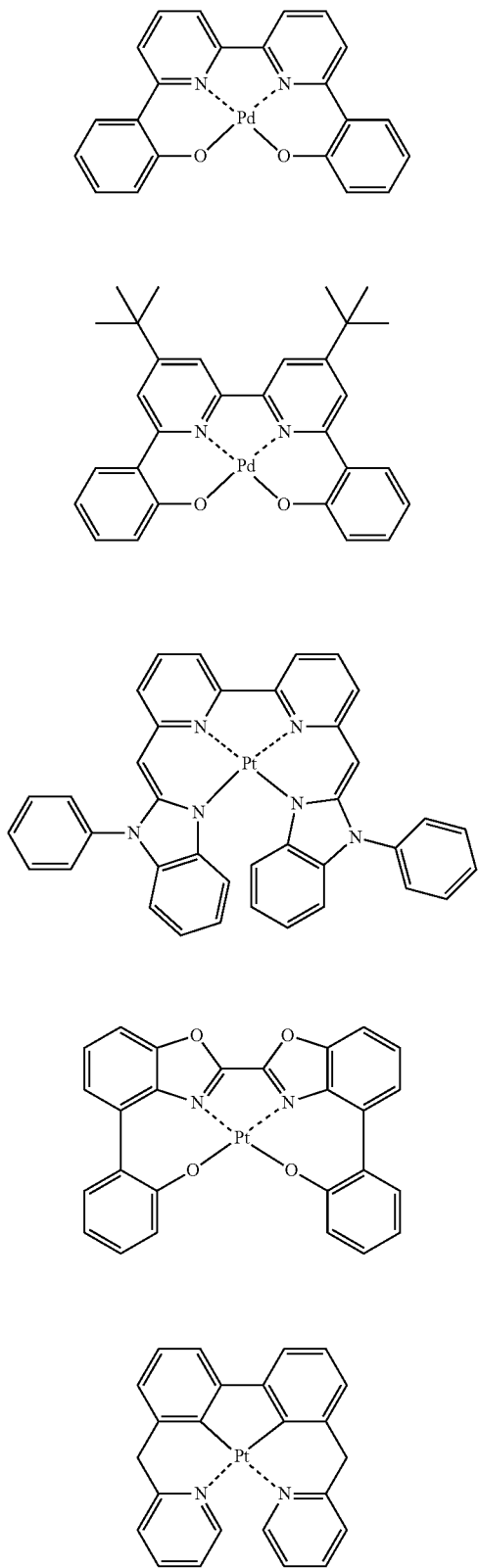
D2
D3
D4
D5
D6
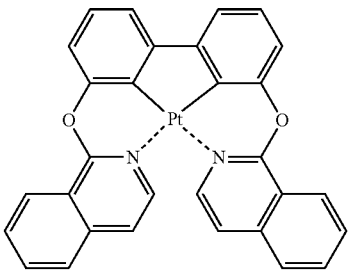
D7
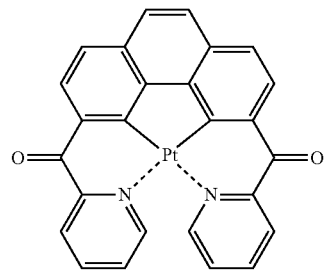
D8
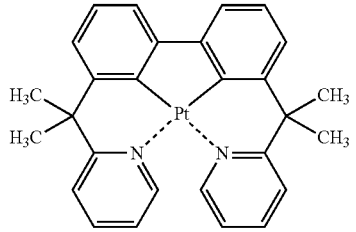
D9
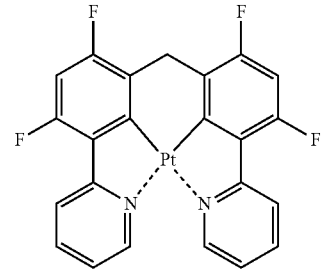
D10
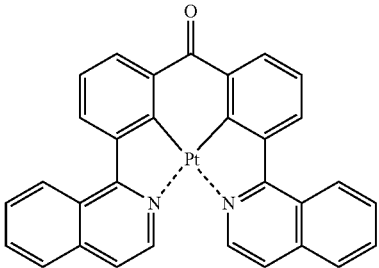
D11
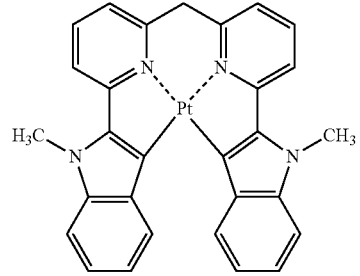

-continued
D12
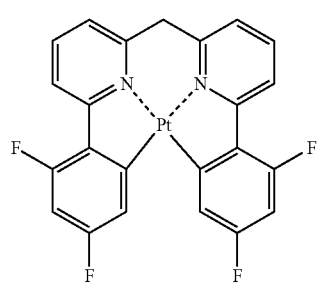
D13
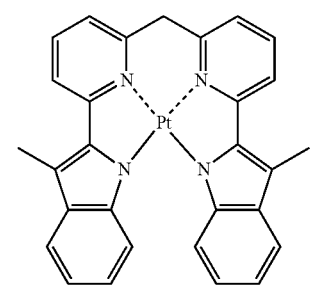
D14
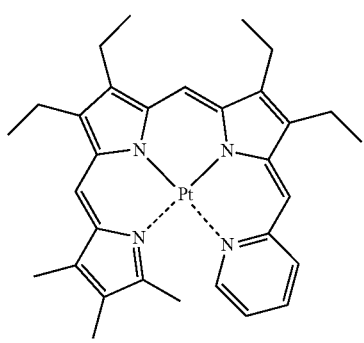
D15
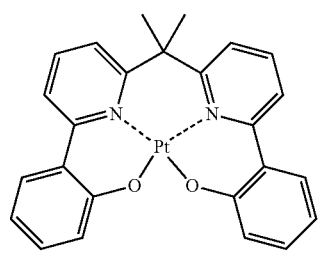
D16
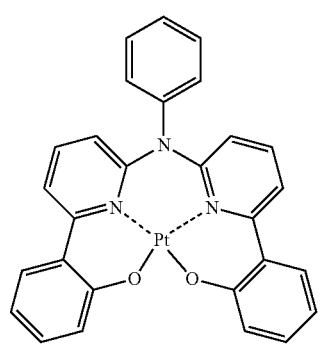
-continued
D17
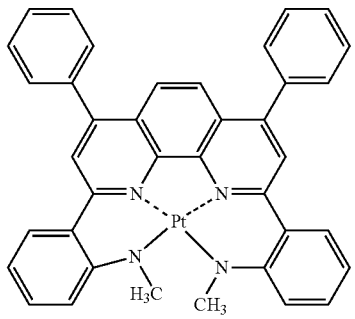
D18
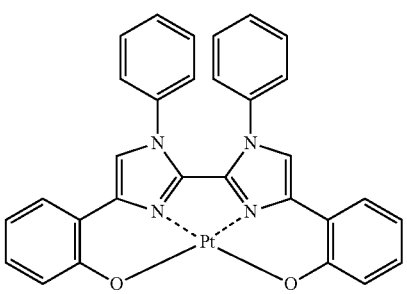
D19
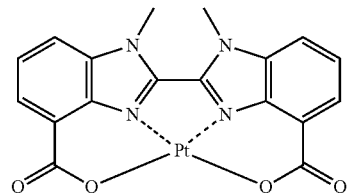
D20
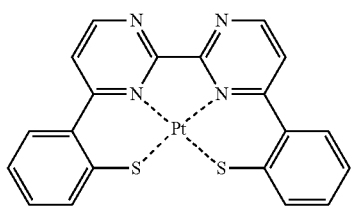
D21
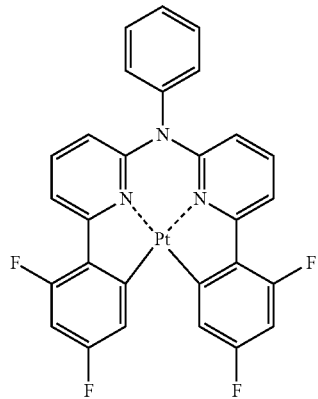

| | |
|---|---|
| D22 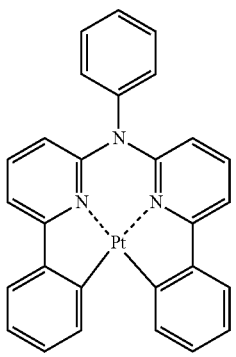 | D27 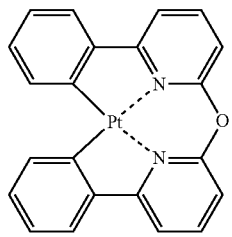 |
| D23 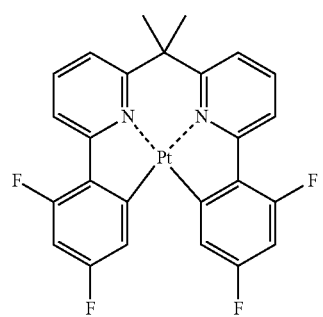 | D28 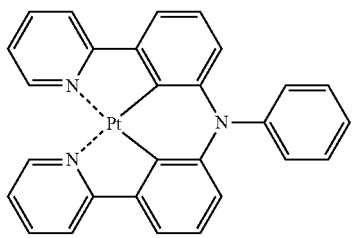 |
| | D29 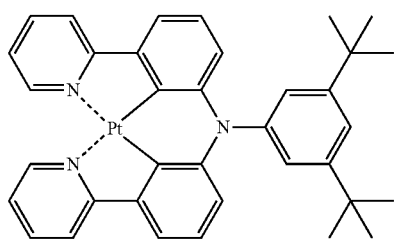 |
| D24 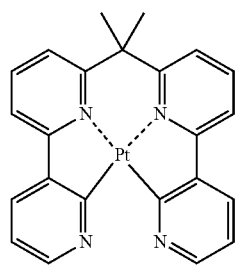 | D30 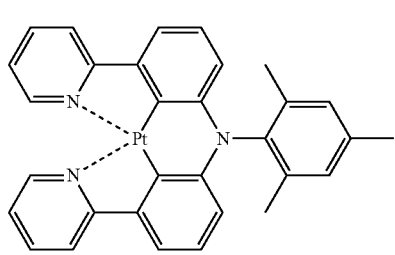 |
| D25 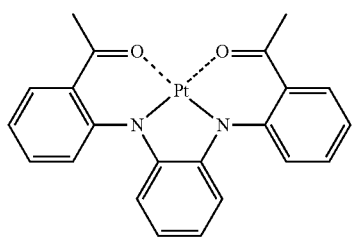 | D31 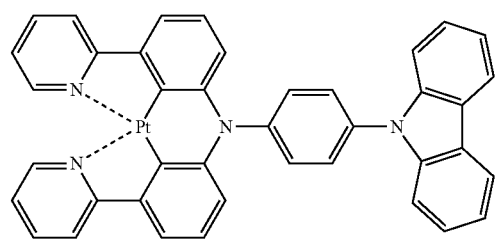 |
| D26 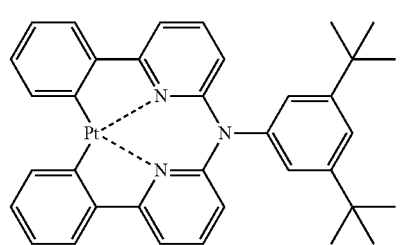 | D32 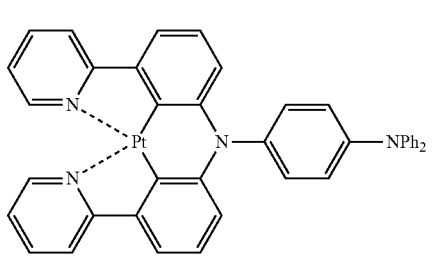 |

D33 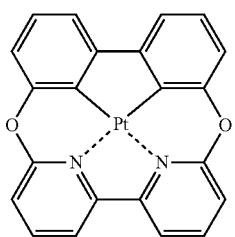
D34 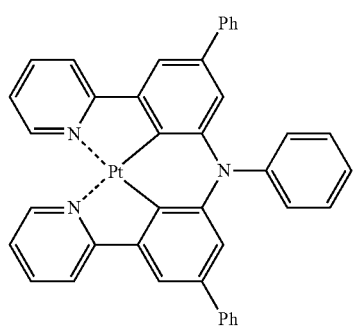
D35 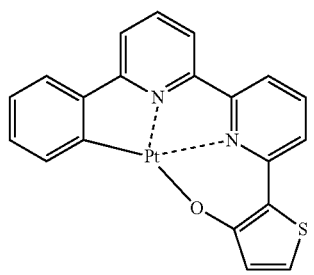
D36 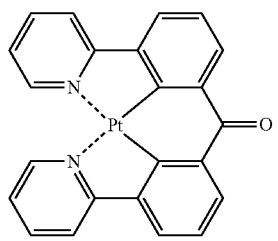
D37 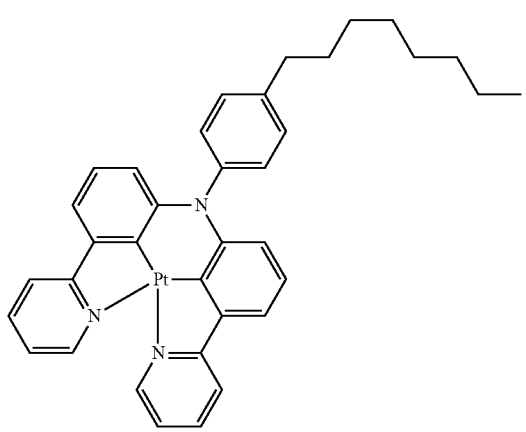
D38 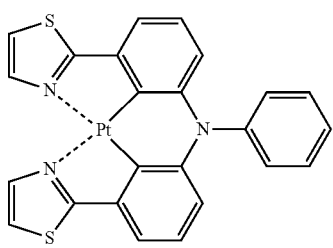
39 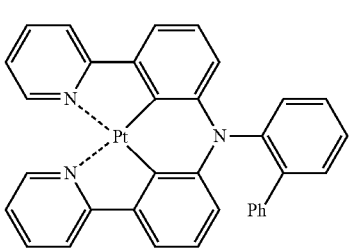
D40 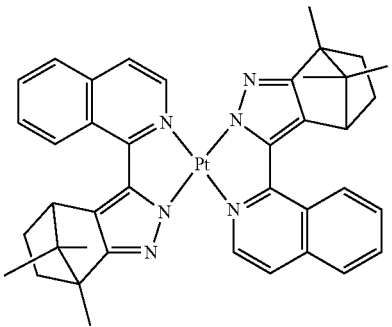
D41 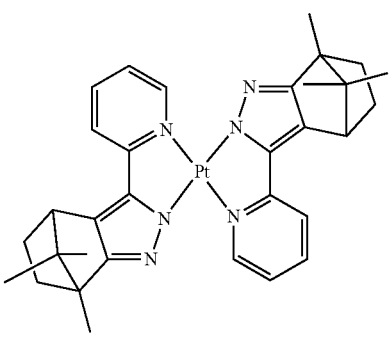
D42 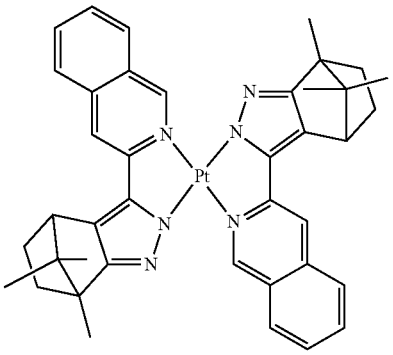

D43 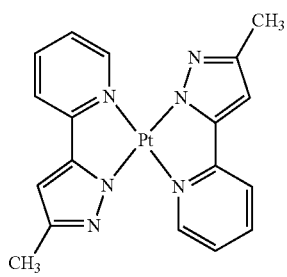
D44 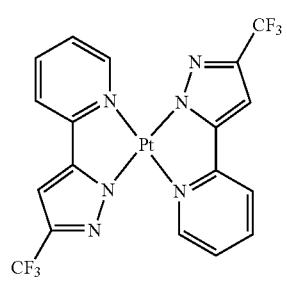
D45 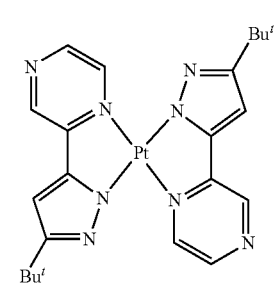
D46 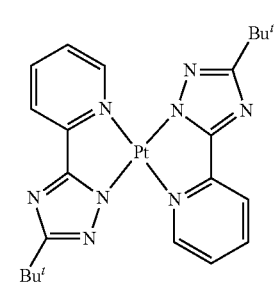
D47 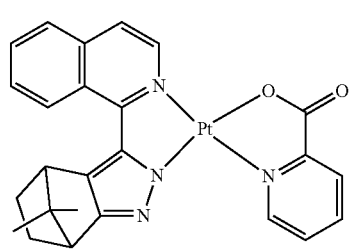
D48 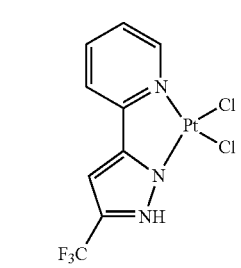
D49 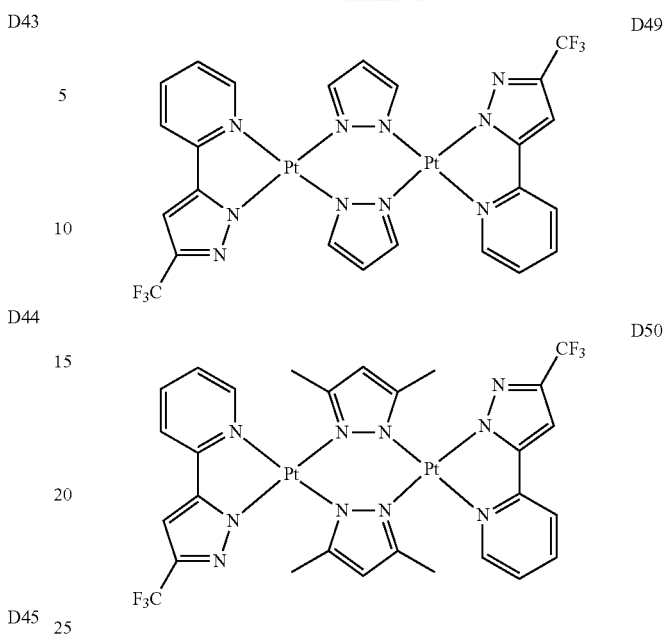
D50
Examples of dopants that may be used in the EML include Os-complexes represented by the following formulas:
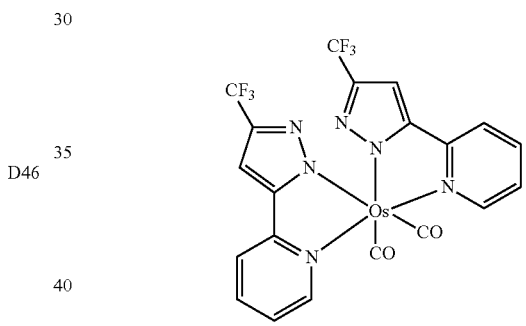
Os(fppz)₂(CO)₂
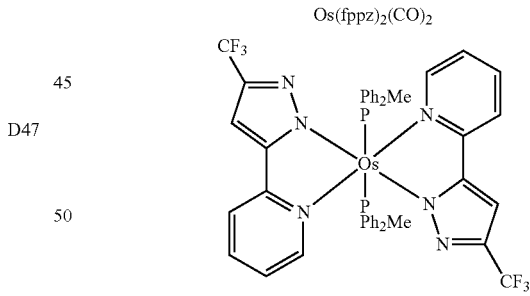
Os(fppz)₂(PPh₂Me)₂
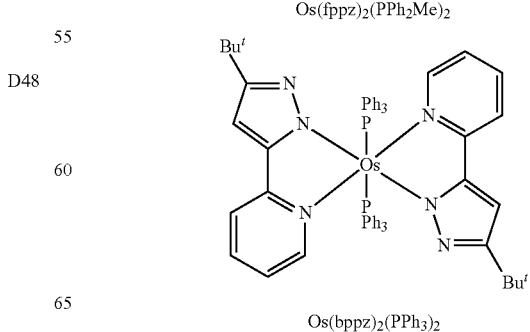
Os(bppz)₂(PPh₃)₂

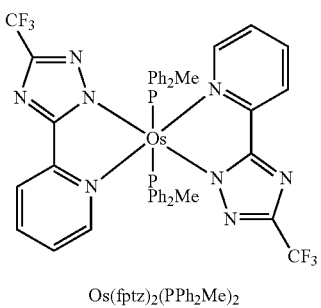

Os(fptz)₂(PPh₂Me)₂

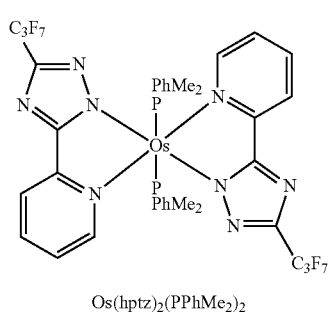

Os(hptz)₂(PPhMe₂)₂

When the EML includes a host and a dopant, an amount of the dopant may be in a range from about 0.01 to about 15 parts by weight based on 100 parts by weight of the host, as an example.

A thickness of the EML may be in a range from about 100 Å to about 1,000 Å, for example, from about 200 Å to about 600 Å. When the thickness of the EML is within the above ranges, the EML may have satisfactory light-emitting capabilities without a substantial increase in driving voltage.

An ETL may be formed on the EML by using various methods, such as vacuum deposition, spin coating, and casting. When the ETL is formed using vacuum deposition or spin coating, the deposition and coating conditions may be similar to those for the formation of the HIL, although the deposition and coating conditions may vary depending on a compound that is used to form the ETL. A material that can stably transport electrons injected from an electron injection electrode, which is a cathode, may be used as an ETL-forming material. Examples of the ETL-forming material include the compound of Formula 1 above or another suitable electron-transporting material. Examples of suitable ETL-forming materials include a quinoline derivative such as tris(8-quinolinorate)aluminum (Alq3), TAZ, BAlq, beryllium bis(benzoquinolin-10-olate (Bebq₂), ADN, Compound 201, and Compound 202:

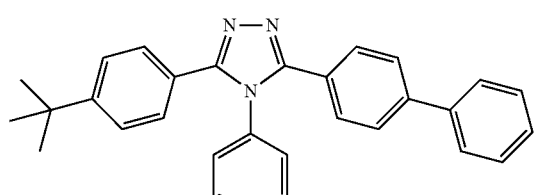

TAZ

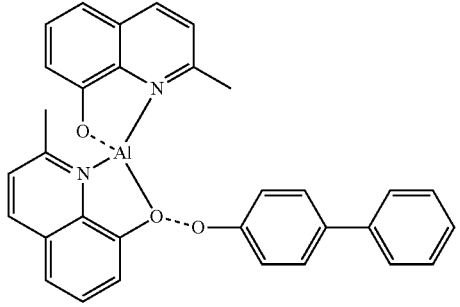

BAlq

<Compound 201>

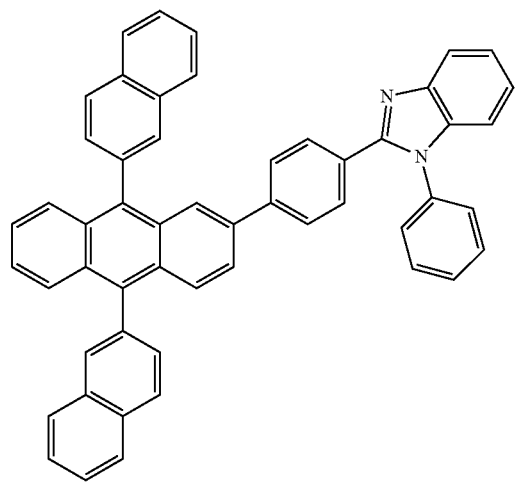

<Compound 202>

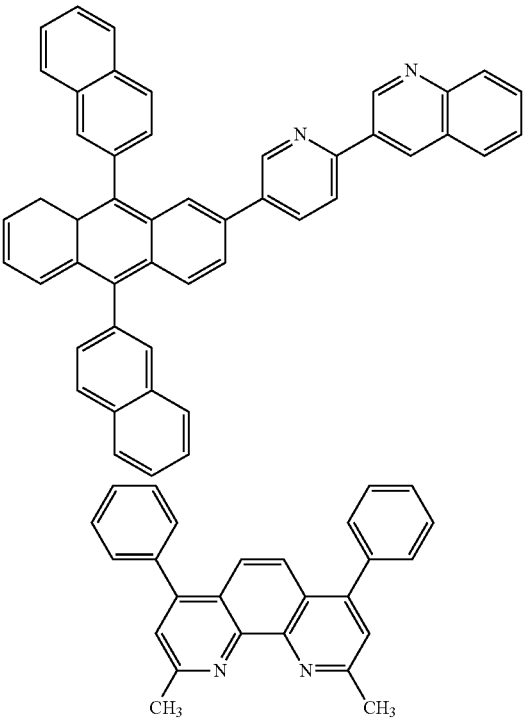

BCP

A thickness of the ETL may be in a range from about 100 Å to about 1,000 Å, for example, from about 150 Å to about 500 Å. When the thickness of the ETL is within the above ranges, the ETL may have satisfactory electron transporting capabilities without a substantial increase in driving voltage.

In some implementations, the ETL may further include a metal-containing material, in addition to the compound of Formula 1 above or a suitable electron-transporting material.

The metal-containing material may include a lithium (Li) complex. Non-limiting examples of the Li complex are lithium quinolate (LiQ) and Compound 203 below:

<Compound 203>

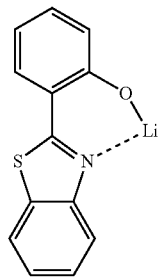

An EIL, which facilitates injection of electrons from the cathode, may be formed on the ETL. Any suitable electron-injecting material may be used to form the EIL.

Examples of the EIL-forming materials include LiF, NaCl, CsF, $Li_2O$, and BaO. Also, any suitable EIL-forming material or the compound of Formula 1 above may be used. Deposition conditions of the EIL may be similar to those for the formation of the HIL, although the conditions may vary depending on a material that is used to form the EIL.

A thickness of the EIL may be in a range from about 1 Å to about 100 Å, for example, from about 3 Å to about 90 Å. When the thickness of the EIL is within the above ranges, the EIL may have satisfactory electron injection capabilities without a substantial increase in driving voltage.

A second electrode is disposed on the organic layer. When the second electrode is a cathode that is an electron injection electrode, materials such as a metal, an alloy, and an electro-conductive compound, or a mixture thereof that have a low work function may be used as the second electrode-forming material. The second electrode may be formed as a thin film type transmission electrode using lithium (Li), magnesium (Mg), aluminum (Al), aluminum-lithium (Al—Li), calcium (Ca), magnesium-indium (Mg—In), magnesium-silver (Mg—Ag). In some implementations, to manufacture a top-emission light-emitting diode, the transmission electrode may be formed of indium tin oxide (ITO) or indium zinc oxide (IZO).

Although the OLED of FIG. 1 is described above, other configurations are possible.

When a phosphorescent dopant is used in the EML, an HBL may be formed between the ETL and the EML or between the E-functional layer and the EML by using vacuum deposition, spin coating, casting, or LB deposition, in order to prevent diffusion of triplet excitons or holes into the ETL. When the HBL is formed using vacuum deposition or spin coating, the conditions for deposition and coating may be similar to those for the formation of the HIL, although the conditions for deposition and coating may vary according to the material that is used to form the HBL. Any suitable hole-blocking material may be used. Examples of suitable hole-blocking materials include oxadiazole derivatives, triazole derivatives, and phenanthroline derivatives. For example, BCP below may be used to form the HBL.

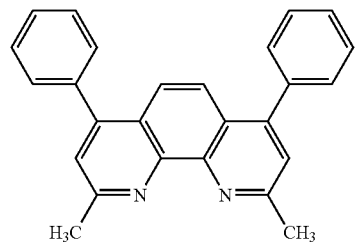

BCP

A thickness of the HBL may be in a range from about 20 Å to about 1,000 Å, for example, from about 30 Å to about 300 Å. When the thickness of the HBL is within the above ranges, the HBL may have satisfactory hole blocking capabilities without a substantial increase in driving voltage.

The OLED according to an embodiment may be provided in various types of flat panel display devices such as passive matrix OLED devices or active matrix OLED devices. In particular, when the OLED is provided in an active matrix OLED, the first electrode on the substrate, which acts as a pixel electrode, may be electrically connected to a source electrode or a drain electrode of a thin-film transistor (TFT). In addition, the OLED may be provided in a flat panel display device having double-sided screens.

The following Examples and Comparative Examples are provided in order to highlight characteristics of one or more embodiments, but it is to be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLE

Synthesis Example 1

Synthesis of Compound 1

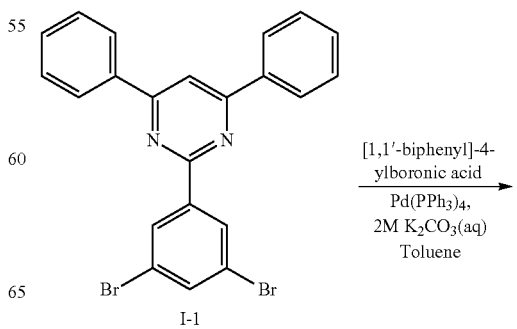

-continued

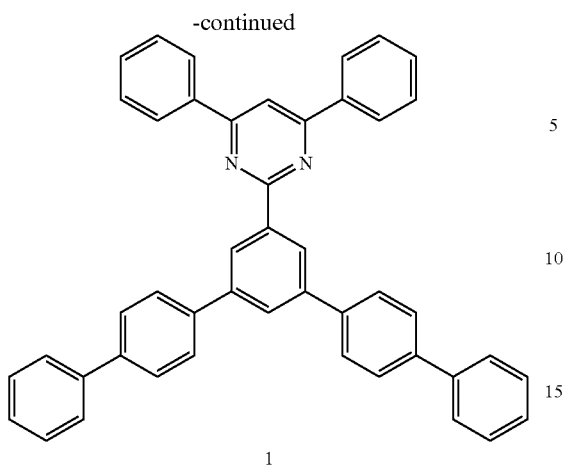

1

3 g (6.44 mmol) of 2-(3,5-dibromophenyl)-4,6-diphenylpyrimidine, 3.82 g (19.31 mmol) of [1,1'-biphenyl]-4-ylboronic acid, 371.8 mg (0.322 mmol) of tetrakis(triphenylphosphine)palladium(0) were dissolved in 16 ml of 2M $K_2CO_3$(aq) and 30 ml of toluene, and then stirred at a temperature of about 110° C. for 8 hours under reflux. After the reaction was completed, 20 ml of cold distilled water was added to the mixture, followed by extraction with ethylacetate. An organic layer obtained therefrom was dried with magnesium sulfate and filtered, and a solvent was evaporated. Then, the residual was separation-purified by silica gel column chromatography to obtain 3.12 g (Yield: 79%) of 2-([1,1':4',1":3",1"':4"',1""-quinquephenyl]-5"-yl)-4,6-diphenylpyrimidine (Compound 1).

Synthesis Example 2

Synthesis of Compound 4

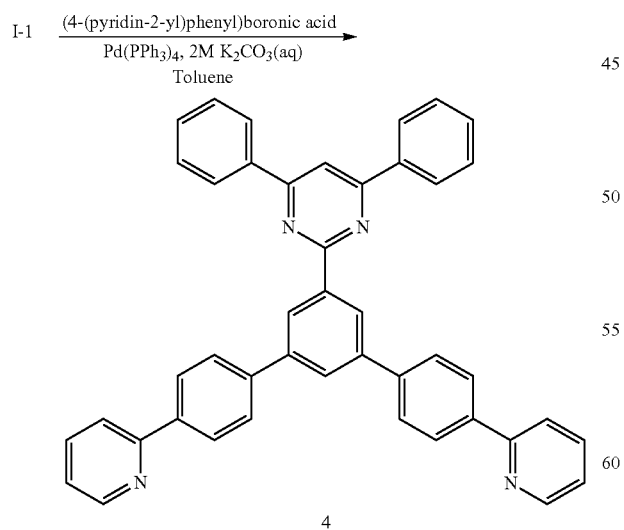

3 g (6.44 mmol) of 2-(3,5-dibromophenyl)-4,6-diphenylpyrimidine, 3.84 g (19.31 mmol) of (4-(pyridin-2-yl)phenyl)boronic acid, and 371.8 mg (0.322 mmol) of tetrakis (triphenylphosphine)palladium(0) were dissolved in 16 ml of 2M $K_2CO_3$(aq) and 30 ml of toluene, and then stirred at a temperature of about 110° C. for 8 hours under reflux. After the reaction was completed, 20 ml of cold distilled water was added to the mixture, followed by extraction with ethylacetate. An organic layer obtained therefrom was dried with magnesium sulfate and filtered, and a solvent was evaporated. Then, the residual was separation-purified by silica gel column chromatography to obtain 2.92 g (Yield: 74%) of (2-(4,4"-di(pyridin-2-yl)-[1,1':3',1"-terphenyl]-5'-yl)-4,6-diphenylpyrimidine) (Compound 4).

Synthesis Example 3

Synthesis of Compound 34

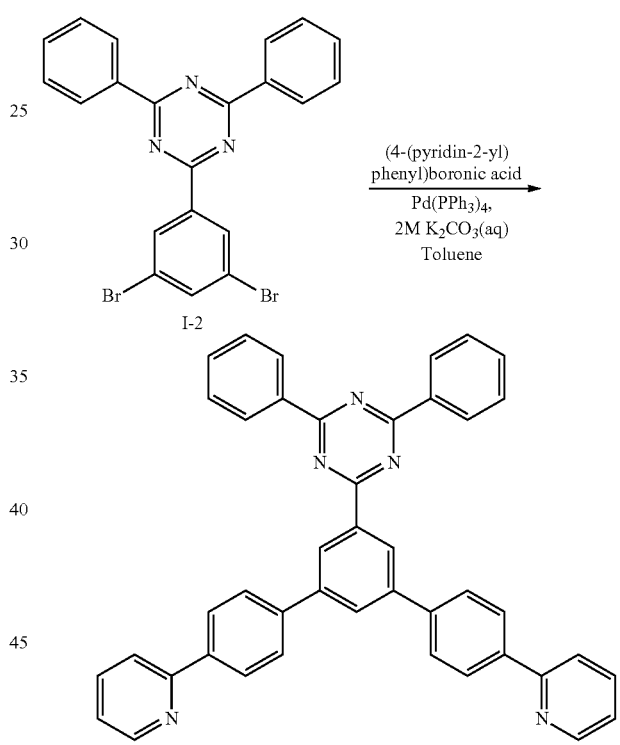

3 g (6.42 mmol) of 2-(3,5-dibromophenyl)-4,6-diphenyl-1,3,5-triazine, 3.83 g (19.27 mmol) of (4-(pyridin-2-yl)phenyl)boronic acid, and 371.0 mg (0.321 mmol) tetrakis(triphenylphosphine)palladium(0) were dissolved in 16 ml of 2M $K_2CO_3$(aq) and 30 ml of toluene, and then stirred at a temperature of about 110° C. for 8 hours under reflux. After the reaction was completed, 20 ml of cold distilled water was added to the mixture, followed by extraction with ethylacetate. An organic layer obtained therefrom was dried with magnesium sulfate and filtered, and a solvent was evaporated. Then, the residual was separation-purified by silica gel column chromatography to obtain 2.98 g (Yield: 75%) of 2-(4,4"-di(pyridin-2-yl)-[1,1':3',1"-terphenyl]-5'-yl)-4,6-diphenyl-1,3,5-triazine (Compound 34).

Synthesis Example 4

Synthesis of Compound 37

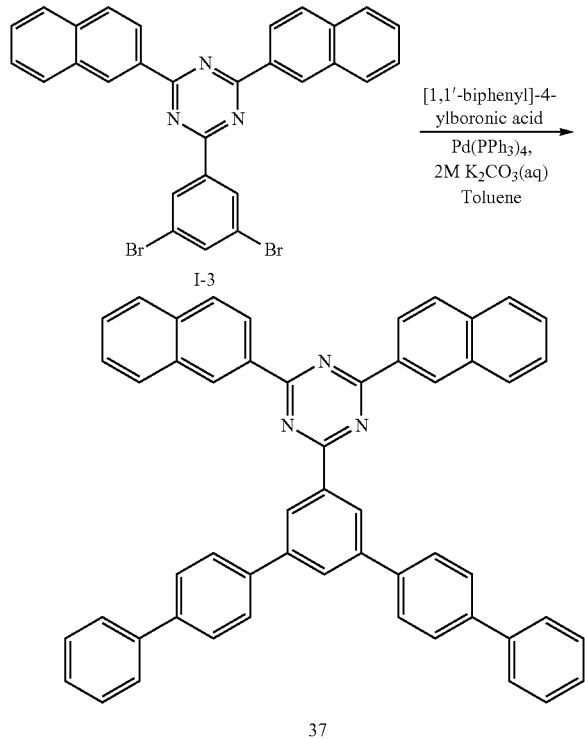

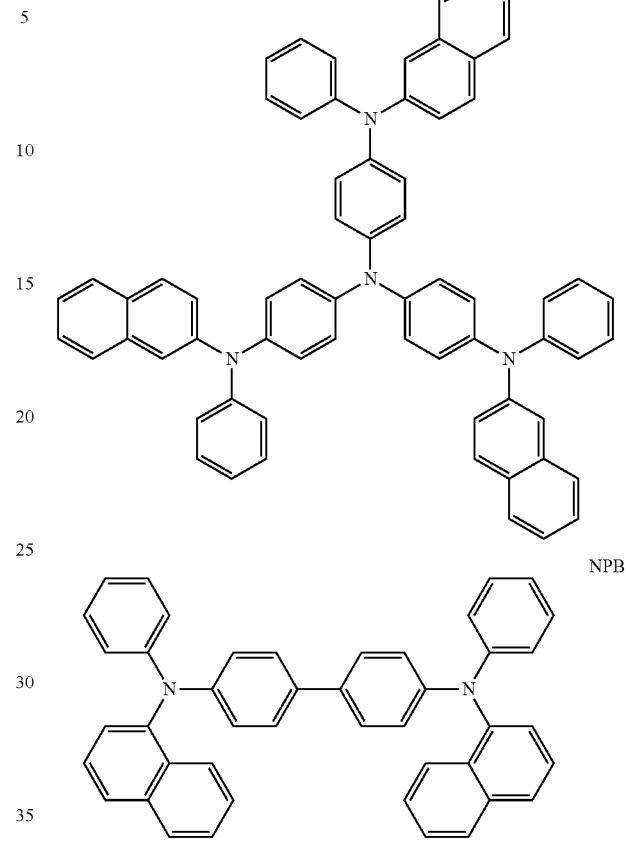

3 g (5.29 mmol) of 2-(3,5-dibromophenyl)-4,6-di(naphthalen-2-yl)-1,3,5-triazine, 3.14 g (15.87 mmol) of [1,1'-biphenyl]-4-yl boronic acid, and 305.5 mg (0.264 mmol) of tetrakis(triphenylphosphine)palladium(0) were dissolved in 13 ml of 2M $K_2CO_3$(aq) and 30 ml of toluene, and then stirred at a temperature of about 110° C. for 8 hours under reflux. After the reaction was completed, 20 ml of cold distilled water was added to the mixture, followed by extraction with ethylacetate. An organic layer obtained therefrom was dried with magnesium sulfate and filtered, and a solvent was evaporated. Then, the residual was separation-purified by silica gel column chromatography to obtain 2.76 g (Yield: 73%) of (2-([1,1':4',1":3",1":4'",1'"-quinquephenyl]-5"-yl)-4,6-di(naphthalen-2-yl)-1,3,5-triazine) (Compound 37).

Example 1

An anode was prepared by cutting a Corning 15 $\Omega/cm^2$ (1200 Å) ITO glass substrate to a size of 50 mm×50 mm×0.7 mm, which was then sonicated in isopropyl alcohol for about 5 minutes and in pure water for about 5 minutes, and then cleaned by irradiation of ultraviolet rays for about 30 minutes, and exposed to ozone. The resulting glass substrate was loaded into a vacuum deposition device.

2-TNATA was vacuum-deposited on the anode to a thickness of about 600 Å to form an HIL, and NPB as a hole transporting compound was vacuum-deposited on the HIL to a thickness of about 300 Å.

ADN as a known blue fluorescent host, and DPAVBi as a known blue fluorescent dopant, were co-deposited at a weight ratio of about 98:2 on the HTL to form an EML having a thickness of 300 Å. Next, Compound 1 was deposited on the EML to form an ETL to a thickness of about 300 Å, and then LiF, which is a halogenated alkali metal, was deposited on the ETL to foam an EIL to a thickness of about 10 Å. Then, Al was vacuum-deposited on the EIL to form a cathode having a thickness of about 1,000 Å, thereby manufacturing an OLED.

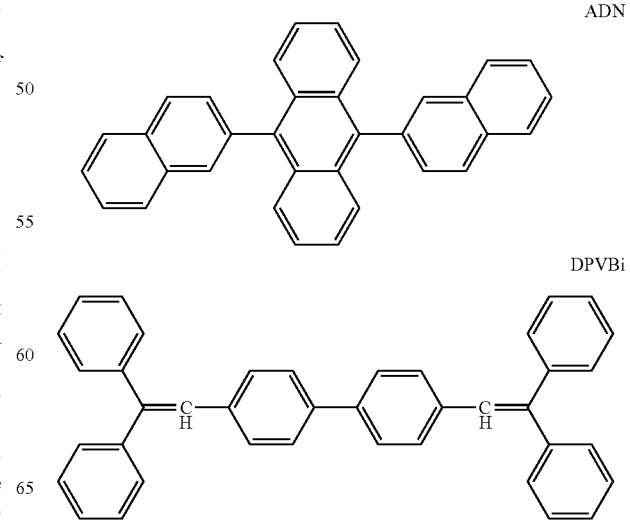

The OLED had a driving voltage of about 4.76 V at a current density of 10 mA/cm², color coordinates of (0.15, 0.24), and a half life-span of about 283 hours.

Example 2

An OLED was manufactured in the same manner as in Example 1, except that Compound 4 was used instead of Compound 1 to form the ETL.

The OLED had a driving voltage of about 4.53 V at a current density of 10 mA/cm², color coordinates of (0.15, 0.27), and a half life-span of about 231 hours.

Comparative Example 1

An OLED was manufactured in the same manner as in Example 1, except that the Alq₃ was used instead of Compound 1 to form the ETL.

Alq₃

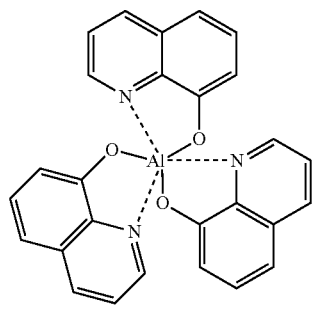

The OLED had a driving voltage of about 5.67 V at a current density of 10 mA/cm², color coordinates of (0.15, 0.26), and a half life-span of about 125 hours.

Comparative Example 2

An OLED was manufactured in the same manner as in Example 1, except that Compound A was used instead of Compound 1 to form the ETL.

The OLED had a driving voltage of about 5.37 V at a current density of 10 mA/cm², color coordinates of (0.15, 0.24), and a half life-span of about 145 hours.

A

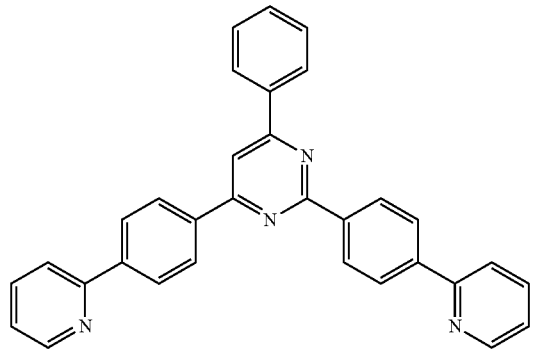

Comparative Example 3

An OLED was manufactured in the same manner as in Example 1, except that Compound B was used instead of Compound 1 to form the ETL.

The OLED had a driving voltage of about 5.45 V at a current density of 10 mA/cm², color coordinates of (0.15, 0.26), and a half life-span of about 152 hours.

B

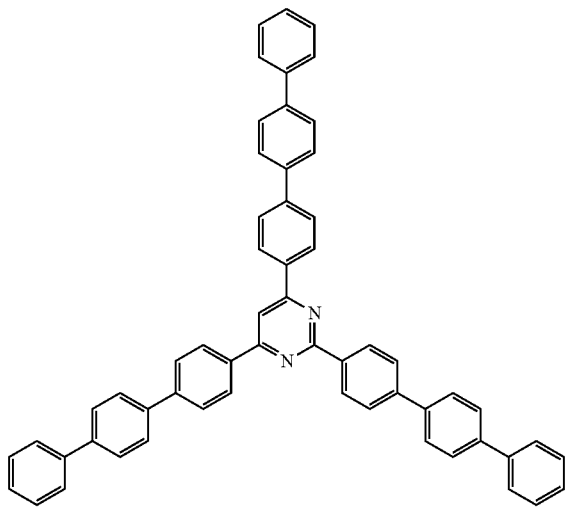

Comparative Example 4

An OLED was manufactured in the same manner as in Example 1, except that Compound C was used instead of Compound 1 to form the ETL.

The OLED had a driving voltage of about 5.21 V at a current density of 10 mA/cm², color coordinates of (0.15, 0.25), and a half life-span of about 138 hours.

C

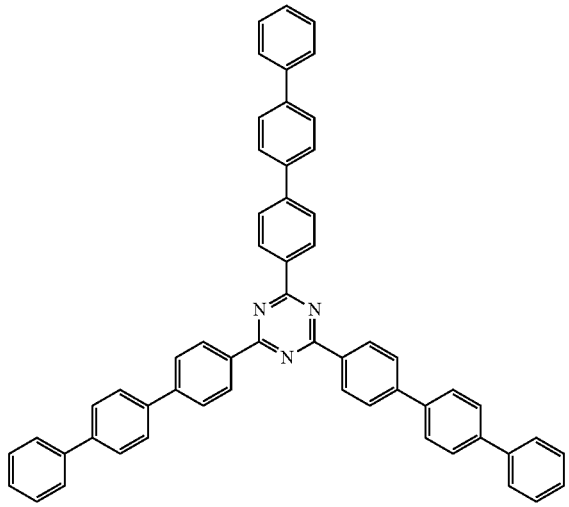

Results of Examples 1 and 2 and Comparative Examples 1 to 4 are summarized and shown in Table 1 below:

TABLE 1

|  | Electron-transporting material | Half-life Lifetime (hour) |
| --- | --- | --- |
| Example 1 | 1 | 283 |
| Example 2 | 4 | 231 |
| Comparative Example 1 | Alq3 | 125 |
| Comparative Example 2 | Compound A | 145 |
| Comparative Example 3 | Compound B | 152 |
| Comparative Example 4 | Compound C | 138 |

As described above, according to the one or more of the above embodiments, an organic light-emitting diode (OLED) having an organic layer including a compound represented by Formula 1 above has an improved lifetime.

By way of summation and review, embodiments provide an organic light-emitting diode with improved lifetime using a material that is improved with respect to existing materials in terms of injection and mobility of electrons in consideration of energy balance overall.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope as set forth in the following claims.

What is claimed is:

1. An organic light-emitting diode, comprising:
a first electrode;
a second electrode; and
an organic layer between the first electrode and the second electrode,
wherein:
the organic layer includes a heterocyclic compound represented by Formula 1 below:

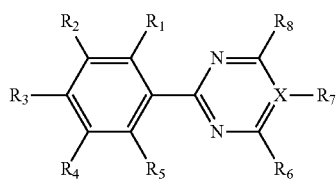

<Formula 1> wherein $R_1$ to $R_6$ and $R_8$ in Formula 1 are each independently a hydrogen atom, a deuterium atom, a halogen atom, a cyano group, a nitro group, a hydroxyl group, a carboxyl group, a substituted or unsubstituted $C_1$-$C_{60}$ alkyl group, a substituted or unsubstituted $C_3$-$C_{60}$ cycloalkyl group, a substituted or unsubstituted $C_1$-$C_{60}$ alkoxy group, a substituted or unsubstituted $C_6$-$C_{60}$ aryloxy group, a substituted or unsubstituted $C_6$-$C_{60}$ arylthio group, a substituted or unsubstituted $C_6$-$C_{60}$ aryl group, an amino group substituted with a $C_6$-$C_{60}$ aryl group, a substituted or unsubstituted $C_2$-$C_{60}$ heteroaryl group, or a substituted or unsubstituted $C_6$-$C_{60}$ condensed polycyclic group, $R_7$ is an non-bonding electron pair, a hydrogen atom, a deuterium atom, a halogen atom, a cyano group, a nitro group, a hydroxyl group, a carboxyl group, a substituted or unsubstituted $C_1$-$C_{60}$ alkyl group, a substituted or unsubstituted $C_3$-$C_{60}$ cycloalkyl group, a substituted or unsubstituted $C_1$-$C_{60}$ alkoxy group, a substituted or unsubstituted $C_6$-$C_{60}$ aryloxy group, a substituted or unsubstituted $C_6$-$C_{60}$ arylthio group, a substituted or unsubstituted $C_6$-$C_{60}$ aryl group, an amino group substituted with a $C_6$-$C_{60}$ aryl group, a substituted or unsubstituted $C_2$-$C_{60}$ heteroaryl group, or a substituted or unsubstituted $C_6$-$C_{60}$ condensed polycyclic group, and X in Formula 1 is C or N, and the organic layer includes an emission layer (EML) including a fluorescent compound represented by Formula 2 below:

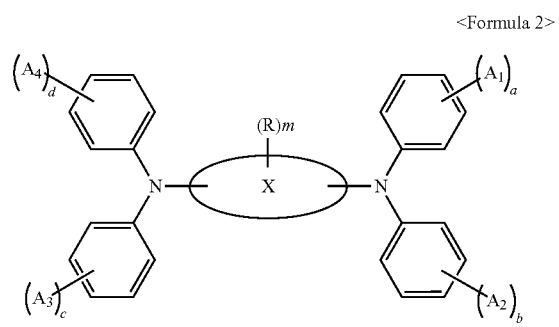

<Formula 2> wherein, in Formula 2 above, $A_1$ to $A_4$ and R are each independently a hydrogen atom, a deuterium atom, a cyano group, a halogen atom, a substituted or unsubstituted $C_1$-$C_{60}$ alkyl group, a substituted or unsubstituted $C_6$-$C_{60}$ aryl group, or a substituted or unsubstituted $C_3$-$C_{60}$ cycloalkyl group, and X is a substituted or unsubstituted $C_6$-$C_{60}$ arylene group, or a substituted or unsubstituted $C_2$-$C_{60}$ heteroarylene group, a, b, c, and d, are each independently an integer from 1 to 5 and m is an integer from 1 to 10.

2. The organic light-emitting diode as claimed in claim 1, wherein X in Formula 1 is N and $R_7$ is a non-bonding electron pair.

3. The organic light-emitting diode as claimed in claim 1, wherein $R_1$, $R_3$, and $R_5$ in Formula 1 are each independently a hydrogen atom or a deuterium atom.

4. The organic light-emitting diode as claimed in claim 1, wherein $R_2$, $R_4$, $R_6$, and $R_8$ in Formula 1 are each independently a substituted or unsubstituted $C_1$-$C_{60}$ alkyl group, a substituted or unsubstituted $C_3$-$C_{60}$ cycloalkyl group, a substituted or unsubstituted $C_1$-$C_{60}$ alkoxy group, a substituted or unsubstituted $C_6$-$C_{60}$ aryloxy group, a substituted or unsubstituted $C_6$-$C_{60}$ arylthio group, a substituted or unsubstituted $C_6$-$C_{60}$ aryl group, an amino group substituted with a $C_6$-$C_{60}$ aryl group, a substituted or unsubstituted $C_2$-$C_{60}$ heteroaryl group, or a substituted or unsubstituted $C_6$-$C_{60}$ condensed polycyclic group.

5. The organic light-emitting diode as claimed in claim 1, wherein $R_2$, $R_4$, $R_6$, and $R_8$ in Formula 1 are each independently represented by one of Formulas 2a to 2h below:

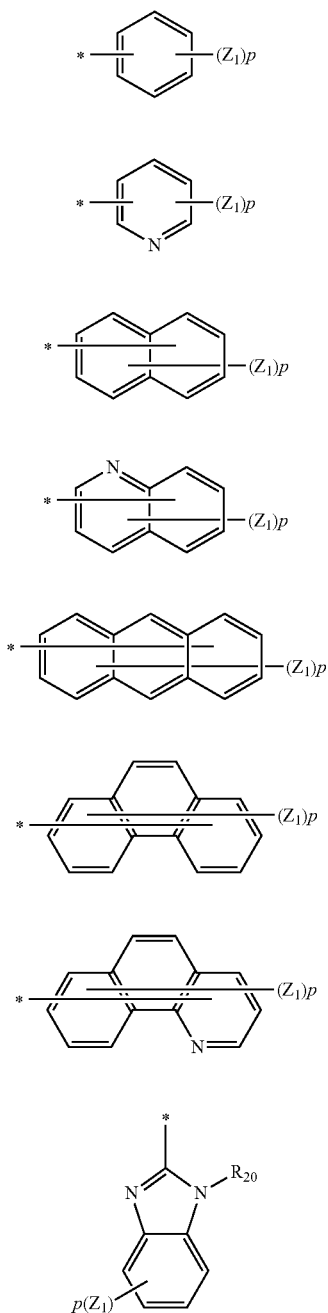

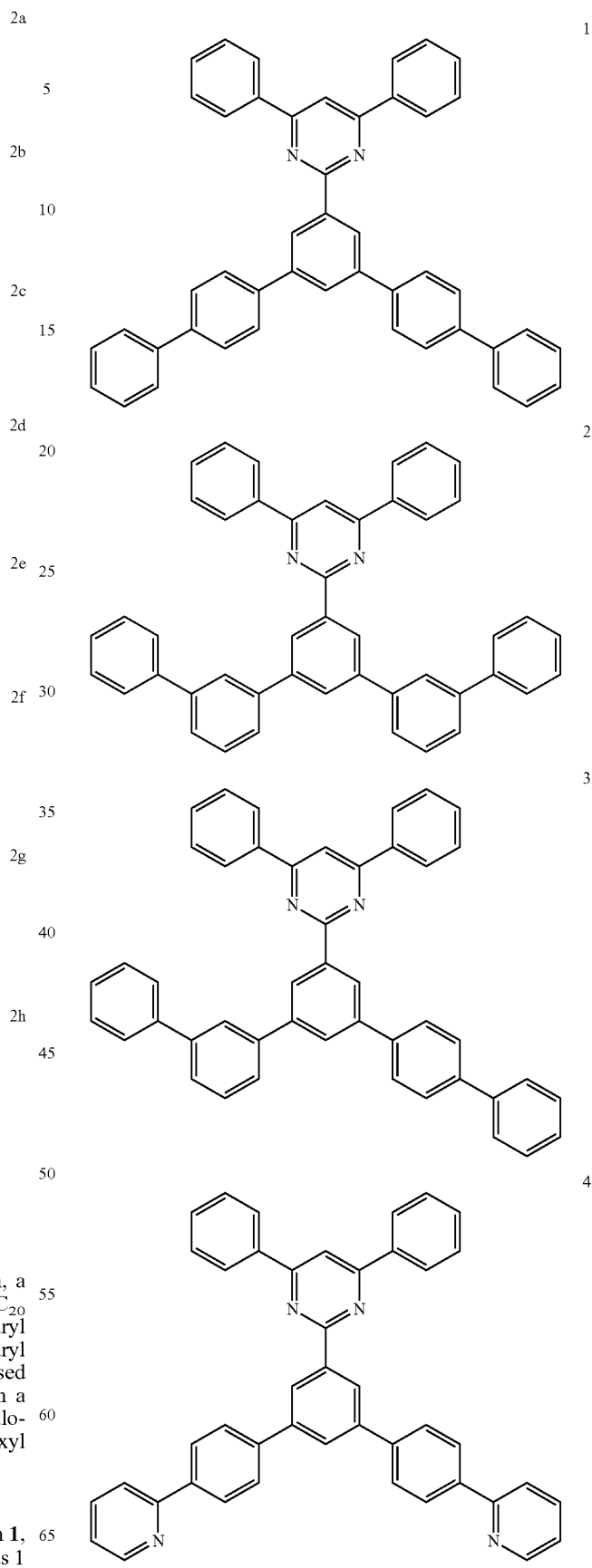

wherein, in the Formulas 2a to 2h above, $Z_1$ and $R_{20}$ are each independently a hydrogen atom, a deuterium atom, a substituted or unsubstituted $C_1$-$C_{20}$ alkyl group, a substituted or unsubstituted $C_6$-$C_{20}$ aryl group, a substituted or unsubstituted $C_2$-$C_{20}$ heteroaryl group, a substituted or unsubstituted $C_6$-$C_{20}$ condensed polycyclic group, an amino group substituted with a $C_6$-$C_{20}$ aryl group or a $C_2$-$C_{20}$ heteroaryl group, a halogen atom, a cyano group, a nitro group, a hydroxyl group, or a carboxyl group;

p is an integer from 1 to 9; and

\* indicates a binding site.

6. The organic light-emitting diode as claimed in claim 1, wherein the compound of Formula 1 is one of Compounds 1 to 66 below:

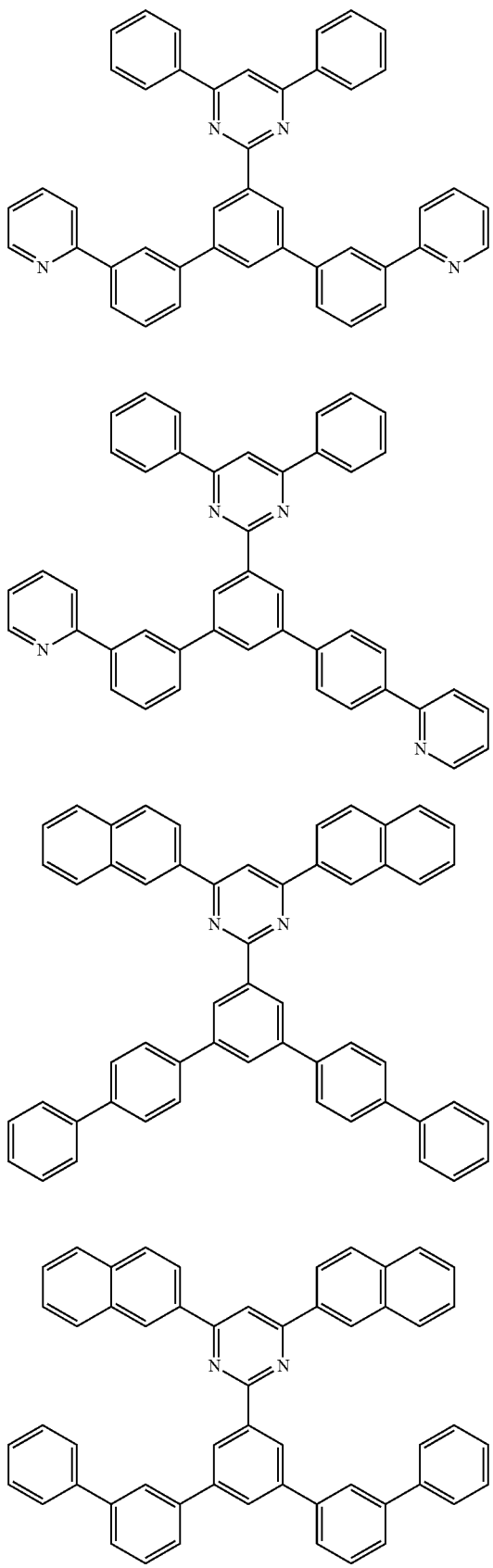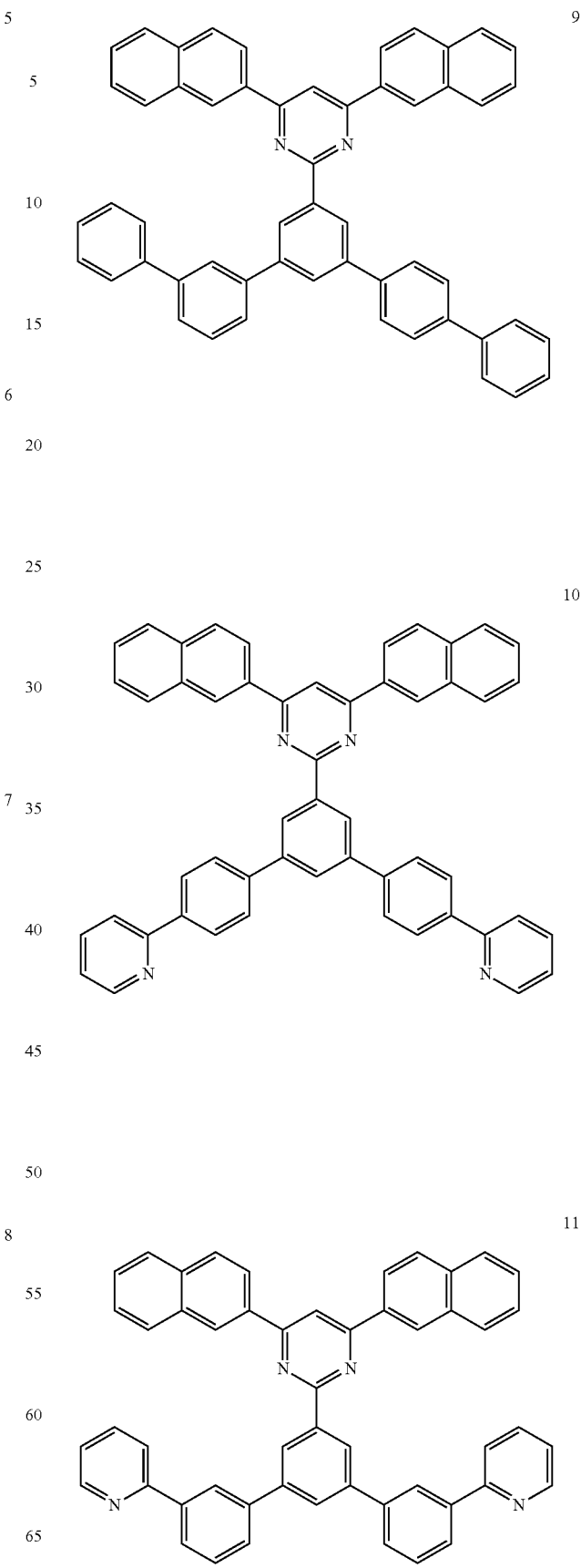

12
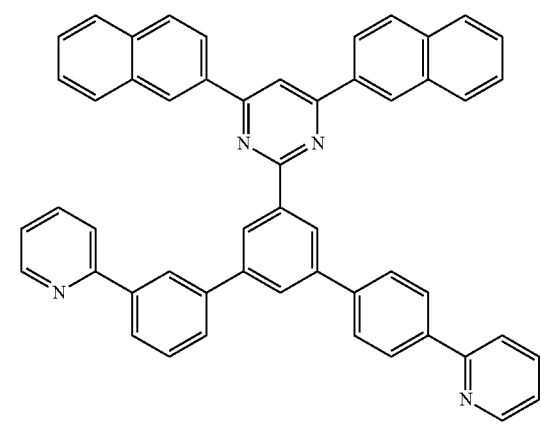
13
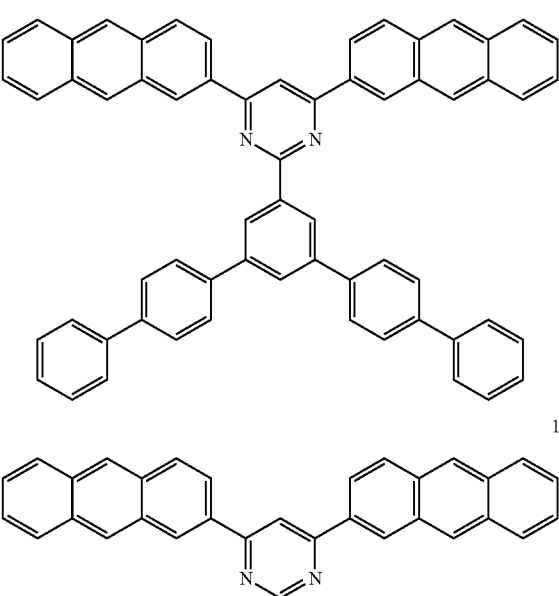
14
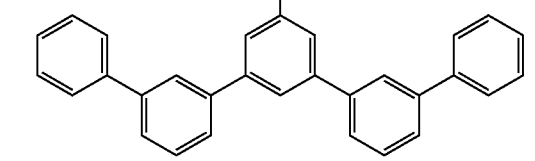
15
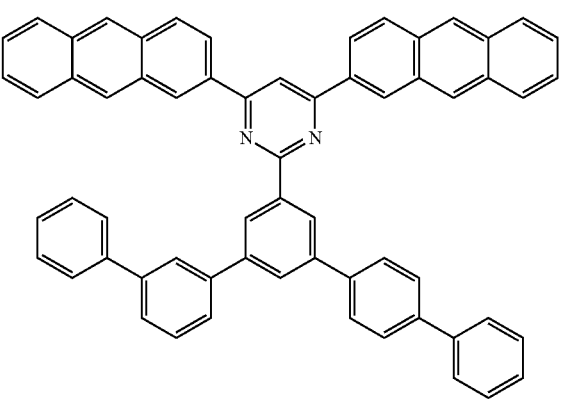
16
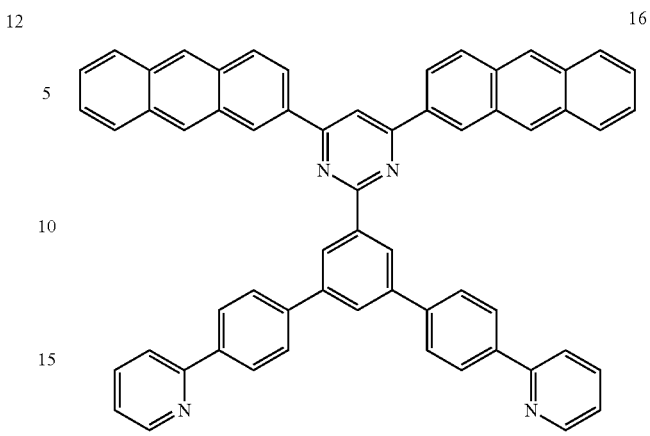
17
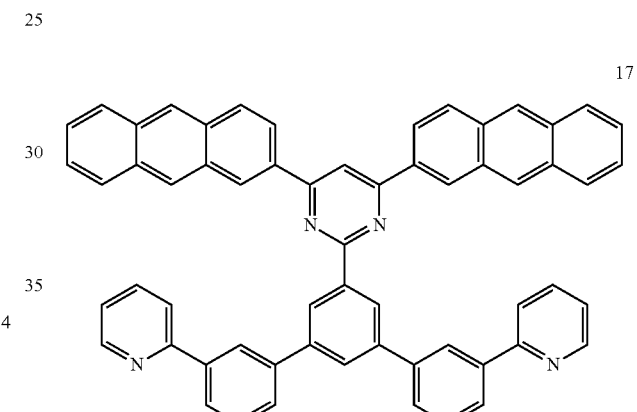
18
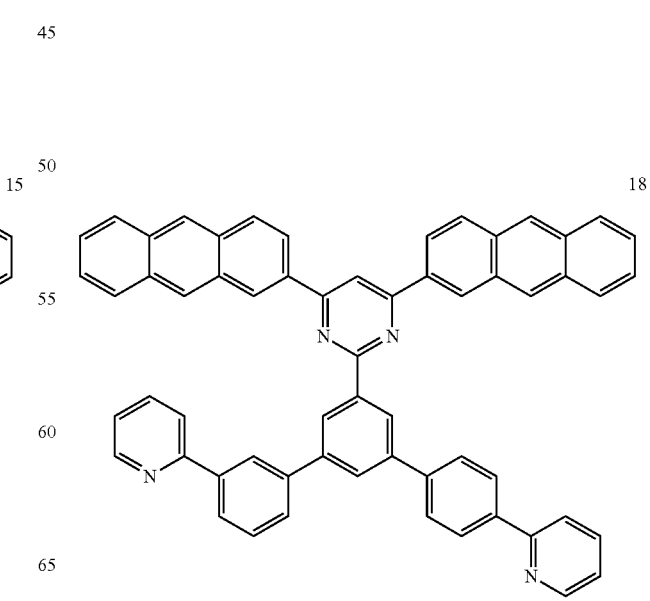

19
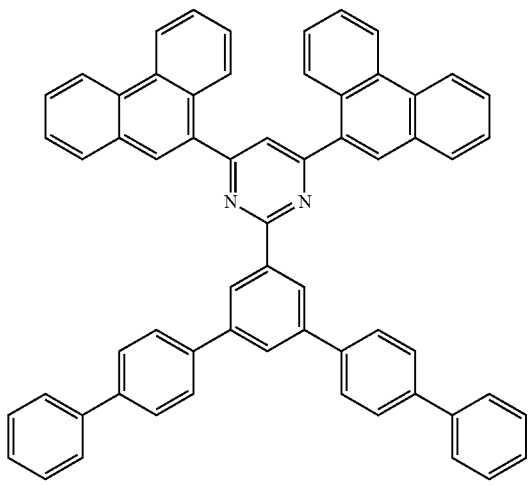
20
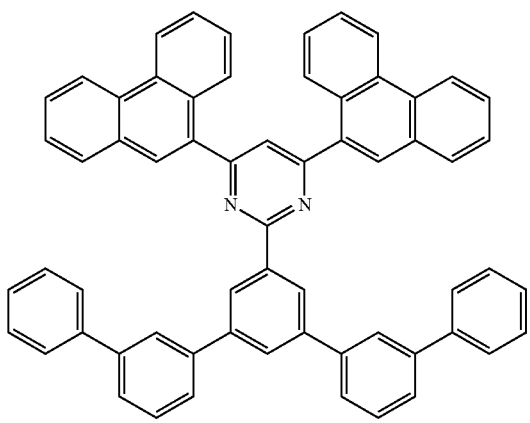
21
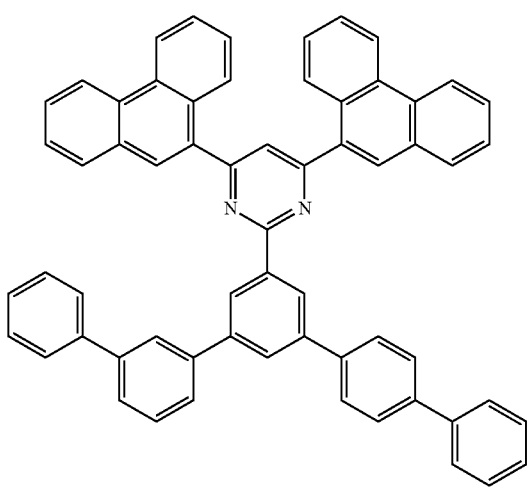
22
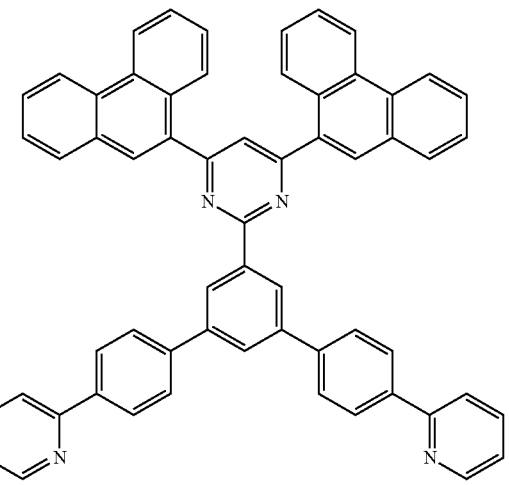
23
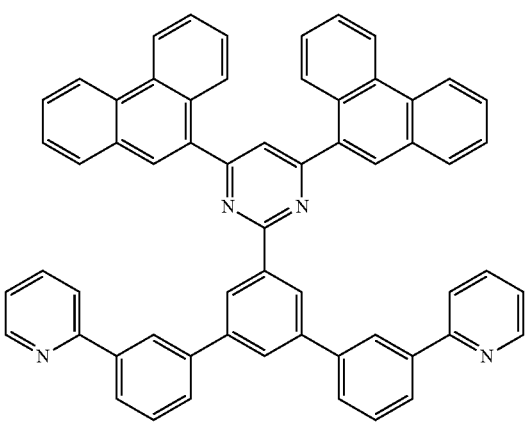
24
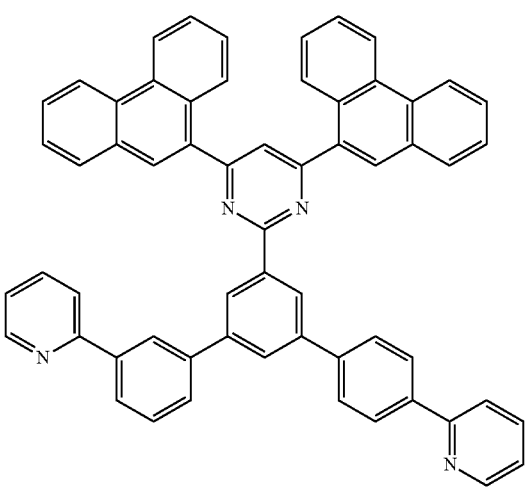

117
-continued
25
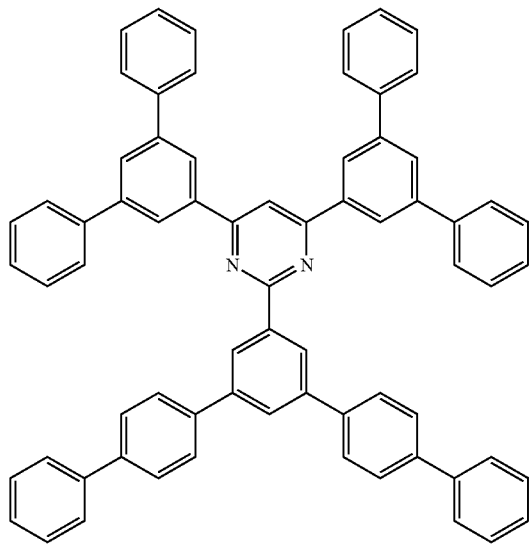
26
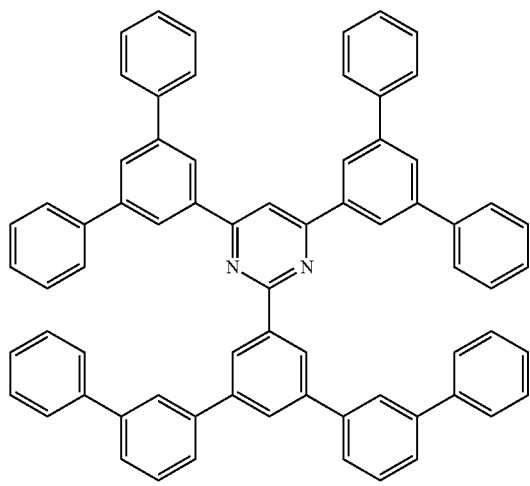
27
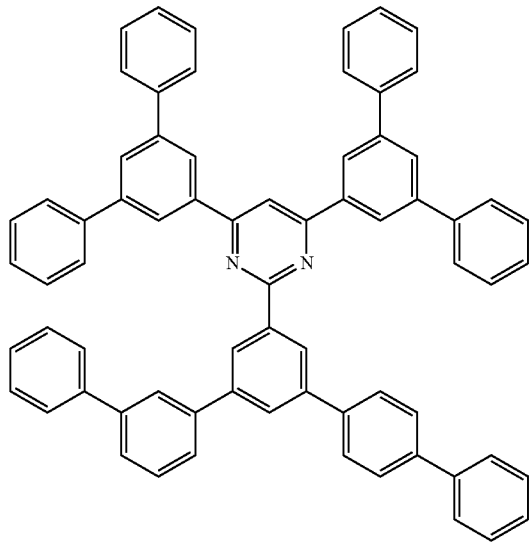
118
-continued
28
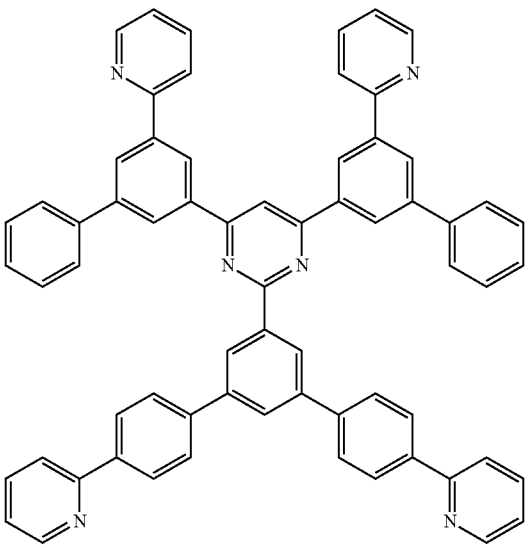
29
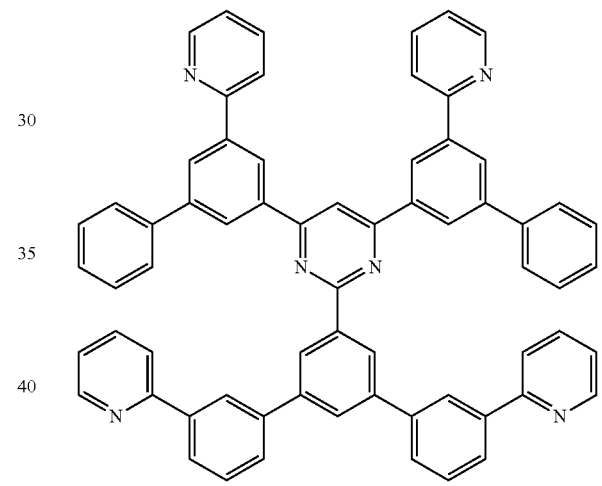
30
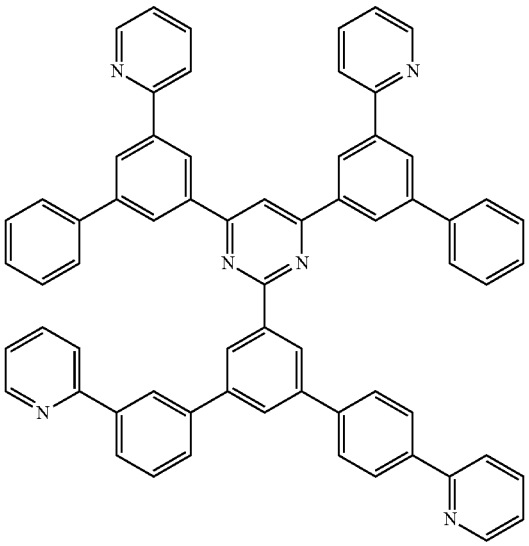

31
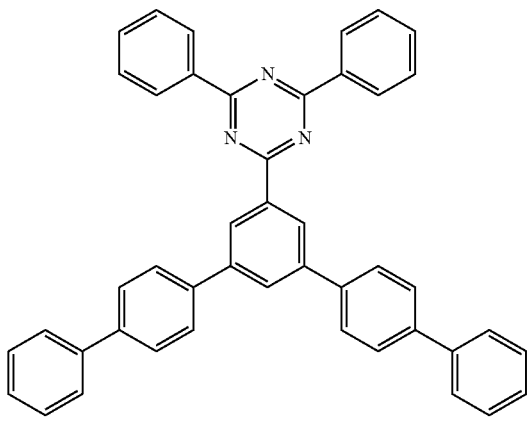
32
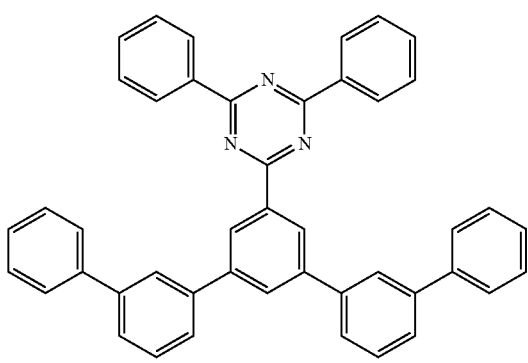
33
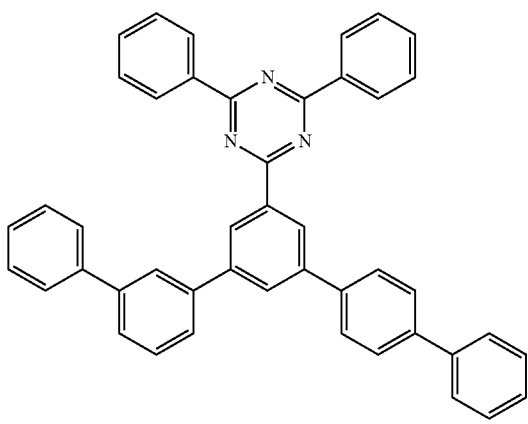
34
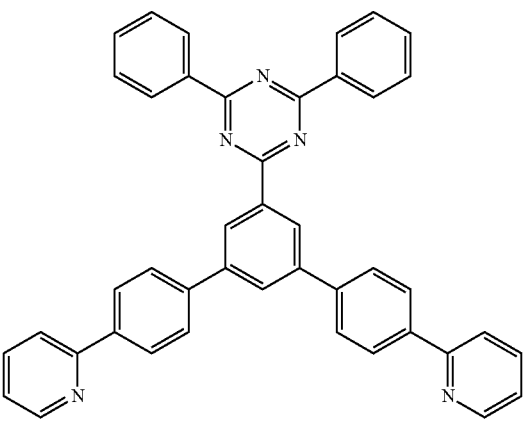
35
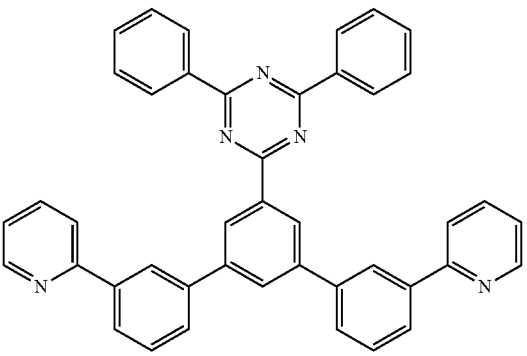
36
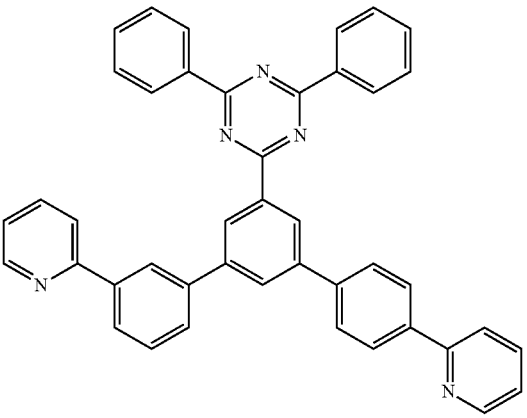

37
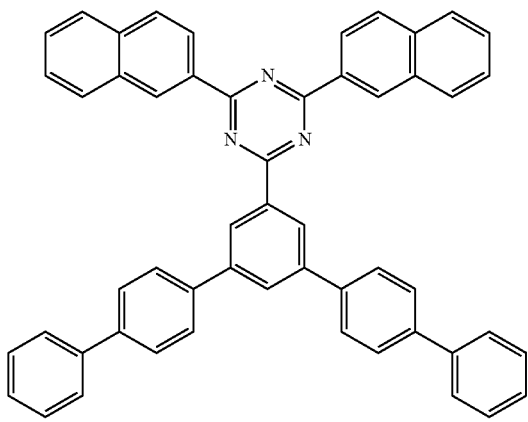
38
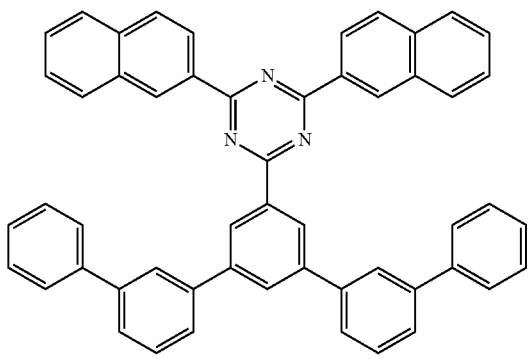
39
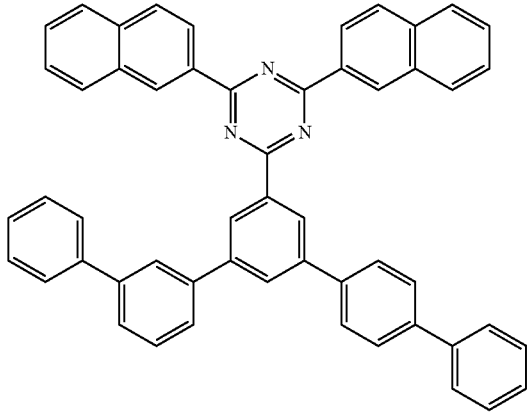
40
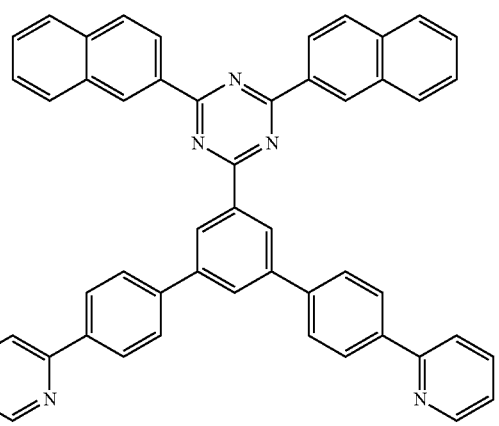
41
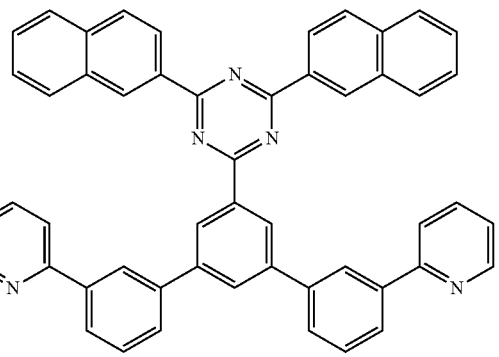
42
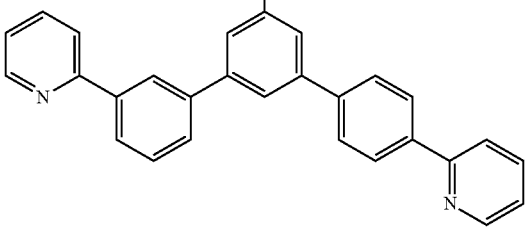

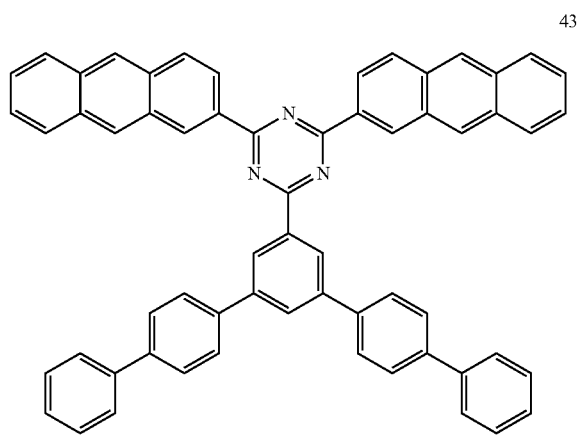
43
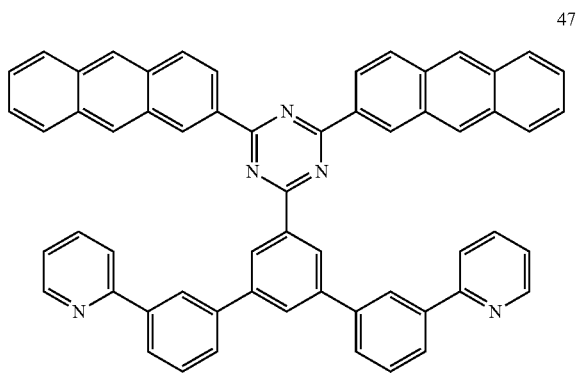
47
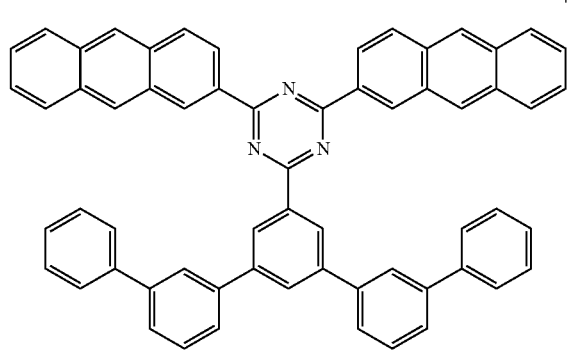
44
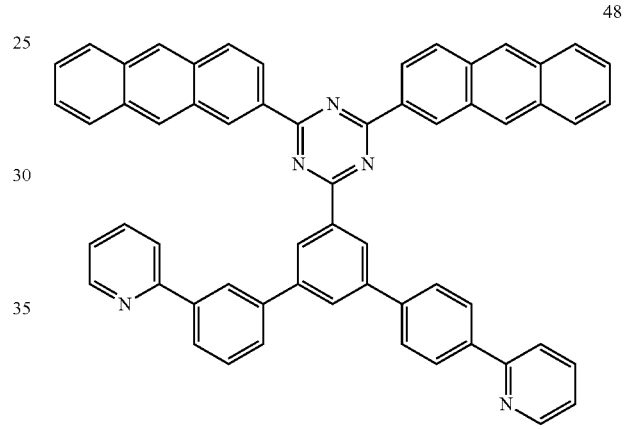
48
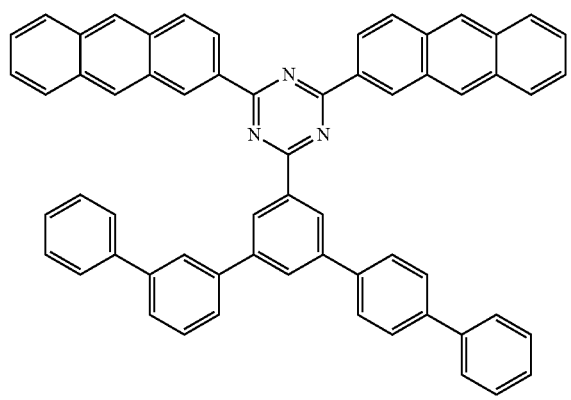
45
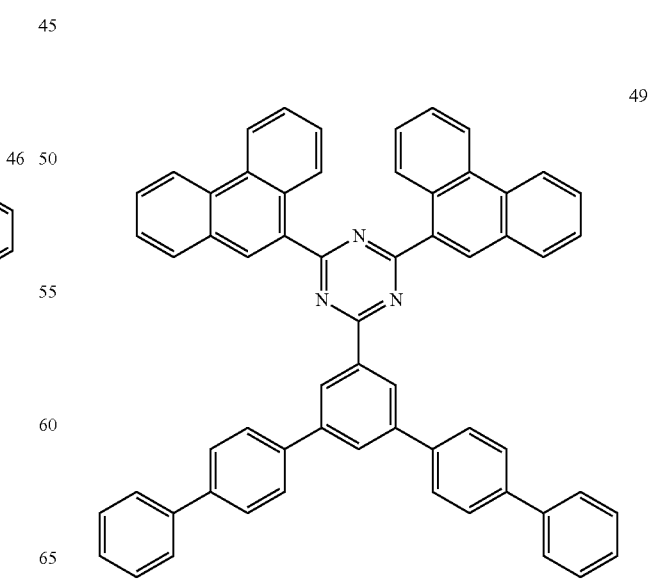
49
46

50
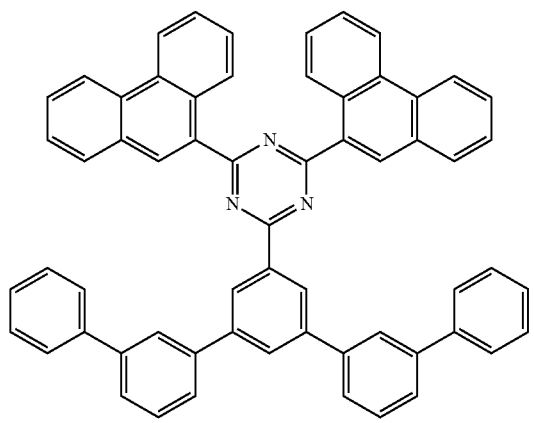
51
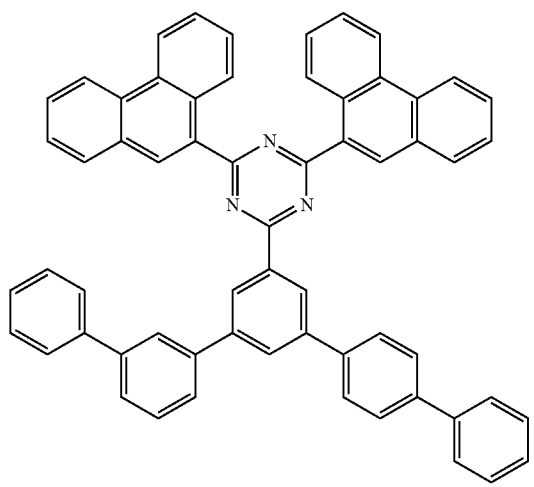
52
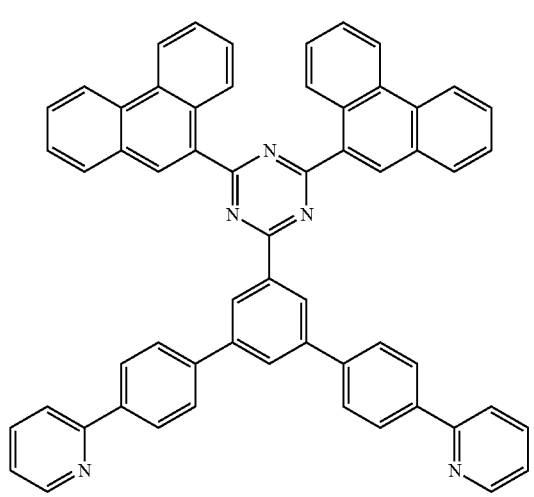
53
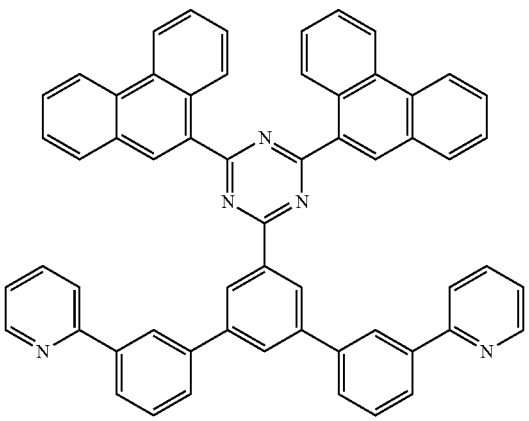
54
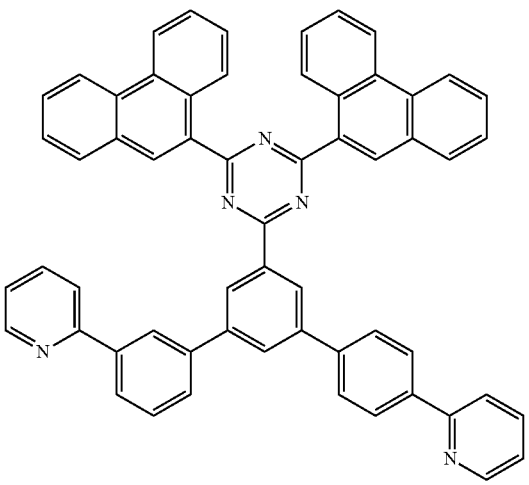
55
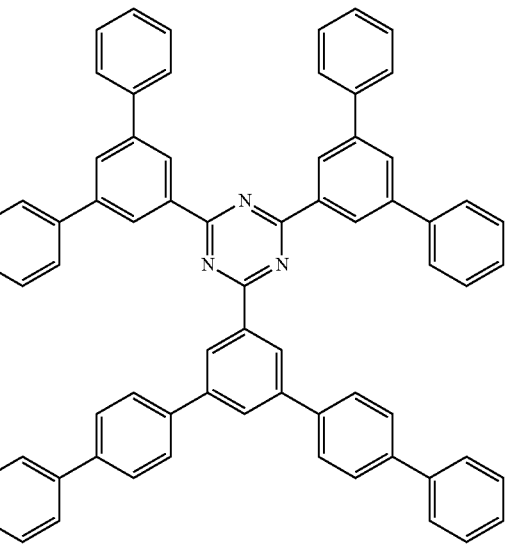

56
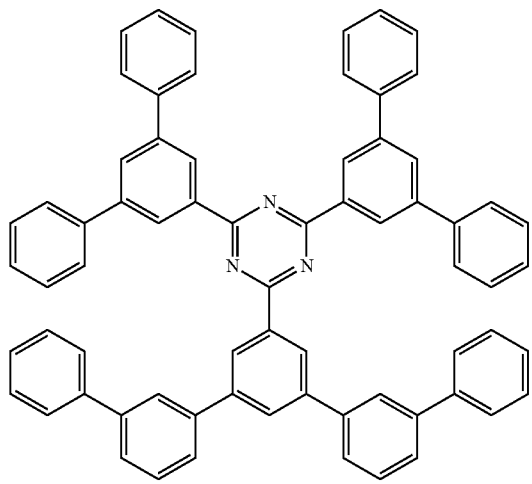
57
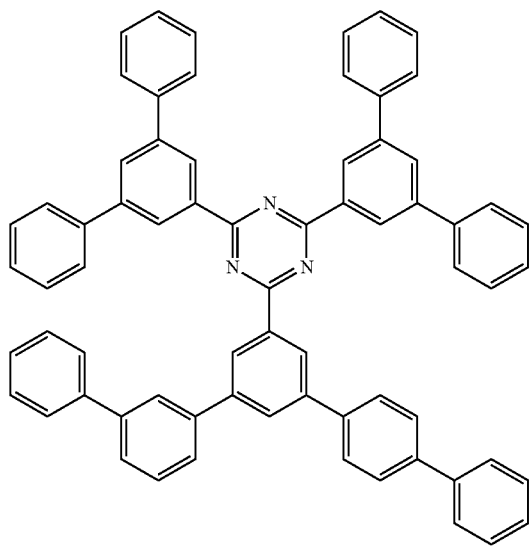
58
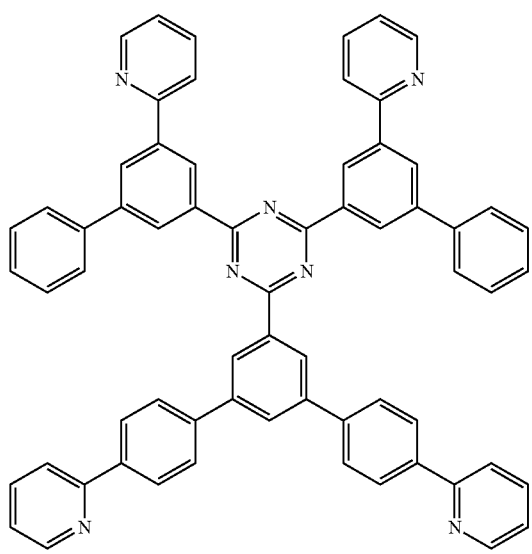
59
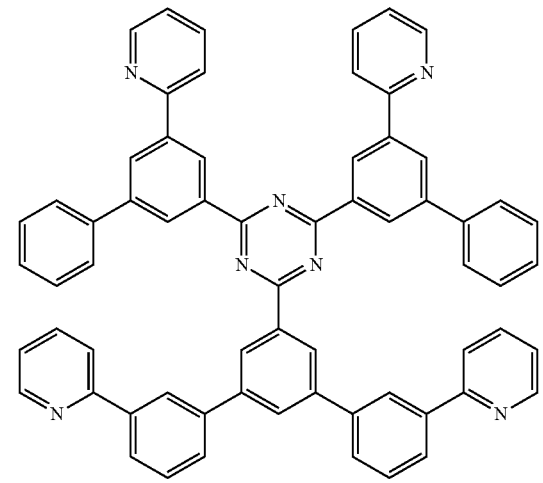
60
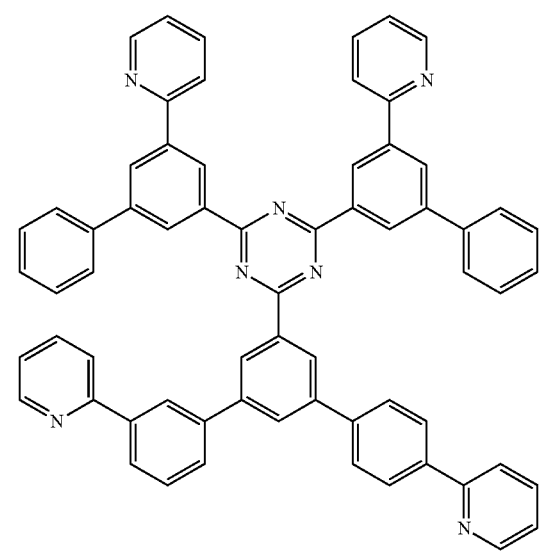
61
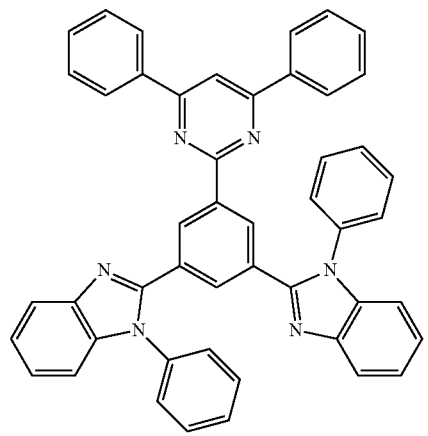

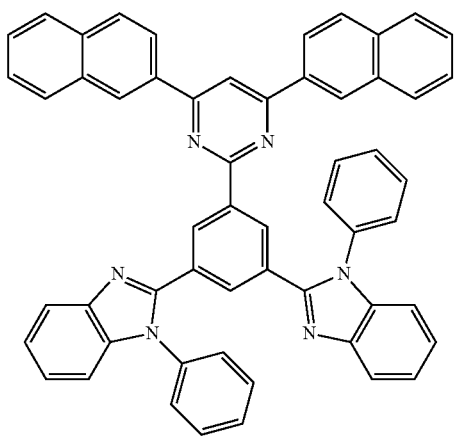

62

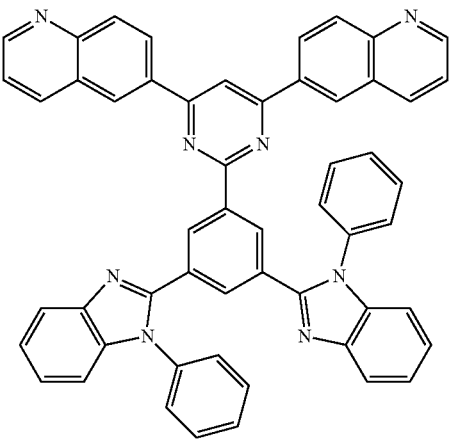

65

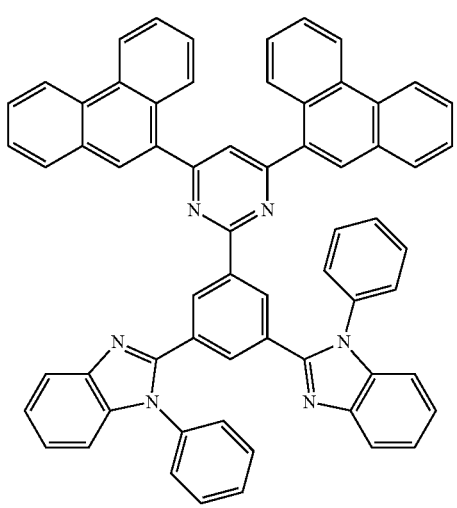

63

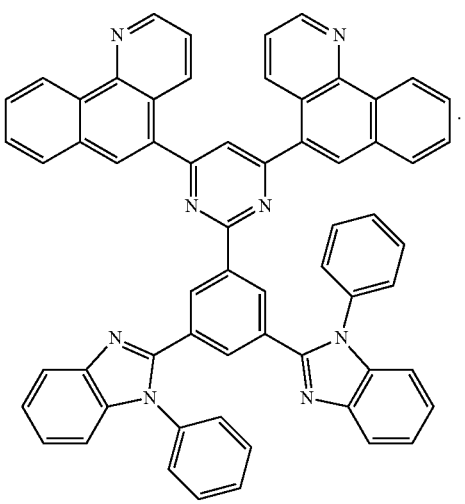

66

64

7. The organic light-emitting diode as claimed in claim 1, wherein the organic layer includes an electron transport layer (ETL), an electron injection layer (EIL), or a functional layer having both electron injection and electron transport capabilities.

8. The organic light-emitting diode as claimed in claim 1, wherein X in Formula 2 is a substituted or unsubstituted pyrenylene group, a substituted or unsubstituted anthracenylene group, a substituted or unsubstituted phenanthrylene group, a substituted or unsubstituted benzopyrenylene group, a substituted or unsubstituted phenalenylene group, or a substituted or unsubstituted chrysenylene group.

9. The organic light-emitting diode as claimed in claim 1, wherein $A_1$ to $A_4$ and R in Formula 2 are each independently a hydrogen atom, a deuterium atom, a halogen atom, or a substituted or unsubstituted $C_1$-$C_{20}$ alkyl group.

10. The organic light-emitting diode as claimed in claim 1, wherein the compound of Formula 2 is one of compounds represented by Formulas below:

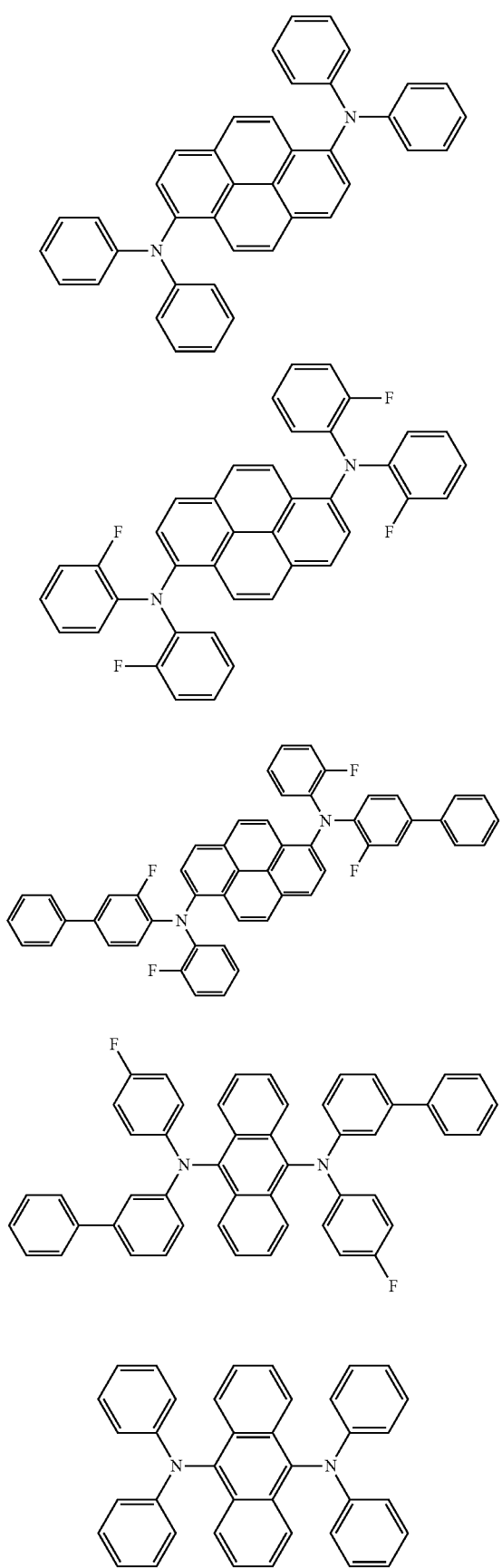
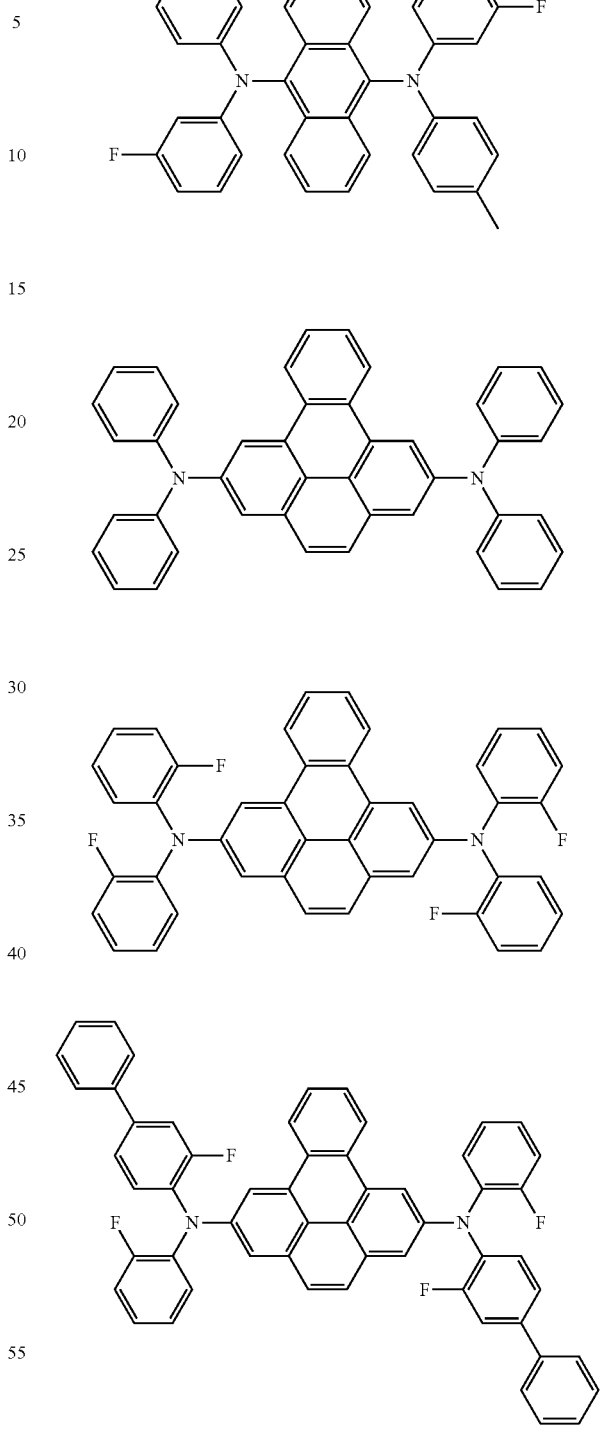
11. A organic light-emitting diode comprising:
   a first electrode;
   a second electrode; and
   an organic layer between the first electrode and the second electrode,
   wherein:
   the organic layer includes a heterocyclic compound represented by Formula 1 below:

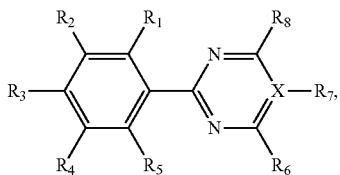

<Formula 1>

$R_1$ to $R_6$ and $R_8$ in Formula 1 are each independently a hydrogen atom, a deuterium atom, a halogen atom, a cyano group, a nitro group, a hydroxyl group, a carboxyl group, a substituted or unsubstituted $C_1$-$C_{60}$ alkyl group, a substituted or unsubstituted $C_3$-$C_{60}$ cycloalkyl group, a substituted or unsubstituted $C_1$-$C_{60}$ alkoxy group, a substituted or unsubstituted $C_6$-$C_{60}$ aryloxy group, a substituted or unsubstituted $C_6$-$C_{60}$ arylthio group, a substituted or unsubstituted $C_6$-$C_{60}$ aryl group, an amino group substituted with a $C_6$-$C_{60}$ aryl group, a substituted or unsubstituted $C_2$-$C_{60}$ heteroaryl group, or a substituted or unsubstituted $C_6$-$C_{60}$ condensed polycyclic group, $R_7$ is an non-bonding electron pair, a hydrogen atom, a deuterium atom, a halogen atom, a cyano group, a nitro group, a hydroxyl group, a carboxyl group, a substituted or unsubstituted $C_1$-$C_{60}$ alkyl group, a substituted or unsubstituted $C_3$-$C_{60}$ cycloalkyl group, a substituted or unsubstituted $C_1$-$C_{60}$ alkoxy group, a substituted or unsubstituted $C_6$-$C_{60}$ aryloxy group, a substituted or unsubstituted $C_6$-$C_{60}$ arylthio group, a substituted or unsubstituted $C_6$-$C_{60}$ aryl group, an amino group substituted with a $C_6$-$C_{60}$ aryl group, a substituted or unsubstituted $C_2$-$C_{60}$ heteroaryl group, or a substituted or unsubstituted $C_6$-$C_{60}$ condensed polycyclic group, X in Formula 1 is C or N, and the organic layer includes:
an emission layer (EML),
an electron injection layer (EIL),
an electron transport layer (ETL), wherein the EIL and ETL are in a form of separate layers or in a form of a single functional layer having both electron injection and electron transport capabilities,
a hole injection layer (HIL), and
a hole transport layer (HTL), wherein the HIL and the HTL are in a form of separate layers or in a form of a single functional layer having both hole injection and hole transport capabilities,
wherein:
the EML includes at least one layer of a red EML, a green EML, a blue EML, or a white EML that includes a phosphorescent compound, and
the hole injection layer (HIL) and the hole transport layer (HTL), or the functional layer having both hole injection and hole transport capabilities includes a charge-generating material that is a p-dopant.

12. The organic light-emitting diode as claimed in claim 11, wherein the p-dopant is a quinone derivative, a metal oxide, or a cyano group-containing compound.

13. The organic light-emitting diode as claimed in claim 1, wherein:
the organic layer includes an electron transport layer (ETL), and
the ETL includes a metal complex.

14. The organic light-emitting diode as claimed in claim 1, wherein the organic layer is formed of compounds for forming the organic layer by using a wet process.

15. A flat panel display device, comprising the organic light-emitting diode as claimed in claim 1, wherein the first electrode of the organic light-emitting diode is electrically connected to a source electrode or a drain electrode of a thin-film transistor.

* * * * *